US011467965B2

(12) United States Patent
Song

(10) Patent No.: US 11,467,965 B2
(45) Date of Patent: Oct. 11, 2022

(54) PROCESSING-IN-MEMORY (PIM) DEVICE

(71) Applicant: SK hynix Inc., Icheon-si (KR)

(72) Inventor: Choung Ki Song, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/138,501

(22) Filed: Dec. 30, 2020

(65) Prior Publication Data

US 2021/0209022 A1 Jul. 8, 2021

Related U.S. Application Data

(63) Continuation-in-part of application No. 17/090,462, filed on Nov. 5, 2020.

(60) Provisional application No. 62/959,675, filed on Jan. 10, 2020, provisional application No. 62/958,223, filed on Jan. 7, 2020.

(30) Foreign Application Priority Data

Jan. 17, 2020 (KR) ........................ 10-2020-0006902

(51) Int. Cl.
*G06F 12/08* (2016.01)
*G06F 12/084* (2016.01)
*G11C 7/10* (2006.01)
*G11C 7/22* (2006.01)

(52) U.S. Cl.
CPC .......... *G06F 12/084* (2013.01); *G11C 7/1069* (2013.01); *G11C 7/1096* (2013.01); *G11C 7/222* (2013.01); *G06F 2212/1024* (2013.01); *G06F 2212/251* (2013.01)

(58) Field of Classification Search
CPC ........... G06F 12/084; G06F 2212/1024; G06F 2212/251; G11C 7/1069; G11C 7/1096; G11C 7/222
USPC .......................................................... 711/3
See application file for complete search history.

(56) References Cited

U.S. PATENT DOCUMENTS

| 10,042,639 | B2 | 8/2018 | Gopal et al. | |
| 2020/0058350 | A1* | 2/2020 | Kim | G11C 13/0004 |
| 2020/0193277 | A1 | 6/2020 | Kwon | |
| 2020/0294575 | A1 | 9/2020 | O et al. | |

FOREIGN PATENT DOCUMENTS

KR  1020170060739 A  6/2017

* cited by examiner

*Primary Examiner* — Huan Hoang
(74) *Attorney, Agent, or Firm* — William Park & Associates Ltd.

(57) ABSTRACT

A PIM device includes a plurality of first storage regions, a second storage region, and a column control circuit. The second storage region is coupled to each of the plurality of first storage regions through a data transmission line. The column control circuit generates a memory read control signal for reading data stored in an initially selected storage region of the plurality of first storage regions and a buffer write control signal for writing the data read from the initially selected storage region to the second storage region. The column control circuit generates a global buffer read control signal for reading the data written to the second storage region and a memory write control signal for writing the data read from the second storage region to a subsequently selected storage region of the plurality of first storage regions.

22 Claims, 36 Drawing Sheets

PROCESSING-IN-MEMORY (PIM) DEVICE

CROSS-REFERENCE TO RELATED APPLICATIONS

The present application claims priority to provisional application No. 62/959,675, filed on Jan. 10, 2020, and this application is a continuation-in-part of U.S. patent application Ser. No. 17/090,462, filed on Nov. 5, 2020, which claims priority under 35 U.S.C. 119(a) to provisional application No. 62/958,223, filed on Jan. 7, 2020, and Korean Application No. 10-2020-0006902, filed on Jan. 17, 2020, which are incorporated herein by references in their entirety.

BACKGROUND

1. Technical Field

Various embodiments of the present disclosure relate to processing-in-memory (PIM) devices and, more particularly, to PIM devices performing a deterministic arithmetic operation.

2. Related Art

Recently, interest in artificial intelligence (AI) has been increasing not only in the information technology industry but also in the financial and medical industries. Accordingly, in various fields, artificial intelligence, more precisely, the introduction of deep learning, is considered and prototyped. One cause of this widespread interest may be due to the improved performance of processors performing arithmetic operations. To improve the performance of artificial intelligence, it may be necessary to increase the number of layers constituting a neural network of the artificial intelligence to educate the artificial intelligence. This trend has continued in recent years, which has led to an exponential increase in the amount of computations required for hardware actually performing the computations. Moreover, if artificial intelligence employs a general hardware system including a memory and a processor which are separated from each other, the performance of the artificial intelligence may be degraded due to a limitation of the amount of data communication between the memory and the processor. In order to solve this problem, a PIM device in which a processor and memory are integrated in one semiconductor chip has been used as a neural network computing device. Because the PIM device directly performs arithmetic operations in the PIM device, a data processing speed in the neural network may be improved.

SUMMARY

In an embodiment, a processing-in-memory (PIM) device may include at least a first storage region and a second storage region. An operating method for the PIM device may include accessing a column coupled to a first row of a first memory bank of the first storage region, reading data stored in a memory cell coupled to the column, and writing the data read from the memory cell coupled to the column coupled to the first row of the first memory bank to a global buffer of the second storage region. The operating method may include reading the data written to the global buffer, accessing a column coupled to a second row of the first memory bank of the first storage region or a third row of a second memory bank of the first memory region, and writing the data read from the global buffer to a memory cell coupled to the second row or the third row.

In an embodiment, a processing-in-memory (PIM) device may include a plurality of first storage regions, a second storage region, and a column control circuit. The second storage region may be coupled to each of the plurality of first storage regions through a data transmission line. The column control circuit may be configured to generate, based on a copy read signal and an address signal, a memory read control signal for reading data stored in an initially selected storage region selected from among the plurality of first storage regions and a buffer write control signal for writing the data read from the initially selected storage region to the second storage region. The column control circuit may also be configured to generate, based on a copy write signal and the address signal, a global buffer read control signal for reading the data written to the second storage region and a memory write control signal for writing the data read from the second storage region to a subsequently selected storage region selected from among the plurality of first storage regions.

In an embodiment, a processing-in-memory (PIM) device may include a copy read circuit, a copy write circuit, a column access circuit, a plurality of memory banks, and a global buffer. The copy read circuit may be configured to generate a memory read access control signal, a buffer write address signal, a copy read operation signal, and a buffer write access control signal, based on a copy read signal, an address signal, and a read timing signal. The copy write circuit may be configured to generate a buffer read access control signal, a buffer read address signal, a memory write access control signal, and a delayed address signal, based on a copy write signal and the address signal. The column access circuit may be configured to generate a buffer address signal based on the copy read operation signal, the buffer write address signal, and the buffer read address signal, generate a memory address signal based on the copy read operation signal, the address signal, and the delayed address signal, and generate a memory access control signal based on the memory read access control signal and the memory write access control signal. The plurality of memory banks may be configured to output stored data to a data transmission line or store data received from the data transmission line, based on the memory access control signal and the memory address signal. The global buffer may be configured to store data transmitted through the data transmission line, based on the buffer write access control signal and the buffer address signal, and output stored data to the data transmission line based on the buffer read access control signal and the buffer address signal.

BRIEF DESCRIPTION OF THE DRAWINGS

Certain features of the disclosed technology are illustrated by various embodiments with reference to the attached drawings.

DETAILED DESCRIPTION OF THE EMBODIMENTS

In the following description of embodiments, it will be understood that the terms "first" and "second" are intended to identify elements, but not used to define a particular number or sequence of elements. In addition, when an element is referred to as being located "on," "over," "above," "under," or "beneath" another element, it is intended to mean relative positional relationship, but not used to limit certain cases for which the element directly contacts the other element, or at least one intervening element is present between the two elements. Accordingly, the terms such as "on," "over," "above," "under," "beneath," "below," and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may be electrically or mechanically connected or coupled to the other element indirectly with one or more additional elements between the two elements. Moreover, when a parameter is referred to as being "predetermined," it may be intended to mean that a value of the parameter is determined in advance of when the parameter is used in a process or an algorithm. The value of the parameter may be set when the process or the algorithm starts or may be set during a period in which the process or the algorithm is executed. A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage may correspond to a signal having a logic "low" level. In an embodiment, the logic "high" level may be set as a voltage level which is higher than a voltage level of the logic "low" level. Meanwhile, logic levels of signals may be set to be different or opposite according to embodiment. For example, a certain signal having a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Various embodiments are directed to processing-in-memory (PIM) devices which are capable of performing a deterministic arithmetic operation at a high speed.

Figure 1:
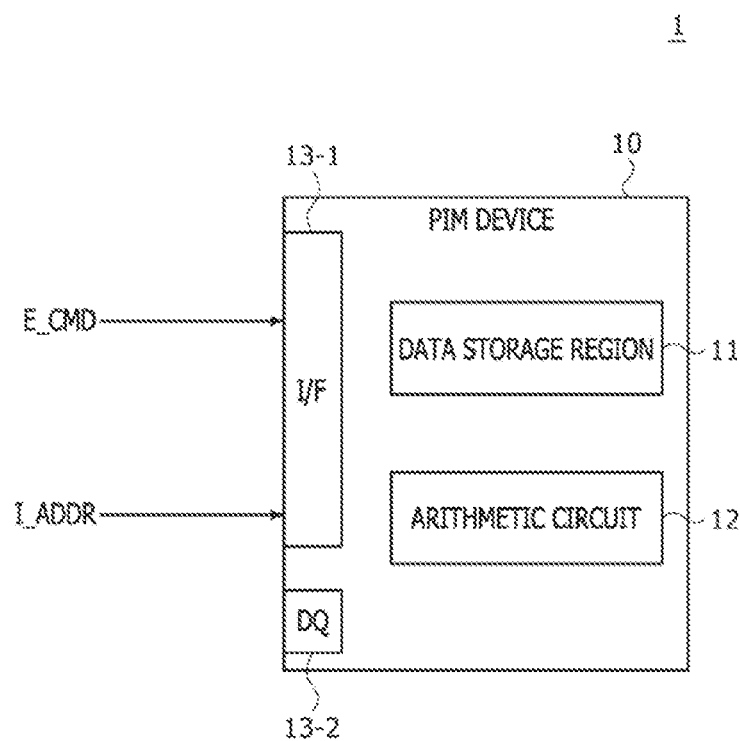
FIG. 1 is a block diagram illustrating a PIM device according to an embodiment of the present disclosure.

FIG. 1 is a block diagram illustrating a PIM device according to an embodiment of the present disclosure. As illustrated in FIG. 1, the PIM device 10 may include a data storage region 11, an arithmetic circuit 12, an interface (I/F) 13-1, and a data (DQ) input/output (I/O) pad 13-2. The data storage region 11 may include a first storage region and a second storage region. In an embodiment, the first storage region and the second storage region may be a first memory bank and a second memory bank, respectively. In another embodiment, the first data storage region and the second storage region may be a memory bank and buffer memory, respectively. The data storage region 11 may include a volatile memory element or a non-volatile memory element. For an embodiment, the data storage region 11 may include both a volatile memory element and a non-volatile memory element.

The arithmetic circuit 12 may perform an arithmetic operation on the data transferred from the data storage region 11. In an embodiment, the arithmetic circuit 12 may include a multiplying-and-accumulating (MAC) operator. The MAC operator may perform a multiplying calculation on the data transferred from the data storage region 11 and perform an accumulating calculation on the multiplication result data. After MAC operations, the MAC operator may output MAC result data. The MAC result data may be stored in the data storage region 11 or output from the PIM device 10 through the data I/O pad 13-2. In an embodiment, the arithmetic circuit 12 may perform additional operations, for example a bias addition operation and an active function operation, for a neural network calculation, for example, an arithmetic operation in a deep learning process. In another embodiment, the PIM device 10 may include a bias addition circuit and active function circuit separated from the arithmetic circuit 12.

The interface 13-1 of the PIM device 10 may receive an external command E_CMD and an input address I_ADDR from an external device. The external device may denote a host or a PIM controller coupled to the PIM device 10. Hereinafter, it may be assumed that the external command E_CMD transmitted to the PIM device 10 is a command requesting the MAC arithmetic operation. That is, the PIM device 10 may perform a MAC arithmetic operation in response to the external command E_CMD. The data I/O pad 13-2 of the PIM device 10 may function as a data communication terminal between a device external to the PIM device 10, for example the PIM controller or a host located outside the PIM system 1. Accordingly, data outputted from the host or the PIM controller may be inputted into the PIM device 10 through the data I/O pad 13-2. Also, data outputted from the PIM device 10 may be inputted to the host or the PIM controller through the data I/O pad 13-2.

In an embodiment, the PIM device 10 may operate in a memory mode or a MAC arithmetic mode. In the event that the PIM device 10 operates in the memory mode, the PIM device 10 may perform a data read operation or a data write operation for the data storage region 11. In the event that the PIM device 10 operates in the MAC arithmetic mode, the arithmetic circuit 12 of the PIM device 10 may receive first data and second data from the data storage region 11 to perform the MAC arithmetic operation. In the event that PIM device 10 operates in the MAC arithmetic mode, the PIM device 10 may also perform the data write operation for the data storage region 11 to execute the MAC arithmetic operation. The MAC arithmetic operation may be a deterministic arithmetic operation performed during a predetermined fixed time. The word "predetermined" as used herein with respect to a parameter, such as a predetermined fixed time or time period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Figure 2:
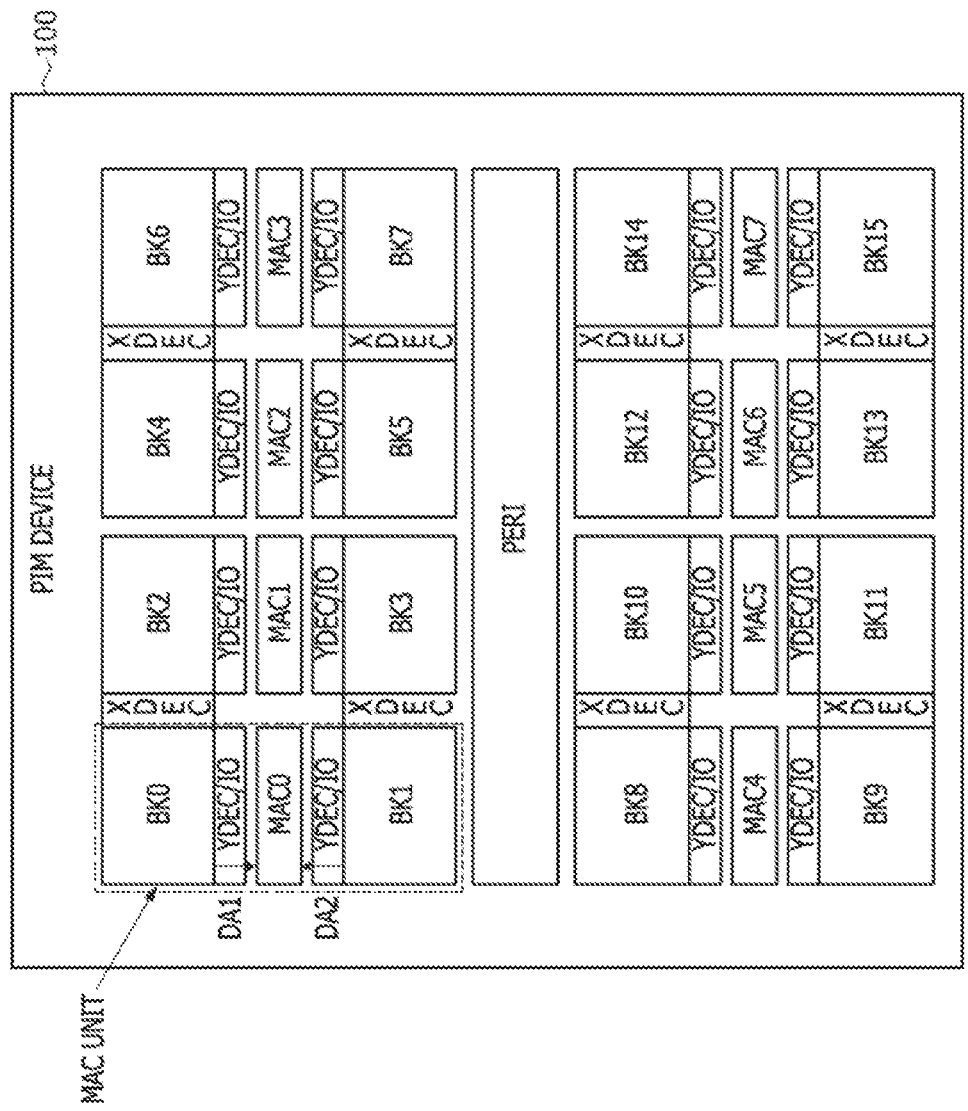
FIG. 2 is a schematic diagram illustrating an arrangement of memory banks and multiplication/accumulation (MAC) operators included in a PIM device according to a first embodiment of the present disclosure.

FIG. 2 illustrates a disposal structure indicating placement of memory banks BK0, . . . , and BK15 and MAC operators MAC0, . . . , and MAC7 included in a PIM device 100 according to an embodiment of the present disclosure. In an embodiment, the memory banks BK0, . . . , and BK15 and the MAC operators MAC0, . . . , and MAC7 may be included in the data storage region and the arithmetic circuit of the PIM device 10 of FIG. 1, respectively. Referring to FIG. 2, the PIM device 100 may include a data storage region and an arithmetic circuit. In an embodiment, the data storage region may include the memory banks BK0, . . . , and BK15. Although the present embodiment illustrates an example in which the data storage region includes the memory banks BK0, . . . , and BK15, the memory banks BK0, . . . , and BK15 are merely examples which are suitable for the data storage region. In some embodiments, the memory banks BK0, . . . , and BK15 may be a memory region corresponding to a volatile memory device, for example, a DRAM device. In an embodiment, each of the memory banks BK0, . . . , and BK15 may be a component unit which is independently activated and may be configured to have the same data bus width as data I/O lines in the PIM device 100. In an embodiment, the memory banks BK0, . . . , and BK15 may operate through interleaving such that an active operation of any one of the memory banks is performed in parallel while another memory bank is selected. Although the present embodiment illustrates an example in which the PIM device 100 includes the memory banks BK0, . . . , and BK15, the number of the memory banks is not limited to 16 and may be different in different embodiments. Each of the memory banks BK0, . . . , and BK15 may include at least one cell array which includes memory unit cells located at cross points of a plurality of rows and a plurality of columns. The memory banks BK0, . . . , and BK15 may include a first group of memory banks (e.g., odd-numbered memory banks BK0, BK2, . . . , and BK14) and a second group of memory banks (e.g., even-numbered memory banks BK1, BK3, . . . , and BK15).

A core circuit may be disposed to be adjacent to the memory banks BK0, . . . , and BK15. The core circuit may include X-decoders XDECs and Y-decoders/IO circuits YDEC/IOs. An X-decoder XDEC may also be referred to as a word line decoder or a row decoder. In an embodiment, two odd-numbered memory banks arrayed to be adjacent to each other in one row among the odd-numbered memory banks BK0, BK2, . . . , and BK14 may share one of the X-decoders XDECs with each other. For example, the first memory bank BK0 and the third memory bank BK2 adjacent to each other in a first row may share one of the X-decoders XDECs, and the fifth memory bank BK4 and the seventh memory bank BK6 adjacent to each other in the first row may also share one of the X-decoders XDECs. Similarly, two even-numbered memory banks arrayed to be adjacent to each other in one row among the even-numbered memory banks BK1, BK3, . . . , and BK15 may share one of the X-decoders XDECs with each other. For example, the second memory bank BK1 and the fourth memory bank BK3 adjacent to each other in a second row may share one of the X-decoders XDECs, and the sixth memory bank BK5 and the eighth memory bank BK7 adjacent to each other in the second row may also share one of the X-decoders XDECs. The X-decoder XDEC may receive a row address from an address latch included in a peripheral circuit PERI and may decode the row address to select and enable one of rows (i.e., word lines) coupled to the memory banks adjacent to the X-decoder XDEC.

The Y-decoders/IO circuits YDEC/IOs may be disposed to be allocated to the memory banks BK0, . . . , and BK15, respectively. For example, the first memory bank BK0 may be allocated to one of the Y-decoders/IO circuits YDEC/IOs, and the second memory bank BK1 may be allocated to another one of the Y-decoders/IO circuits YDEC/IOs. Each of the Y-decoders/IO circuits YDEC/IOs may include a Y-decoder YDEC and an I/O circuit IO. The Y-decoder YDEC may also be referred to as a bit line decoder or a column decoder. The Y-decoder YDEC may receive a column address from an address latch included in the peripheral circuit PERI and may decode the column address to select and enable at least one of columns (i.e., bit lines) coupled to the selected memory bank. Each of the I/O circuits may include an I/O sense amplifier for sensing and amplifying a level of a read datum outputted from the corresponding memory bank during a read operation and a write driver for driving a write datum during a write operation for the corresponding memory bank.

In an embodiment, the arithmetic circuit may include MAC operators MAC0, . . . , and MAC7. Although the present embodiment illustrates an example in which the MAC operators MAC0, . . . , and MAC7 are employed as the arithmetic circuit, the present embodiment may be merely an example of the present disclosure. For example, in some other embodiments, processors other than the MAC operators MAC0, . . . , and MAC7 may be employed as the arithmetic circuit. The MAC operators MAC0, . . . , and MAC7 may be disposed such that one of the odd-numbered memory banks BK0, BK2, . . . , and BK14 and one of the even-numbered memory banks BK1, BK3, . . . , and BK15 share any one of the MAC operators MAC0, . . . , and MAC7 with each other. Specifically, one odd-numbered memory bank and one even-numbered memory bank arrayed in one column to be adjacent to each other may constitute a pair of memory banks sharing one of the MAC operators MAC0, . . . , and MAC7 with each other. One of the MAC operators MAC0, . . . , and MAC7 and a pair of memory banks sharing the one MAC operator with each other will be referred to as 'a MAC unit' hereinafter.

In an embodiment, the number of the MAC operators MAC0, . . . , and MAC7 may be equal to the number of the odd-numbered memory banks BK0, BK2, . . . , and BK14 or the number of the even-numbered memory banks BK1, BK3, . . . , and BK15. The first memory bank BK0, the second memory bank BK1, and the first MAC operator MAC0 between the first memory bank BK0 and the second memory bank BK1 may constitute a first MAC unit. In addition, the third memory bank BK2, the fourth memory bank BK3, and the second MAC operator MAC1 between the third memory bank BK2 and the fourth memory bank BK3 may constitute a second MAC unit. The first MAC operator MAC0 included in the first MAC unit may receive first data DA1 outputted from the first memory bank BK0 included in the first MAC unit and second data DA2 outputted from the second memory bank BK1 included in the first MAC unit. In addition, the first MAC operator MAC0 may perform a MAC arithmetic operation of the first data DA1 and the second data DA2. In the event that the PIM device 100 performs a neural network calculation, for example, an arithmetic operation in a deep learning process, one of the first data DA1 and the second data DA2 may be weight data and the other may be vector data. A configuration of any one of the MAC operators MAC0-MAC7 will be described in more detail hereinafter.

In the PIM device 100, the peripheral circuit PERI may be disposed in a region other than an area in which the memory banks BK0, BK1, . . . , and BK15, the MAC operators MAC0, . . . , and MAC7, and the core circuit are disposed. The peripheral circuit PERI may include a control circuit and a transmission path for a command/address signal, a control circuit and a transmission path for input/output of data, and a power supply circuit. The control circuit for the command/address signal may include a command decoder for decoding a command included in the command/address signal to generate an internal command signal, an address latch for converting an input address into a row address and a column address, a control circuit for controlling various functions of row/column operations, and a control circuit for controlling a delay locked loop (DLL) circuit. The control circuit for the input/output of data in the peripheral circuit PERI may include a control circuit for controlling a read/write operation, a read/write buffer, and an output driver. The power supply circuit in the peripheral circuit PERI may include a reference power voltage generation circuit for generating an internal reference power voltage and an internal power voltage generation circuit for generating an internal power voltage from an external power voltage.

The PIM device 100 according to the present embodiment may operate in any one mode of a memory mode and a MAC arithmetic mode. In the memory mode, the PIM device 100 may operate to perform the same operations as general memory devices. The memory mode may include a memory read operation mode and a memory write operation mode. In the memory read operation mode, the PIM device 100 may perform a read operation for reading out data from the memory banks BK0, BK1, . . . , and BK15 to output the read data, in response to an external request. In the memory write operation mode, the PIM device 100 may perform a write operation for storing data provided by an external device into the memory banks BK0, BK1, . . . , and BK15, in response to an external request.

In the MAC arithmetic mode, the PIM device 100 may perform the MAC arithmetic operation using the MAC operators MAC0, . . . , and MAC7. Specifically, the PIM device 100 may perform the read operation of the first data DA1 for each of the odd-numbered memory banks BK0, BK2, . . . , and BK14 and the read operation of the second data DA2 for each of the even-numbered memory banks BK1, BK3, . . . , and BK15, for the MAC arithmetic operation in the MAC arithmetic mode. In addition, each of the MAC operators MAC0, . . . , and MAC7 may perform the MAC arithmetic operation of the first data DA1 and the second data DA2 which are read out of the memory banks to store a result of the MAC arithmetic operation into the memory bank or to output the result of the MAC arithmetic operation. In some cases, the PIM device 100 may perform a data write operation for storing data to be used for the MAC arithmetic operation into the memory banks before the data read operation for the MAC arithmetic operation is performed in the MAC arithmetic mode.

The operation mode of the PIM device 100 according to the present embodiment may be determined by a command which is transmitted from a host or a controller to the PIM device 100. In an embodiment, if a first external command requesting a read operation or a write operation for the memory banks BK0, BK1, . . . , and BK15 is inputted to the PIM device 100, the PIM device 100 may perform the data read operation or the data write operation in the memory mode. Meanwhile, if a second external command requesting a MAC calculation corresponding to the MAC arithmetic operation is inputted to the PIM device 100, the PIM device 100 may perform the MAC arithmetic operation.

The PIM device 100 may perform a deterministic MAC arithmetic operation. The term "deterministic MAC arithmetic operation" used in the present disclosure may be defined as the MAC arithmetic operation performed in the PIM device 100 during a predetermined fixed time. Thus, the host or the controller may always predict a point in time (or a clock) when the MAC arithmetic operation terminates in the PIM device 100 at a point in time when an external command requesting the MAC arithmetic operation is transmitted from the host or the controller to the PIM device 100. No operation for informing the host or the controller of a status of the MAC arithmetic operation is required while the PIM device 100 performs the deterministic MAC arithmetic operation. In an embodiment, a latency during which the MAC arithmetic operation is performed in the PIM device 100 may be fixed for the deterministic MAC arithmetic operation.

Figure 3:
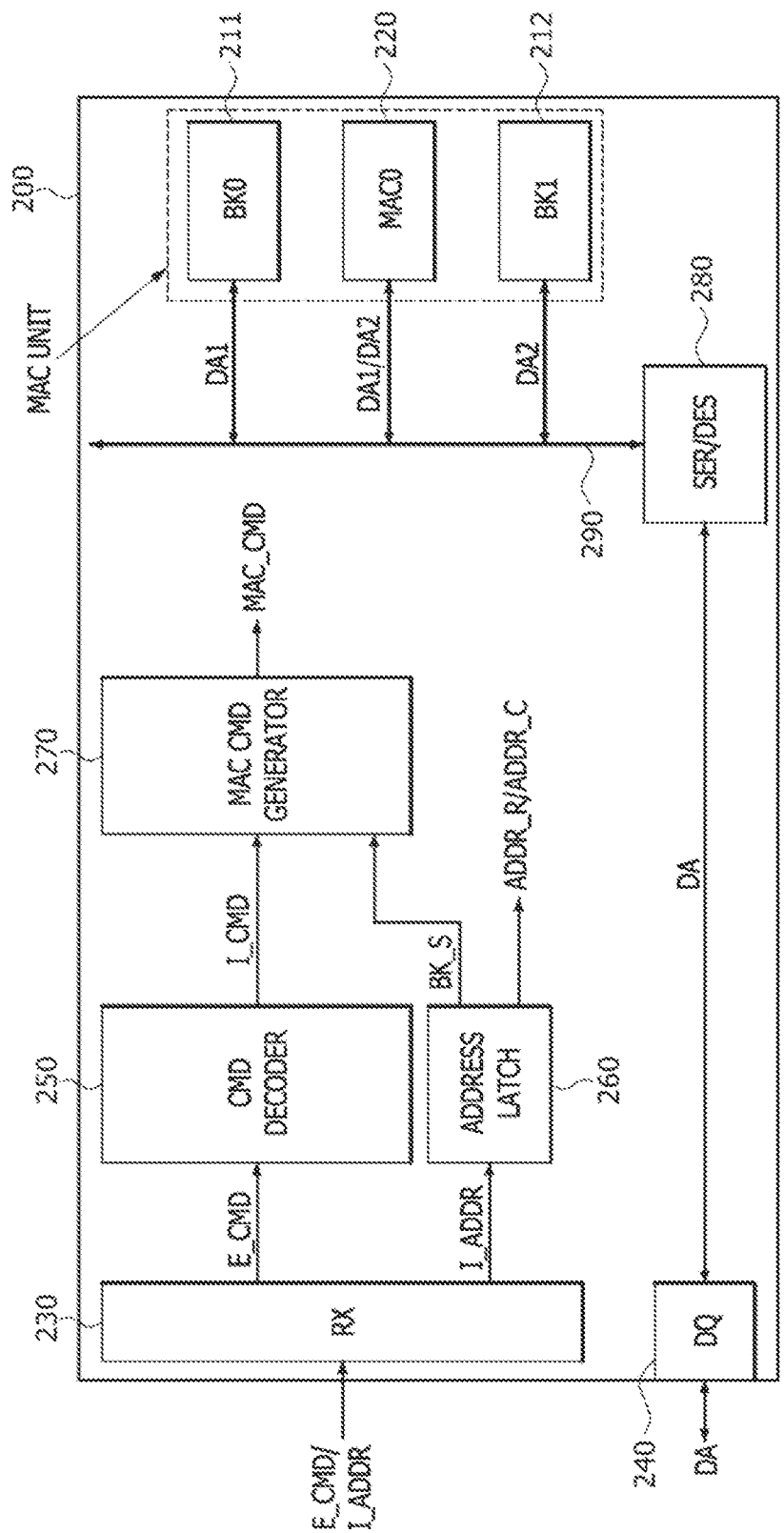
FIG. 3 is a block diagram illustrating a configuration of a PIM device according to the first embodiment of the present disclosure.
Figure 4:
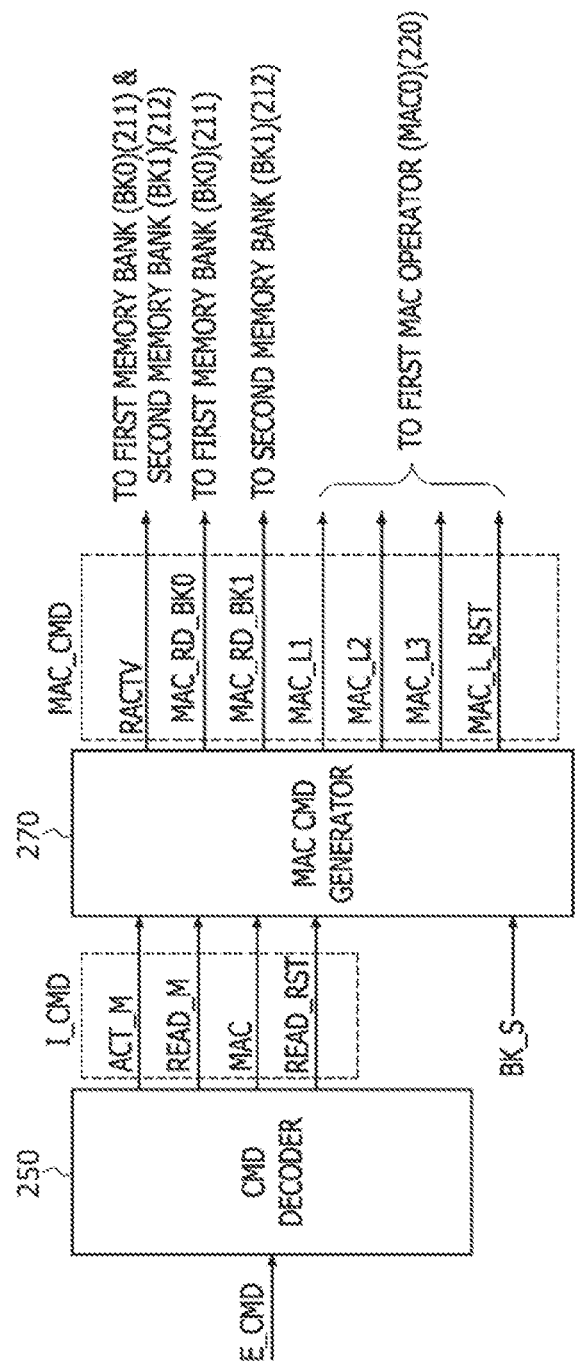
FIG. 4 illustrates internal command signals outputted from a command decoder and MAC command signals outputted from a MAC command generator in the PIM device of FIG. 3.

FIG. 3 is a block diagram illustrating a configuration of a PIM device 200 corresponding to the PIM device 100 illustrated in FIG. 3, and FIG. 4 illustrates an internal command signal I_CMD outputted from a command decoder 250 and a MAC command signal MAC_CMD outputted from a MAC command generator 270 included in the PIM device 200 of FIG. 3. FIG. 3 illustrates only the first memory bank (BK0) 211, the second memory bank (BK1) 212, and the first MAC operator (MAC0) 220 constituting the first MAC unit among the plurality of MAC units. However, FIG. 3 illustrates merely an example for simplification of the drawing. Accordingly, the following description for the first MAC unit may be equally applicable to the remaining MAC units. Referring to FIG. 3, the PIM device 200 may include a global I/O line (hereinafter, referred to as a 'GIO line') 290. The first memory bank (BK0) 211, the second memory bank (BK1) 212, and the first MAC operator (MAC0) 220 may communicate with each other through the GIO line 290. In an embodiment, the GIO line 290 may be disposed in the peripheral circuit PERI of FIG. 2.

The PIM device 200 may include a receiving driver (RX) 230, a data I/O circuit (DQ) 240, a command decoder 250, an address latch 260, a MAC command generator 270, and a serializer/deserializer (SER/DES) 280. The command decoder 250, the address latch 260, the MAC command generator 270, and the serializer/deserializer 280 may be disposed in the peripheral circuit PERI of the PIM device 100 illustrated in FIG. 2. The receiving driver 230 may receive an external command E_CMD and an input address I_ADDR from an external device. The external device may denote a host or a controller coupled to the PIM device 200. Hereinafter, it may be assumed that the external command E_CMD transmitted to the PIM device 200 is a command requesting the MAC arithmetic operation. That is, the PIM device 200 may perform the deterministic MAC arithmetic operation in response to the external command E_CMD. The data I/O circuit 240 may include an I/O pad. The data I/O circuit 240 may be coupled to data I/O line. The PIM device 200 may communicate with the external device through the data I/O circuit 240. The receiving driver 230 may separately output the external command E_CMD and the input address I_ADDR received from the external device. Data DA inputted to the PIM device 200 through the data I/O circuit 240 may be processed by the serializer/deserializer 280 and may be transmitted to the first memory bank (BK0) 211 and the second memory bank (BK1) 212 through the GIO line 290 of the PIM device 200. The data DA outputted from the first memory bank (BK0) 211, the second memory bank (BK1) 212, and the first MAC operator (MAC0) 220 through the GIO line 290 may be processed by the serializer/deserializer 280 and may be outputted to the external device through the data I/O circuit 240. The serializer/deserializer 280 may convert the data DA into parallel data if the data DA are serial data or may convert the data DA into serial data if the data DA are parallel data. For the data conversion, the serializer/deserializer 280 may include a serializer converting parallel data into serial data and a deserializer converting serial data into parallel data.

The command decoder 250 may decode the external command E_CMD outputted from the receiving driver 230 to generate and output the internal command signal I_CMD. As illustrated in FIG. 4, the internal command signal I_CMD outputted from the command decoder 250 may include first to fourth internal command signals. In an embodiment, the first internal command signal may be a memory active signal ACT_M, the second internal command signal may be a memory read signal READ_M, the third internal command signal may be a MAC arithmetic signal MAC, and the fourth internal command signal may be a result read signal READ_RST. The first to fourth internal command signals outputted from the command decoder 250 may be sequentially inputted to the MAC command generator 270.

In order to perform the deterministic MAC arithmetic operation of the PIM device 200, the memory active signal ACT_M, the memory read signal READ_M, the MAC arithmetic signal MAC, and the result read signal READ_RST outputted from the command decoder 250 may be sequentially generated at predetermined points in time (or clocks). In an embodiment, the memory active signal ACT_M, the memory read signal READ_M, the MAC arithmetic signal MAC, and the result read signal READ_RST may have predetermined latencies, respectively. For example, the memory read signal READ_M may be generated after a first latency elapses from a point in time when the memory active signal ACT_M is generated, the MAC arithmetic signal MAC may be generated after a second latency elapses from a point in time when the memory read signal READ_M is generated, and the result read signal READ_RST may be generated after a third latency elapses from a point in time when the MAC arithmetic signal MAC is generated. No signal is generated by the command decoder 250 until a fourth latency elapses from a point in time when the result read signal READ_RST is generated. The first to fourth latencies may be predetermined and fixed. Thus, the host or the controller outputting the external command E_CMD may predict the points in time when the first to fourth internal command signals constituting the internal command signal I_CMD are generated by the command decoder 250 in advance at a point in time when the external command E_CMD is outputted from the host or the controller.

The address latch 260 may convert the input address I_ADDR outputted from the receiving driver 230 into a bank selection signal BK_S and a row/column address ADDR_R/ADDR_C to output the bank selection signal BK_S and the row/column address ADDR_R/ADDR_C. The bank selection signal BK_S may be inputted to the MAC command generator 270. The row/column address ADDR_R/ADDR_C may be transmitted to the first and second memory banks 211 and 212. One of the first and second memory banks 211 and 212 may be selected by the bank selection signal BK_S. One of rows included in the selected memory bank and one of columns included in the selected memory bank may be selected by the row/column address ADDR_R/ADDR_C. In an embodiment, a point in time when the bank selection signal BK_S is inputted to the MAC command generator 270 may be the same moment as a point in time when the row/column address ADDR_R/ADDR_C is inputted to the first and second memory banks 211 and 212. In an embodiment, the point in time when the bank selection signal BK_S is inputted to the MAC command generator 270 and the point in time when the row/column address ADDR_R/ADDR_C is inputted to the first and second memory banks 211 and 212 may be a point in time when the MAC command is generated to read out data from the first and second memory banks 211 and 212 for the MAC arithmetic operation.

The MAC command generator 270 may output the MAC command signal MAC_CMD in response to the internal command signal I_CMD outputted from the command decoder 250 and the bank selection signal BK_S outputted from the address latch 260. As illustrated in FIG. 4, the MAC command signal MAC_CMD outputted from the MAC command generator 270 may include first to seventh MAC command signals. In an embodiment, the first MAC command signal may be a MAC active signal RACTV, the second MAC command signal may be a first MAC read signal MAC_RD_BK0, the third MAC command signal may be a second MAC read signal MAC_RD_BK1, the fourth MAC command signal may be a first MAC input latch signal MAC_L1, the fifth MAC command signal may be a second MAC input latch signal MAC_L2, the sixth MAC command signal may be a MAC output latch signal MAC_L3, and the seventh MAC command signal may be a MAC result latch signal MAC_L_RST.

The MAC active signal RACTV may be generated based on the memory active signal ACT_M outputted from the command decoder 250. The first MAC read signal MAC_RD_BK0 may be generated in response to the memory read signal READ_M outputted from the command decoder 250 and the bank selection signal BK_S having a first level (e.g., a logic "low" level) outputted from the address latch 260. The first MAC input latch signal MAC_L1 may be generated at a point in time when a certain time elapses from a point in time when the first MAC read signal MAC_RD_BK0 is generated. For various embodiments, a certain time means a fixed time duration. The second MAC read signal MAC_RD_BK1 may be generated in response to the memory read signal READ_M outputted from the command decoder 250 and the bank selection signal BK_S having a second level (e.g., a logic "high" level) outputted from the address latch 260. The second MAC input latch signal MAC_L2 may be generated at a point in time when a certain time elapses from a point in time when the second MAC read signal MAC_RD_BK1 is generated. The MAC output latch signal MAC_L3 may be generated in response to the MAC arithmetic signal MAC outputted from the command decoder 250. Finally, the MAC result latch signal MAC_L_RST may be generated in response to the result read signal READ_RST outputted from the command decoder 250.

The MAC active signal RACTV outputted from the MAC command generator 270 may control an activation operation for the first and second memory banks 211 and 212. The first MAC read signal MAC_RD_BK0 outputted from the MAC command generator 270 may control a data read operation for the first memory bank 211. The second MAC read signal MAC_RD_BK1 outputted from the MAC command generator 270 may control a data read operation for the second memory bank 212. The first MAC input latch signal MAC_L1 and the second MAC input latch signal MAC_L2 outputted from the MAC command generator 270 may control an input data latch operation of the first MAC operator (MAC0) 220. The MAC output latch signal MAC_L3 outputted from the MAC command generator 270 may control an output data latch operation of the first MAC operator (MAC0) 220. The MAC result latch signal MAC_L_RST outputted from the MAC command generator 270 may control a reset operation of the first MAC operator (MAC0) 220.

As described above, in order to perform the deterministic MAC arithmetic operation of the PIM device 200, the memory active signal ACT_M, the memory read signal READ_M, the MAC arithmetic signal MAC, and the result read signal READ_RST outputted from the command decoder 250 may be sequentially generated at predetermined points in time (or clocks), respectively. Thus, the MAC active signal RACTV, the first MAC read signal MAC_RD_BK0, the second MAC read signal MAC_RD_BK1, the first MAC input latch signal MAC_L1, the second MAC input latch signal MAC_L2, the MAC output latch signal MAC_L3, and the MAC result latch signal MAC_L_RST may also be generated and outputted from the MAC command generator 270 at predetermined points in time after the external command E_CMD is inputted to the PIM device 200, respectively. That is, a time period from a point in time when the first and second memory banks 211 and 212 are activated by the MAC active signal RACTV until a point in time when the first MAC operator (MAC0) 220 is reset by the MAC result latch signal MAC_L_RST may be predetermined, and thus the PIM device 200 may perform the deterministic MAC arithmetic operation.

Figure 5:
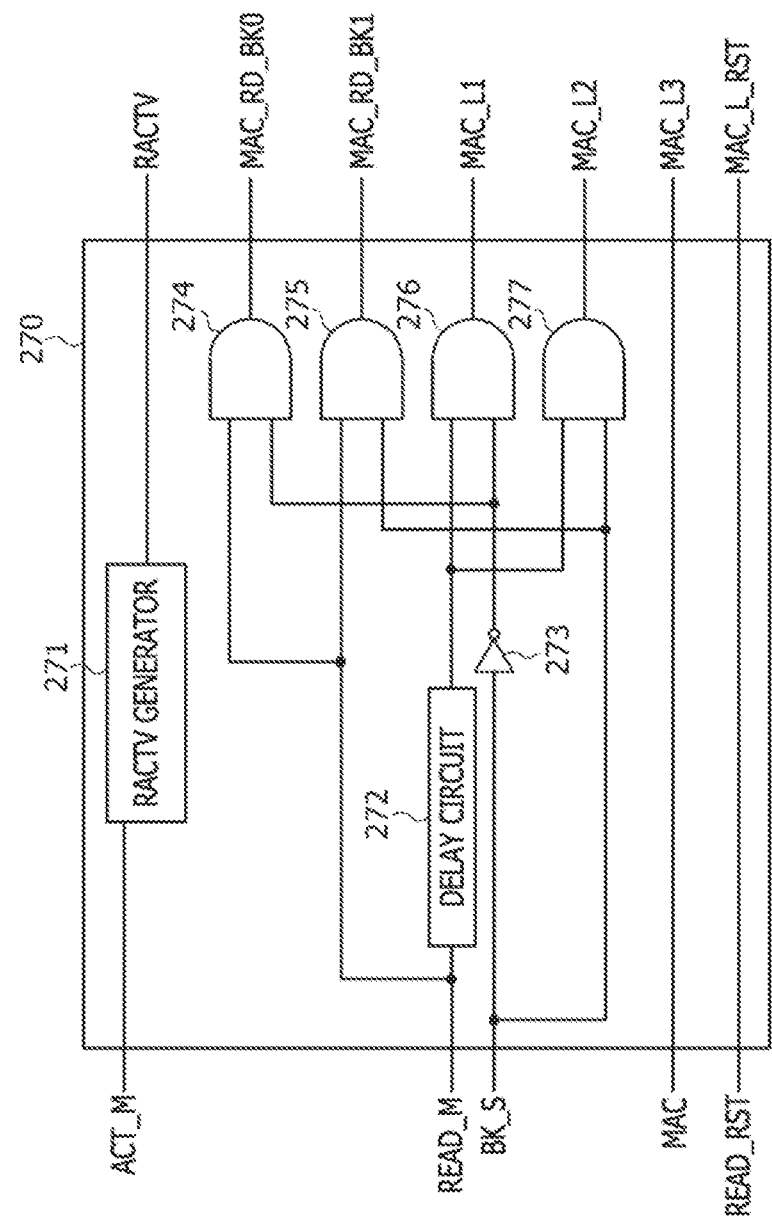
FIG. 5 illustrates an example of a configuration of a MAC command generator included in the PIM device of FIG. 3.

FIG. 5 illustrates an example of a configuration of the MAC command generator 270 included in the PIM device 200 illustrated in FIG. 3. Referring to FIG. 5, the MAC command generator 270 may sequentially receive the memory active signal ACT_M, the memory read signal READ_M, the MAC arithmetic signal MAC, and the result read signal READ_RST from the command decoder 250. In addition, the MAC command generator 270 may also receive the bank selection signal BK_S from the address latch 260. The MAC command generator 270 may output the MAC active signal RACTV, the first MAC read signal MAC_RD_BK0, the second MAC read signal MAC_RD_BK1, the first MAC input latch signal MAC_L1, the second MAC input latch signal MAC_L2, the MAC output latch signal MAC_L3, and the MAC result latch signal MAC_L_RST in series with certain time intervals. For an embodiment, a certain time interval is a time interval having a fixed duration.

In an embodiment, the MAC command generator 270 may be configured to include an active signal generator 271, a delay circuit 272, an inverter 273, and first to fourth AND gates 274, 275, 276, and 277. The active signal generator 271 may receive the memory active signal ACT_M to generate and output the MAC active signal RACTV. The MAC active signal RACTV outputted from the active signal generator 271 may be transmitted to the first and second memory banks 211 and 212 to activate the first and second memory banks 211 and 212. The delay circuit 272 may receive the memory read signal READ_M and may delay the memory read signal READ_M by a delay time DELAY_T to output the delayed signal of the memory read signal READ_M. The inverter 273 may receive the bank selection signal BK_S and may invert a logic level of the bank selection signal BK_S to output the inverted signal of the bank selection signal BK_S.

The first AND gate 274 may receive the memory read signal READ_M and an output signal of the inverter 273 and may perform a logical AND operation of the memory read signal READ_M and an output signal of the inverter 273 to generate and output the first MAC read signal MAC_RD_BK0. The second AND gate 275 may receive the memory read signal READ_M and the bank selection signal BK_S and may perform a logical AND operation of the memory read signal READ_M and the bank selection signal BK_S to generate and output the second MAC read signal MAC_RD_BK1. The third AND gate 276 may receive an output signal of the delay circuit 272 and an output signal of the inverter 273 and may perform a logical AND operation of the output signals of the delay circuit 272 and the inverter 273 to generate and output the first MAC input latch signal MAC_L1. The fourth AND gate 277 may receive an output signal of the delay circuit 272 and the bank selection signal BK_S and may perform a logical AND operation of the output signal of the delay circuit 272 and the bank selection signal BK_S to generate and output the second MAC input latch signal MAC_L2.

It may be assumed that the memory read signal READ_M inputted to the MAC command generator 270 has a logic "high" level and the bank selection signal BK_S inputted to the MAC command generator 270 has a logic "low" level. A level of the bank selection signal BK_S may change from a logic "low" level into a logic "high" level after a certain time elapses. When the memory read signal READ_M has a logic "high" level and the bank selection signal BK_S has a logic "low" level, the first AND gate 274 may output the first MAC read signal MAC_RD_BK0 having a logic "high" level and the second AND gate 275 may output the second MAC read signal MAC_RD_BK1 having a logic "low" level. The first memory bank 211 may transmit the first data DA1 to the first MAC operator 220 according to a control operation based on the first MAC read signal MAC_RD_BK0 having a logic "high" level. If a level transition of the bank selection signal BK_S occurs so that both of the memory read signal READ_M and the bank selection signal BK_S have a logic "high" level, the first AND gate 274 may output the first MAC read signal MAC_RD_BK0 having a logic "low" level and the second AND gate 275 may output the second MAC read signal MAC_RD_BK1 having a logic "high" level. The second memory bank 212 may transmit the second data DA2 to the first MAC operator 220 according to a control operation based on the second MAC read signal MAC_RD_BK1 having a logic "high" level.

Due to the delay time of the delay circuit 272, the output signals of the third and fourth AND gates 276 and 277 may be generated after the first and second MAC read signals MAC_RD_BK0 and MAC_RD_BK1 are generated. Thus, after the second MAC read signal MAC_RD_BK1 is generated, the third AND gate 276 may output the first MAC input latch signal MAC_L1 having a logic "high" level. The first MAC operator 220 may latch the first data DA1 in response to the first MAC input latch signal MAC_L1 having a logic "high" level. After a certain time elapses from a point in time when the first data DA1 are latched by the first MAC operator 220, the fourth AND gate 277 may output the second MAC input latch signal MAC_L2 having a logic "high" level. The first MAC operator 220 may latch the second data DA2 in response to the second MAC input latch signal MAC_L2 having a logic "high" level. The first MAC operator 220 may start to perform the MAC arithmetic operation after the first and second data DA1 and DA2 are latched.

The MAC command generator 270 may generate the MAC output latch signal MAC_L3 in response to the MAC arithmetic signal MAC outputted from the command decoder 250. The MAC output latch signal MAC_L3 may have the same logic level as the MAC arithmetic signal MAC. For example, if the MAC arithmetic signal MAC having a logic "high" level is inputted to the MAC command generator 270, the MAC command generator 270 may generate the MAC output latch signal MAC_L3 having a logic "high" level. The MAC command generator 270 may generate the MAC result latch signal MAC_L_RST in response to the result read signal READ_RST outputted from the command decoder 250. The MAC result latch signal MAC_L_RST may have the same logic level as the result read signal READ_RST. For example, if the result read signal READ_RST having a logic "high" level is inputted to the MAC command generator 270, the MAC command generator 270 may generate the MAC result latch signal MAC_L_RST having a logic "high" level.

Figure 6:
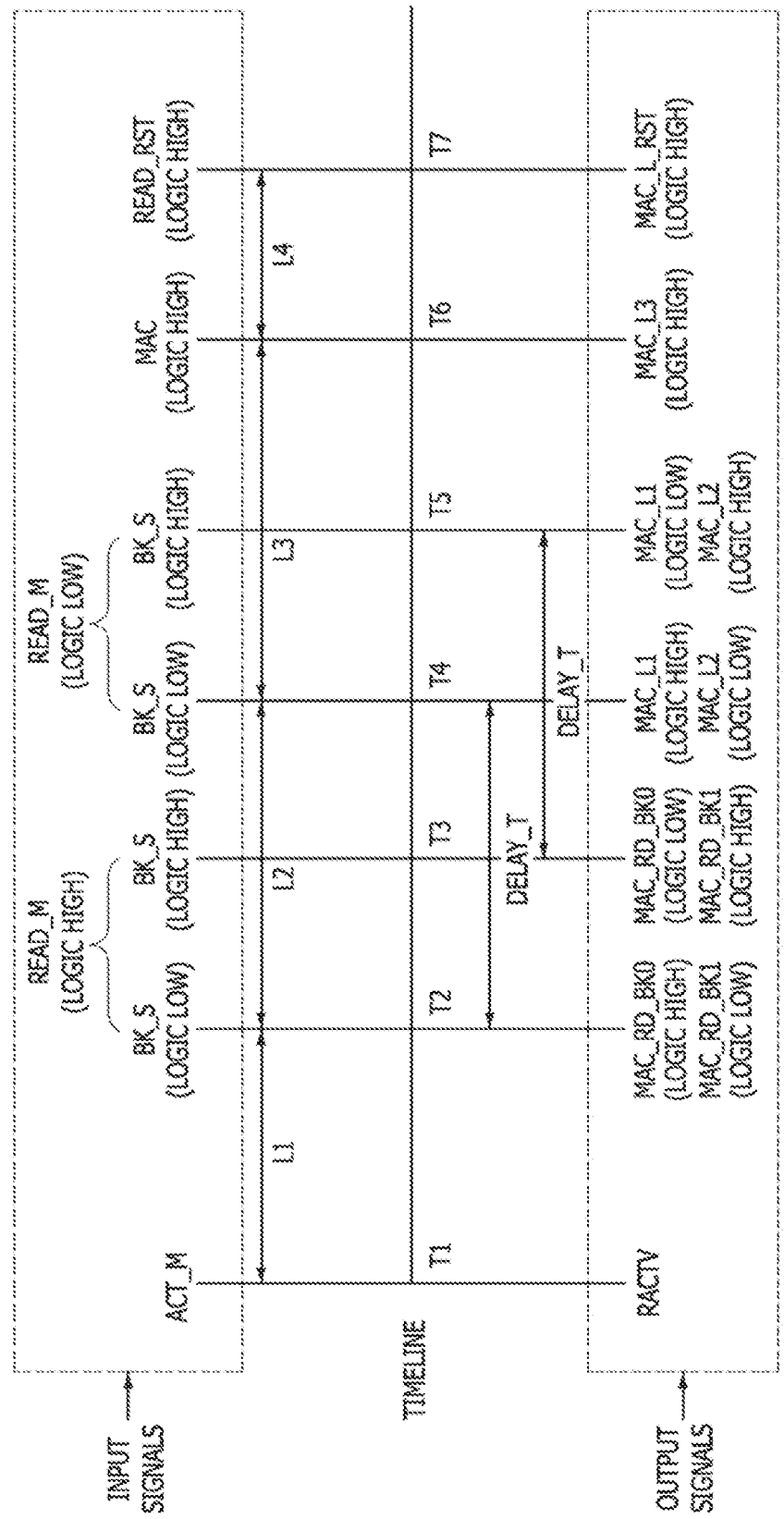
FIG. 6 illustrates input signals and output signals of the MAC command generator illustrated in FIG. 5 with a timeline.

FIG. 6 illustrates input signals and output signals of the MAC command generator 270 illustrated in FIG. 5 along a timeline. In FIG. 6, signals transmitted from the command decoder 250 to the MAC command generator 270 are illustrated in an upper dotted line box, and signals outputted from the MAC command generator 270 are illustrated in a lower dotted line box. Referring to FIGS. 5 and 6 at a first point in time "T1" of the timeline, the memory active signal ACT_M may be inputted to the MAC command generator 270 and the MAC command generator 270 may output the MAC active signal RACTV. At a second point in time "T2" when a certain time, for example, a first latency L1 elapses from the first point in time "T1", the memory read signal READ_M having a logic "high" level and the bank selection signal BK_S having a logic "low" level may be inputted to the MAC command generator 270. In response to the memory read signal READ_M having a logic "high" level and the bank selection signal BK_S having a logic "low" level, the MAC command generator 270 may output the first MAC read signal MAC_RD_BK0 having a logic "high" level and the second MAC read signal MAC_RD_BK1 having a logic "low" level in response to the memory read signal READ_M having a logic "high" level and the bank selection signal BK_S having a logic "low" level, as described with reference to FIG. 5. At a third point in time "T3" when a certain time elapses from the second point in time "T2", a logic level of the bank selection signal BK_S may change from a logic "low" level into a logic "high" level. In such a case, the MAC command generator 270 may output the first MAC read signal MAC_RD_BK0 having a logic "low" level and the second MAC read signal MAC_RD_BK1 having a logic "high" level, as described with reference to FIG. 5.

At a fourth point in time "T4" when the delay time DELAY_T elapses from the second point in time "T2", the MAC command generator 270 may output the first MAC input latch signal MAC_L1 having a logic "high" level and the second MAC input latch signal MAC_L2 having a logic "low" level. The delay time DELAY_T may be set by the delay circuit 272. The delay time DELAY_T may bet to be different according a logic design scheme of the delay circuit 272 and may be fixed once the logic design scheme of the delay circuit 272 is determined. In an embodiment, the delay time DELAY_T may be set to be equal to or greater than a second latency L2. At a fifth point in time "T5" when a certain time elapses from the fourth point in time "T4", the MAC command generator 270 may output the first MAC input latch signal MAC_L1 having a logic "low" level and the second MAC input latch signal MAC_L2 having a logic "high" level. The fifth point in time "T5" may be a moment when the delay time DELAY_T elapses from the third point in time "T3".

At a sixth point in time "T6" when a certain time, for example, a third latency L3 elapses from the fourth point in time "T4", the MAC arithmetic signal MAC having a logic "high" level may be inputted to the MAC command generator 270. In response to the MAC arithmetic signal MAC having a logic "high" level, the MAC command generator 270 may output the MAC output latch signal MAC_L3 having a logic "high" level, as described with reference to FIG. 5. Subsequently, at a seventh point in time "T7" when a certain time, for example, a fourth latency L4 elapses from the sixth point in time "T6", the result read signal READ_RST having a logic "high" level may be inputted to the MAC command generator 270. In response to the result read signal READ_RST having a logic "high" level, the MAC command generator 270 may output the MAC result latch signal MAC_L_RST having a logic "high" level, as described with reference to FIG. 5.

In order to perform the deterministic MAC arithmetic operation, moments when the internal command signals ACT_M, READ_M, MAC, and READ_RST generated by the command decoder 250 are inputted to the MAC command generator 270 may be fixed and moments when the MAC command signals RACTV, MAC_RD_BK0, MAC_RD_BK1, MAC_L1, MAC_L2, MAC_L3, and MAC_L_RST are outputted from the MAC command generator 270 in response to the internal command signals ACT_M, READ_M, MAC, and READ_RST may also be fixed. Thus, all of the first latency L1 between the first point in time "T1" and the second point in time "T2", the second latency L2 between the second point in time "T2" and the fourth point in time "T4", the third latency L3 between the fourth point in time "T4" and the sixth point in time "T6", and the fourth latency L4 between the sixth point in time "T6" and the seventh point in time "T7" may have fixed values.

In an embodiment, the first latency L1 may be defined as a time it takes to activate both of the first and second memory banks based on the MAC active signal RACTV. The second latency L2 may be defined as a time it takes to read the first and second data out of the first and second memory banks BK0 and BK1 based on the first and second MAC read signals MAC_RD_BK0 and MAC_RD_BK1 and to input the first and second data DA1 and DA2 into the first MAC operator (MAC0) 220. The third latency L3 may be defined as a time it takes to latch the first and second data DA1 and DA2 in the first MAC operator (MAC0) 220 based on the first and second MAC input latch signals MAC_L1 and MAC_L2 and it takes the first MAC operator (MAC0) 220 to perform the MAC arithmetic operation of the first and second data. The fourth latency L4 may be defined as a time it takes to latch the output data in the first MAC operator (MAC0) 220 based on the MAC output latch signal MAC_L3.

Figure 7:
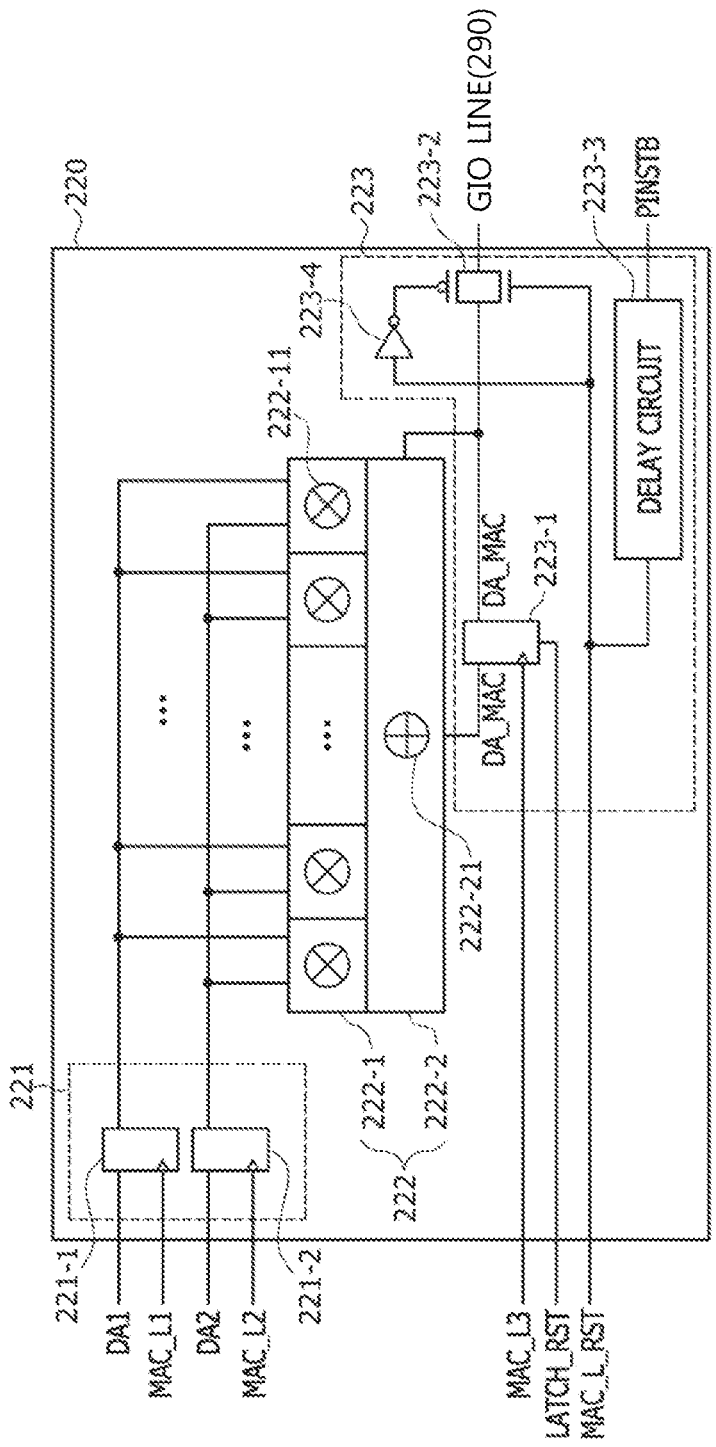
FIG. 7 illustrates an example of a configuration of a MAC operator included in the PIM device of FIG. 3.
Figure 8:
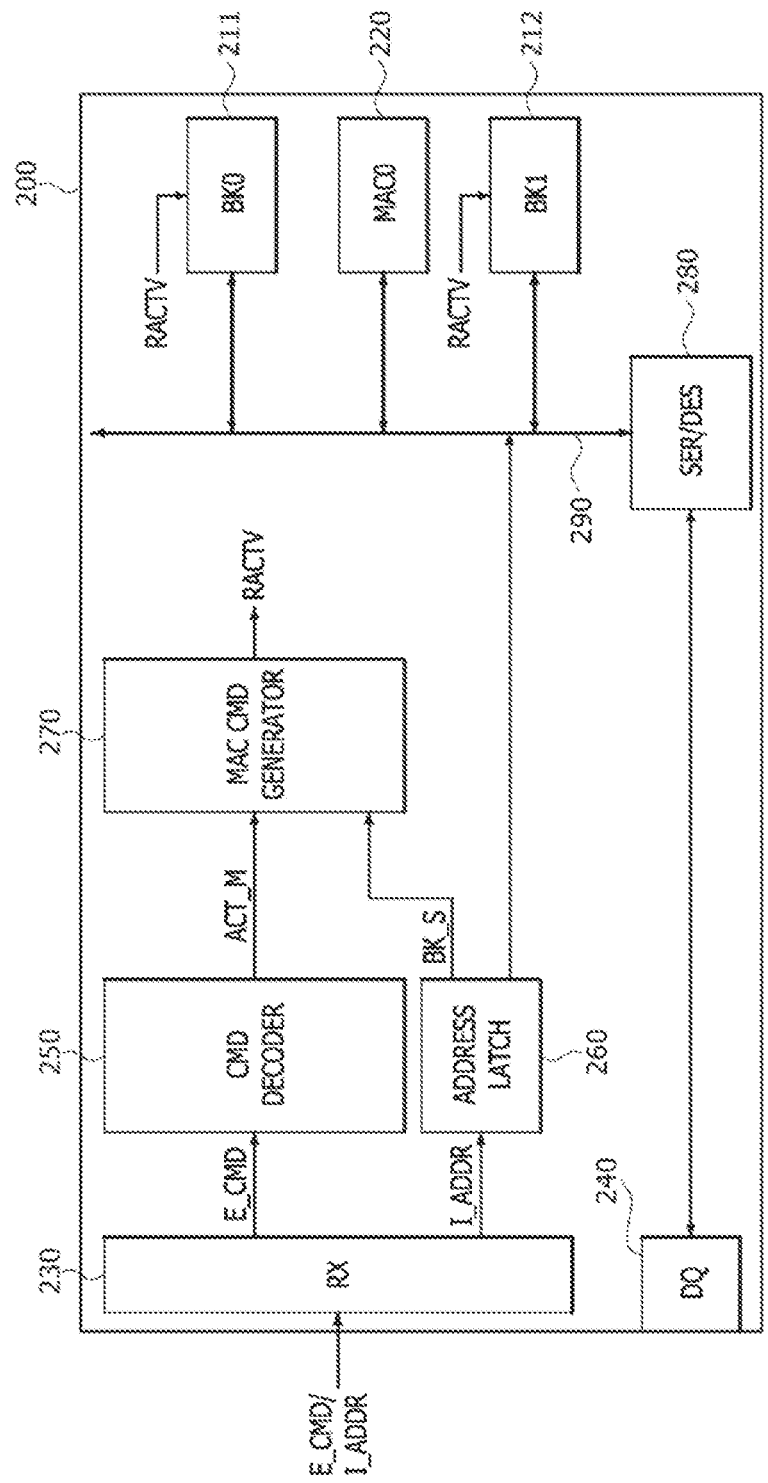
FIGS. 8 to 14 are block diagrams illustrating operations of the PIM device illustrated in FIG. 3.

FIG. 7 illustrates an example of a configuration of the first MAC operator (MAC0) 220 included in the PIM device 200 illustrated in FIG. 3. Referring to FIG. 7, the first MAC operator (MAC0) 220 may be configured to include a data input circuit 221, a MAC circuit 222, and a data output circuit 223. The data input circuit 221 may be configured to include a first input latch 221-1 and a second input latch 221-2. The MAC circuit 222 may be configured to include a multiplication logic circuit 222-1 and an addition logic circuit 222-2. The data output circuit 223 may be configured to include an output latch 223-1, a transfer gate 223-2, a delay circuit 223-3, and an inverter 223-4. In an embodiment, the first input latch 221-1, the second input latch 221-2, and the output latch 223-1 may be realized using flip-flops.

The data input circuit 221 of the first MAC operator (MAC0) 220 may be synchronized with the first and second MAC input latch signals MAC_L1 and MAC_L2 to receive and output the first and second data DA1 and DA2 inputted through the GIO line 290 to the MAC circuit 222. Specifically, the first data DA1 may be transmitted from the first memory bank BK0 (211 of FIG. 3) to the first input latch 221-1 of the data input circuit 221 through the GIO line 290, in response to the first MAC read signal MAC_RD_BK0 having a logic "high" level outputted from the MAC command generator (270 of FIG. 3). The second data DA2 may be transmitted from the second memory bank BK1 (212 of FIG. 2) to the second input latch 221-2 of the data input circuit 221 through the GIO line 290, in response to the second MAC read signal MAC_RD_BK1 having a logic "high" level outputted from the MAC command generator 270. The first input latch 221-1 may output the first data DA1 to the MAC circuit 222 in synchronization with the first MAC input latch signal MAC_L1 having a logic "high" level outputted from the MAC command generator 270 (270 of FIG. 3). The second input latch 221-2 may output the second data DA2 to the MAC circuit 222 in synchronization with the second MAC input latch signal MAC_L2 having a logic "high" level outputted from the MAC command generator (270 of FIG. 3). As described with reference to FIG. 5, the second MAC input latch signal MAC_L2 may be generated at a moment (corresponding to the fifth point in time "T5" of FIG. 6) when a certain time elapses from a moment (corresponding to the fourth point in time "T4" of FIG. 6) when the first MAC input latch signal MAC_L1 is generated. Thus, after the first data DA1 is inputted to the MAC circuit 222, the second data DA2 may then be inputted to the MAC circuit 222.

The MAC circuit 222 may perform a multiplying calculation and an accumulative adding calculation for the first and second data DA1 and DA2. The multiplication logic circuit 222-1 of the MAC circuit 222 may include a plurality of multipliers 222-11. Each of the plurality of multipliers 222-11 may perform a multiplying calculation of the first data DA1 outputted from the first input latch 221-1 and the second data DA2 outputted from the second input latch 221-2 and may output the result of the multiplying calculation. Bit values constituting the first data DA1 may be separately inputted to the multipliers 222-11. Similarly, bit values constituting the second data DA2 may also be separately inputted to the multipliers 222-11. For example, if each of the first and second data DA1 and DA2 is comprised of an 'N'-bit binary stream and the number of the multipliers 222-11 is 'M', the first data DA1 having 'N/M' bits and the second data DA2 having 'N/M' bits may be inputted to each of the multipliers 222-11. That is, each of the multipliers 222-11 may be configured to perform a multiplying calculation of first 'N/M'-bit data and second 'N/M'-bit data. Multiplication result data outputted from each of the multipliers 222-11 may have '2N/M' bits.

The addition logic circuit 222-2 of the MAC circuit 222 may include a plurality of adders 222-21. Although not shown in the drawings, the plurality of adders 222-21 may be disposed to provide a tree structure including a plurality of stages. Each of the adders 222-21 disposed at a first stage may receive two sets of multiplication result data from two of the multipliers 222-11 included in the multiplication logic circuit 222-1 and may perform an adding calculation of the two sets of multiplication result data to output addition result data. Each of the adders 222-21 disposed at a second stage may receive two sets of addition result data from two of the adders 222-21 disposed at the first stage and may perform an adding calculation of the two sets of addition result data to output addition result data. The adders 222-21 disposed at a last stage may receive two sets of addition result data from two adders 222-21 disposed at the previous stage and may perform an adding calculation of the two sets of addition result data to output the addition result data. The adders 222-21 constituting the addition logic circuit 222-2 may include an adder for performing an accumulative adding calculation of the addition result data outputted from the adder 222-21 disposed at the last stage and previous MAC result data stored in the output latch 223-1 of the data output circuit 223.

The data output circuit 223 may output MAC result data DA_MAC outputted from the MAC circuit 222 to the GIO line 290. Specifically, the output latch 223-1 of the data output circuit 223 may latch the MAC result data DA_MAC outputted from the MAC circuit 222 and may output the latched data of the MAC result data DA_MAC in synchronization with the MAC output latch signal MAC_L3 having a logic "high" level outputted from the MAC command generator (270 of FIG. 3). The MAC result data DA_MAC outputted from the output latch 223-1 may be fed back to the MAC circuit 222 for the accumulative adding calculation. In addition, the MAC result data DA_MAC may be inputted to the transfer gate 223-2, and the transfer gate 223-2 may output the MAC result data DA_MAC to the GIO line 290. The output latch 223-1 may be initialized if a latch reset signal LATCH_RST is inputted to the output latch 223-1. In such a case, all of data latched by the output latch 223-1 may be removed. In an embodiment, the latch reset signal LATCH_RST may be activated by generation of the MAC result latch signal MAC_L_RST having a logic "high" level and may be inputted to the output latch 223-1.

The MAC result latch signal MAC_L_RST outputted from the MAC command generator 270 may be inputted to the transfer gate 223-2, the delay circuit 223-3, and the inverter 223-4. The inverter 223-4 may inversely buffer the MAC result latch signal MAC_L_RST to output the inversely buffered signal of the MAC result latch signal MAC_L_RST to the transfer gate 223-2. The transfer gate 223-2 may transfer the MAC result data DA_MAC from the output latch 223-1 to the GIO line 290 in response to the MAC result latch signal MAC_L_RST having a logic "high" level. The delay circuit 223-3 may delay the MAC result latch signal MAC_L_RST by a certain time to generate and output a latch control signal PINSTB.

FIGS. 8 to 14 are block diagrams illustrating operations of the PIM device 200 illustrated in FIG. 3. In FIGS. 8 to 14, the same reference numerals or the same reference symbols as used in FIG. 3 denote the same elements. First, referring to FIG. 8, if the external command E_CMD requesting the MAC arithmetic operation and the input address I_ADDR are transmitted from an external device to the receiving driver 230, the receiving driver 230 may output the external command E_CMD and the input address I_ADDR to the command decoder 250 and the address latch 260, respectively. The command decoder 250 may decode the external command E_CMD to generate and transmit the memory active signal ACT_M to the MAC command generator 270. The address latch 260 receiving the input address I_ADDR may generate and transmit the bank selection signal BK_S to the MAC command generator 270. The MAC command generator 270 may generate and output the MAC active signal RACTV in response to the memory active signal ACT_M and the bank selection signal BK_S. The MAC active signal RACTV may be transmitted to the first memory bank (BK0) 211 and the second memory bank (BK1) 212. The first memory bank (BK0) 211 and the second memory bank (BK1) 212 may be activated by the MAC active signal RACTV.

Figure 9:
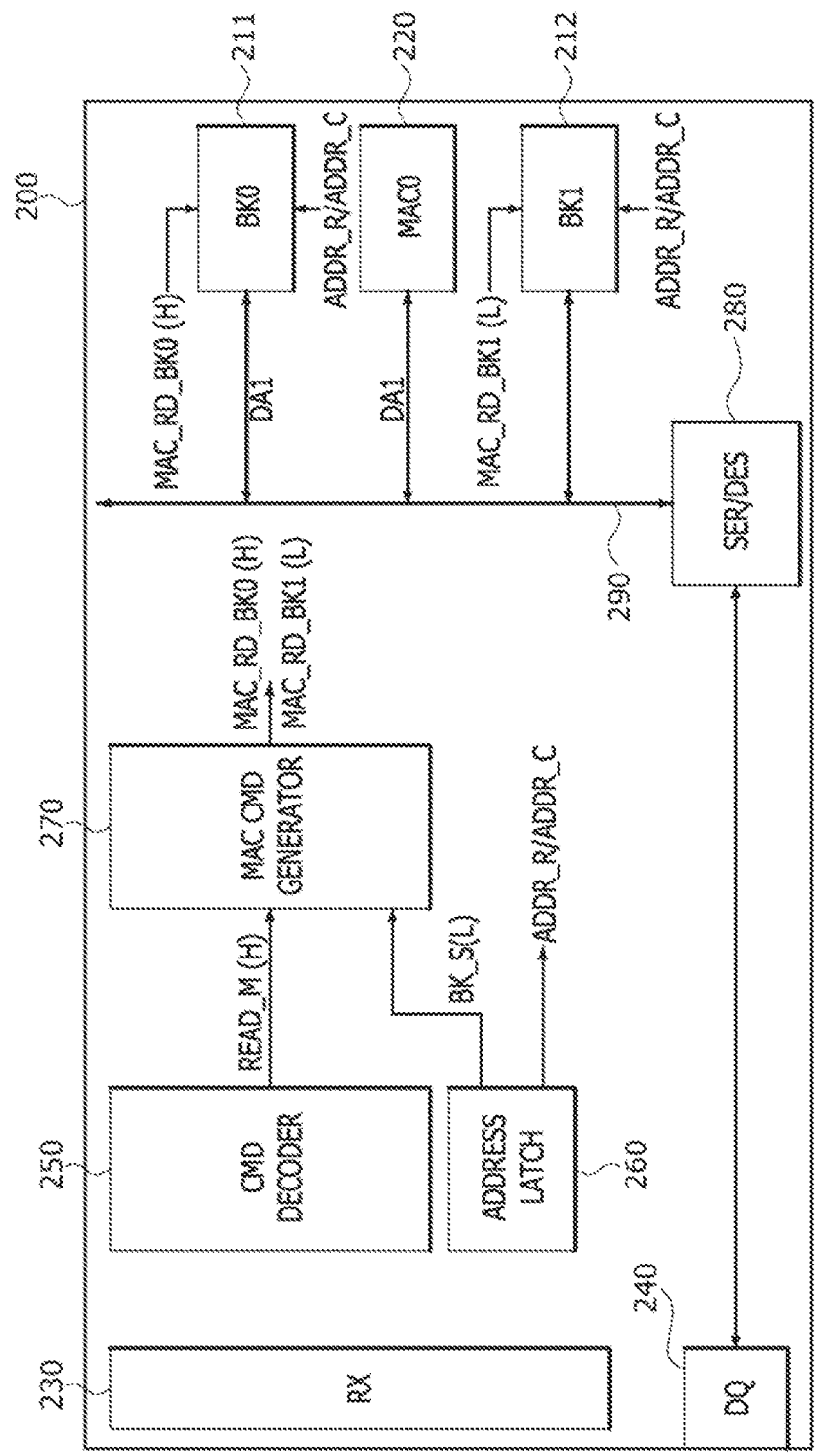

Next, referring to FIG. 9, the command decoder 250 may generate and output the memory read signal READ_M having a logic "high(H)" level to the MAC command generator 270. In addition, the address latch 260 may generate and output the bank selection signal BK_S having a logic "low(L)" level to the MAC command generator 270.

In response to the memory read signal READ_M having a logic "high(H)" level and the bank selection signal BK_S having a logic "low(L)" level, the MAC command generator 270 may generate and output the first MAC read signal MAC_RD_BK0 having a logic "high(H)" level and the second MAC read signal MAC_RD_BK1 having a logic "low(L)" level, as described with reference to FIG. 4. The first MAC read signal MAC_RD_BK0 having a logic "high (H)" level, together with the row/column address ADDR_R/ADDR_C, may be transmitted to the first memory bank (BK0) 211. The second MAC read signal MAC_RD_BK1 having a logic "low(L)" level, together with the row/column address ADDR_R/ADDR_C, may be transmitted to the second memory bank (BK1) 212. The first data DA1 may be read out of the first memory bank (BK0) 211 by the first MAC read signal MAC_RD_BK0 having a logic "high(H)" level and may be transmitted to the first MAC operator (MAC0) 220 through the GIO line 290.

Figure 10:
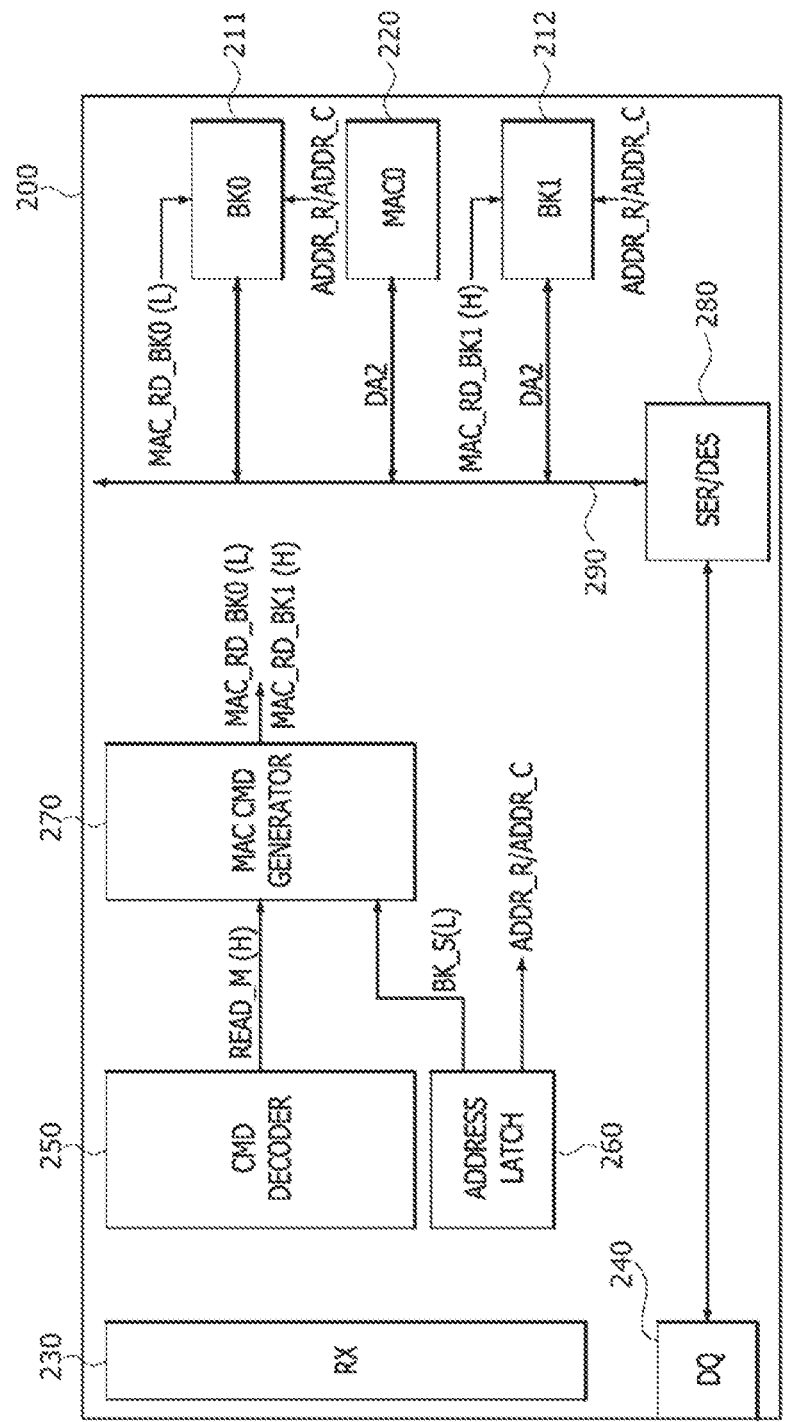

Next, referring to FIG. 10, a logic level of the bank selection signal BK_S may change from a logic "low(L)" level into a logic "high(H)" level while the memory read signal READ_M maintains a logic "high(H)" level. In such a case, as described with reference to FIG. 5, the MAC command generator 270 may generate and output the first MAC read signal MAC_RD_BK0 having a logic "low(L)" level and the second MAC read signal MAC_RD_BK1 having a logic "high(H)" level. The first MAC read signal MAC_RD_BK0 having a logic "low(L)" level, together with the row/column address ADDR_R/ADDR_C, may be transmitted to the first memory bank (BK0) 211. The second MAC read signal MAC_RD_BK1 having a logic "high(H)" level, together with the row/column address ADDR_R/ADDR_C, may be transmitted to the second memory bank (BK1) 212. The second data DA2 may be read out of the second memory bank (BK1) 212 by the second MAC read signal MAC_RD_BK1 having a logic "high(H)" level and may be transmitted to the first MAC operator (MAC0) 220 through the GIO line 290.

Figure 11:
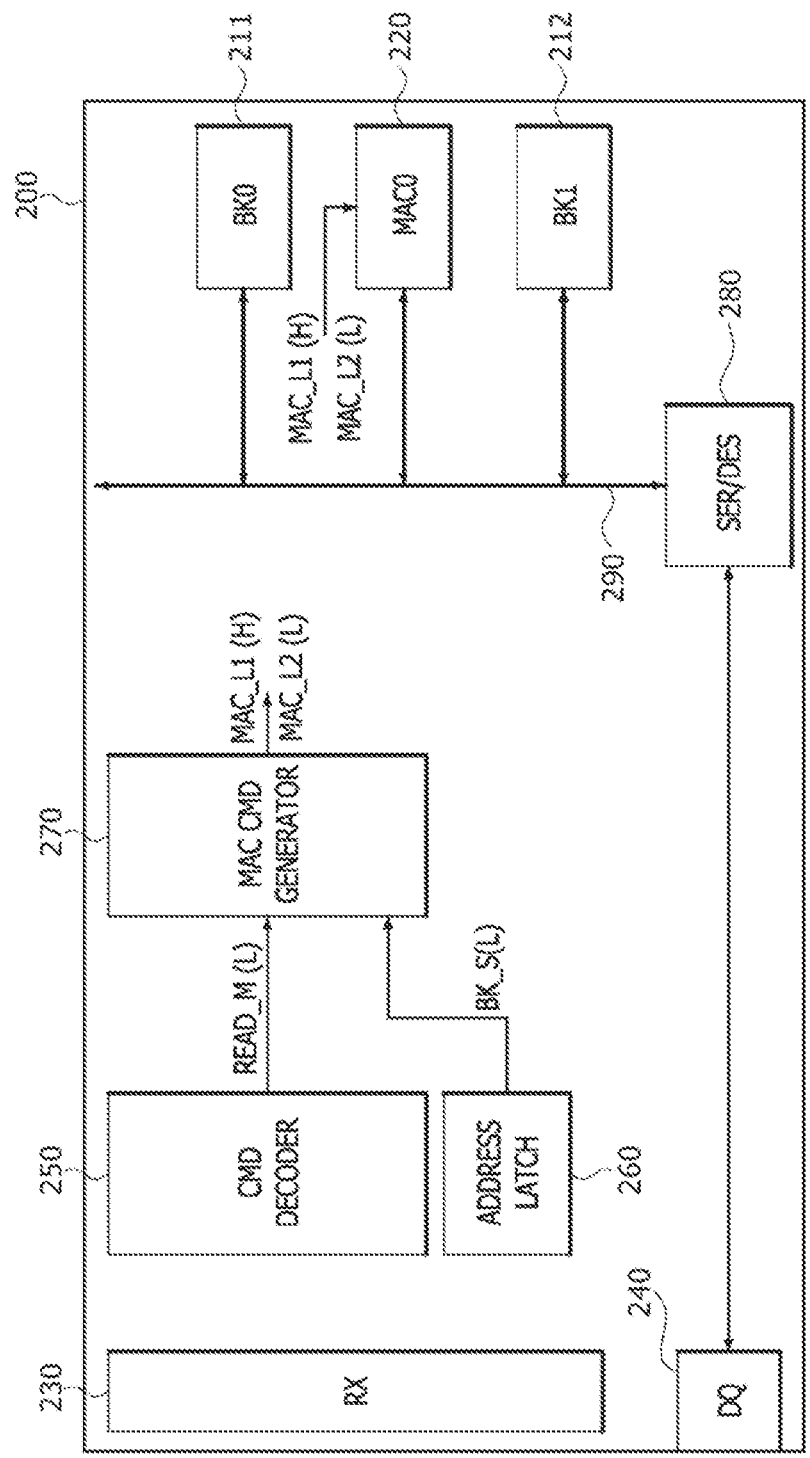
Figure 12:
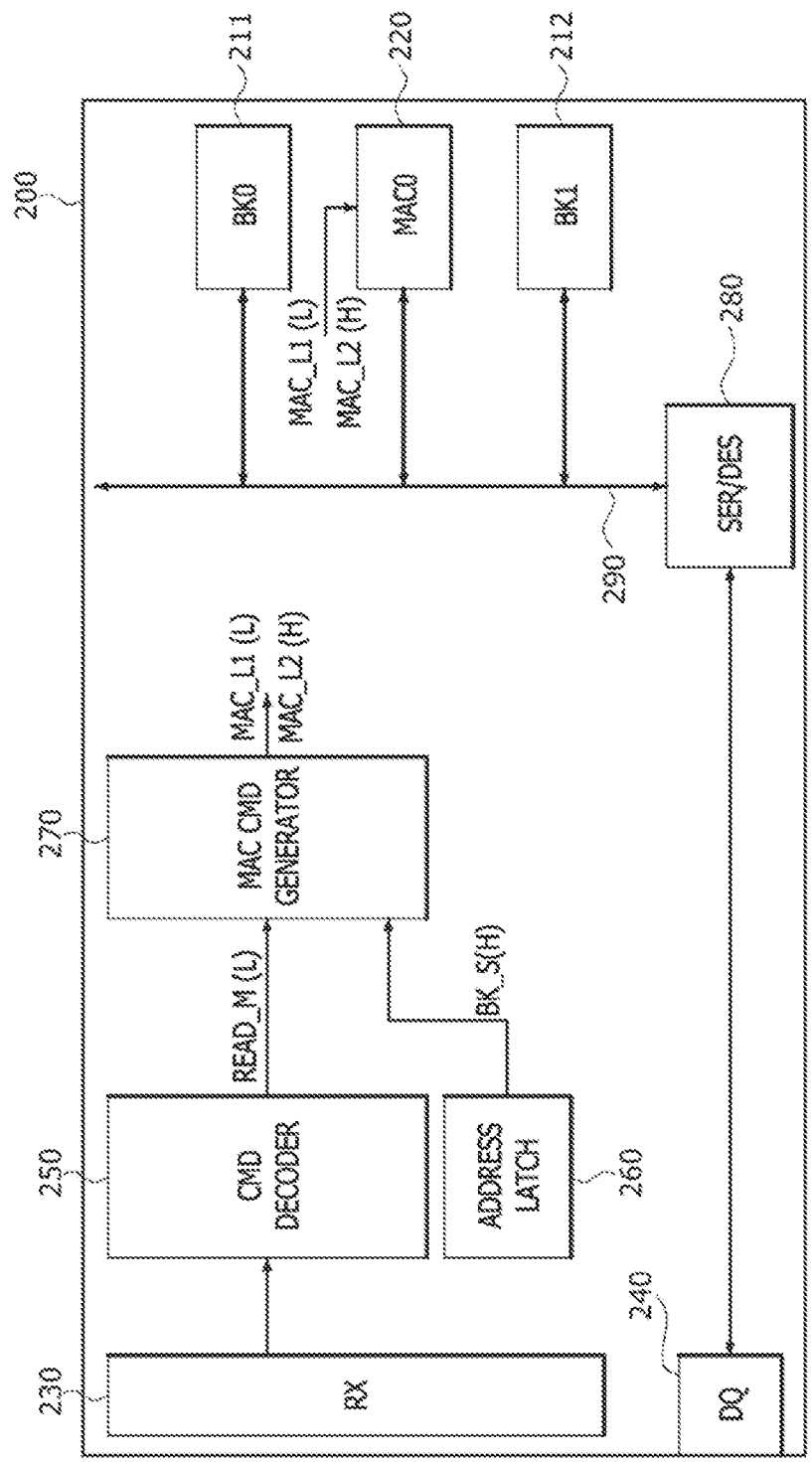

Next, referring to FIG. 11, a logic level of the memory read signal READ_M transmitted from the command decoder 250 to the MAC command generator 270 may change from a logic "high(H)" level into a logic "low(L)" level. In addition, a logic level of the bank selection signal BK_S transmitted from the address latch 260 to the MAC command generator 270 may change from a logic "high(H)" level into a logic "low(L)" level. In such a case, the MAC command generator 270 may generate and output the first MAC input latch signal MAC_L1 having a logic "high(H)" level and the second MAC input latch signal MAC_L2 having a logic "low(L)" level. A point in time when the first MAC input latch signal MAC_L1 having a logic "high(H)" level and the second MAC input latch signal MAC_L2 having a logic "low(L)" level are outputted from the MAC command generator 270 may be determined by a delay time of the delay circuit (271 of FIG. 4), as described with reference to FIG. 5. The first MAC input latch signal MAC_L1 having a logic "high(H)" level and the second MAC input latch signal MAC_L2 having a logic "low(L)" level outputted from the MAC command generator 270 may be transmitted to the first MAC operator (MAC0) 220. As described with reference to FIG. 7, the first MAC operator (MAC0) 220 may perform a latch operation of the first data DAL Next, referring to FIG. 12, a logic level of the bank selection signal BK_S transmitted from the address latch 260 to the MAC command generator 270 may change from a logic "low(L)" level into a logic "high(H)" level while the memory read signal READ_M maintains a logic "low(L)" level. In such a case, the MAC command generator 270 may generate and output the first MAC input latch signal MAC_L1 having a logic "low(L)" level and the second MAC input latch signal MAC_L2 having a logic "high(H)" level. A point in time when the first MAC input latch signal MAC_L1 having a logic "low(L)" level and the second MAC input latch signal MAC_L2 having a logic "high(H)" level are outputted from the MAC command generator 270 may be determined by a delay time of the delay circuit (271 of FIG. 5), as described with reference to FIG. 5. The first MAC input latch signal MAC_L1 having a logic "low(L)" level and the second MAC input latch signal MAC_L2 having a logic "high(H)" level outputted from the MAC command generator 270 may be transmitted to the first MAC operator (MAC0) 220. As described with reference to FIG. 7, the first MAC operator (MAC0) 220 may perform a latch operation of the second data DA2. After the latch operations of the first and second data DA1 and DA2 terminate, the first MAC operator (MAC0) 220 may perform the MAC arithmetic operation and may generate the MAC result data DA_MAC. The MAC result data DA_MAC generated by the first MAC operator (MAC0) 220 may be inputted to the output latch 223-1 included in the first MAC operator (MAC0) 220.

Figure 13:
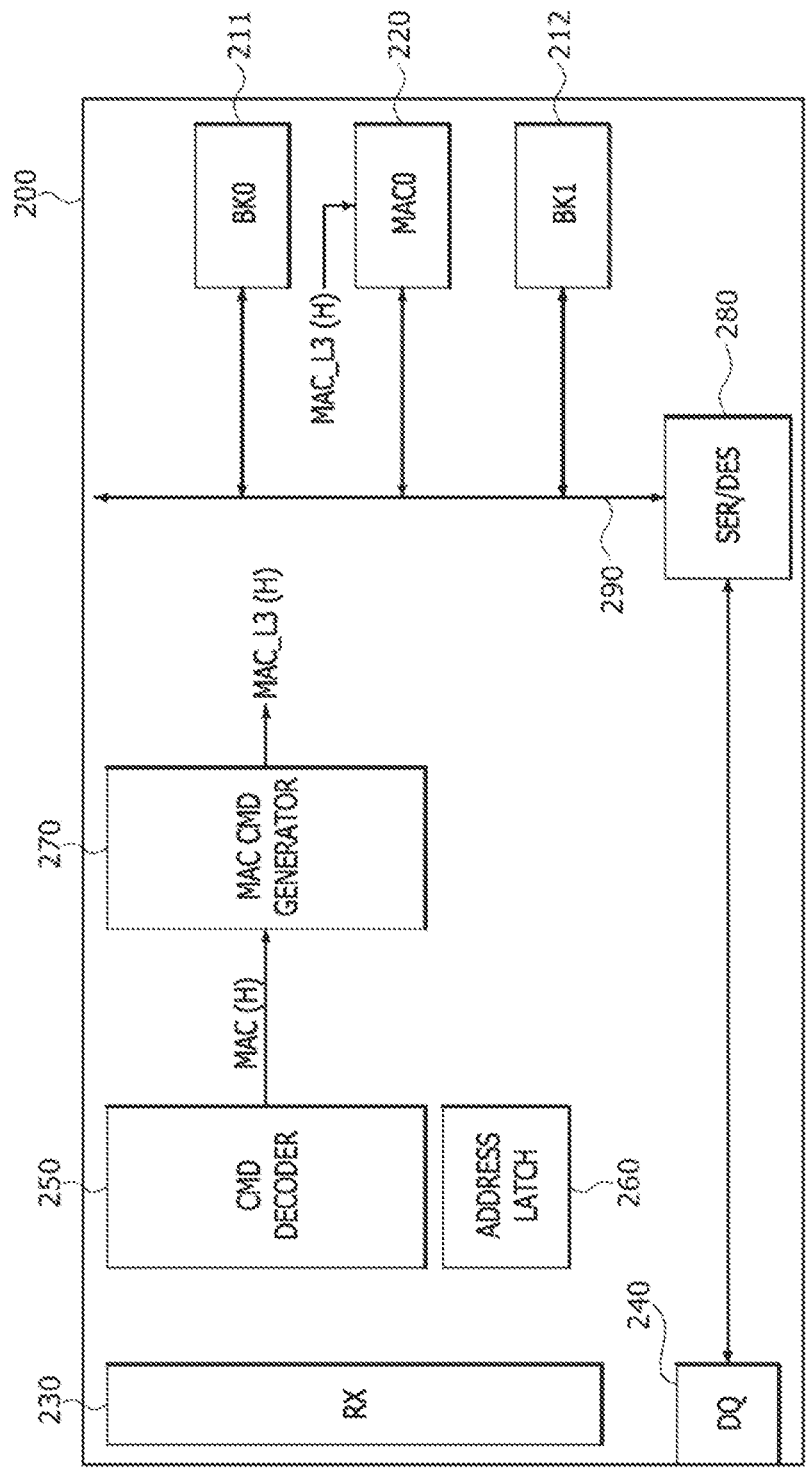

Next, referring to FIG. 13, the command decoder 250 may output and transmit the MAC arithmetic signal MAC having a logic "high(H)" level to the MAC command generator 270. The MAC command generator 270 may generate and output the MAC output latch signal MAC_L3 having a logic "high" level in response to the MAC arithmetic signal MAC having a logic "high(H)" level. The MAC output latch signal MAC_L3 having a logic "high" level may be transmitted to the first MAC operator (MAC0) 220. As described with reference to FIG. 7, the output latch (223-1 of FIG. 7) of the first MAC operator (MAC0) 220 may be synchronized with the MAC output latch signal MAC_L3 having a logic "high" level to transfer the MAC result data DA_MAC outputted from the MAC circuit 222 of the first MAC operator (MAC0) 220 to the transfer gate (233-2 of FIG. 7) of the first MAC operator (MAC0) 220. The MAC result data DA_MAC outputted from the output latch (223-1 of FIG. 7) may be fed back to the addition logic circuit (222-2 of FIG. 7) for the accumulative adding calculation.

Figure 14:
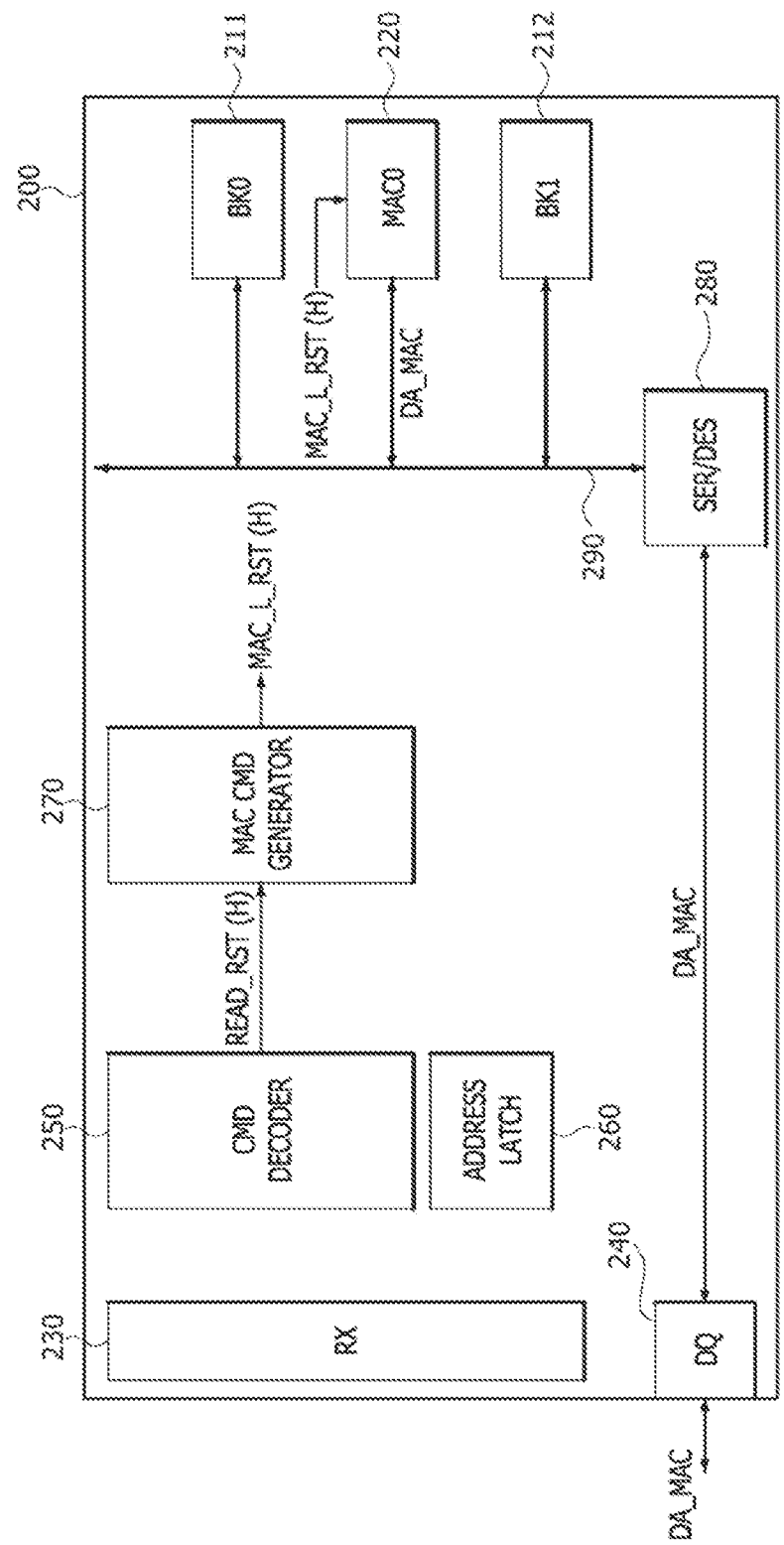

Next, referring to FIG. 14, the command decoder 250 may output and transmit the result read signal READ_RST having a logic "high(H)" level to the MAC command generator 270. The MAC command generator 270 may generate and output the MAC result latch signal MAC_L_RST having a logic "high" level in response to the result read signal READ_RST having a logic "high(H)" level. The MAC result latch signal MAC_L_RST having a logic "high" level may be transmitted to the first MAC operator (MAC0) 220. As described with reference to FIG. 7, the first MAC operator (MAC0) 220 may output the MAC result data DA_MAC to the GIO line 290 in response to the MAC result latch signal MAC_L_RST having a logic "high" level and may also reset the output latch (223-1 of FIG. 6) included in the first MAC operator (MAC0) 220 in response to the MAC result latch signal MAC_L_RST having a logic "high" level. The MAC result data DA_MAC transmitted to the GIO line 290 may be outputted to an external device through the serializer/deserializer 280 and the data I/O circuit 240.

Figure 15:
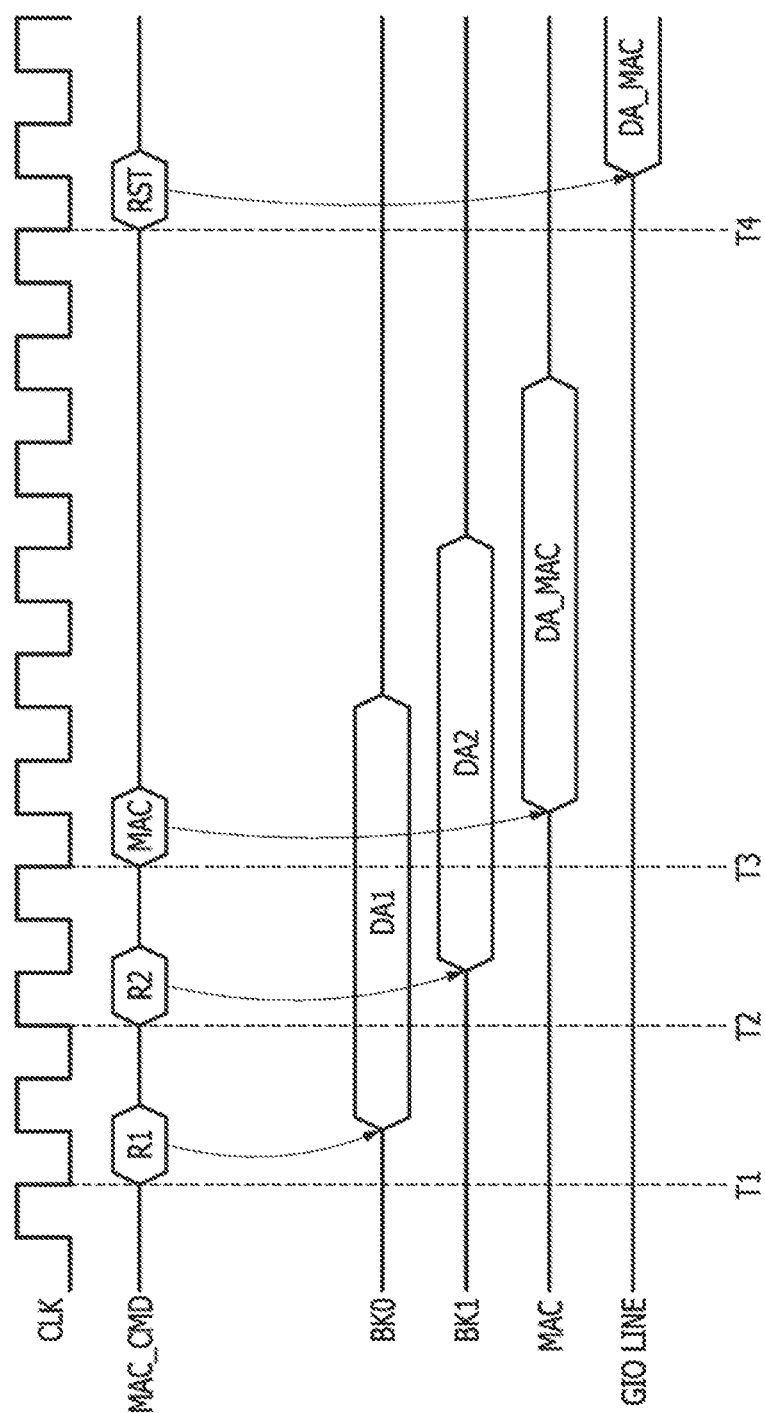
FIG. 15 is a timing diagram illustrating an operation of the PIM device illustrated in FIG. 3.

FIG. 15 is a timing diagram illustrating an operation of the PIM device 200 illustrate in FIG. 3. Referring to FIG. 15, at a first point in time "T1", the MAC command generator 270 may be synchronized with a falling edge of a clock signal CLK to generate and output the first MAC read signal MAC_RD_BK0 (R1) having a logic "high(H)" level. The first memory bank (BK0) 211 may be selected by the first MAC read signal MAC_RD_BK0 (R1) having a logic "high(H)" level so that the first data DA1 are read out of the first memory bank (BK0) 211. At a second point in time "T2", the MAC command generator 270 may be synchronized with a falling edge of the clock signal CLK to generate and output the second MAC read signal MAC_RD_BK1 (R2) having a logic "high(H)" level. The second memory bank (BK1) 212 may be selected by the second MAC read signal MAC_RD_BK1 (R2) having a logic "high(H)" level so that the second data DA2 are read out of the second memory bank (BK1) 212. At a third point in time "T3", the MAC command generator 270 may be synchronized with a falling edge of the clock signal CLK to generate and output the MAC arithmetic signal MAC having a logic "high(H)" level. The first MAC operator (MAC0) 220 may perform the multiplying calculations and the adding calculations of the first and second data DA1 and DA2 to generate the MAC result data DA_MAC, in response to the MAC arithmetic signal MAC having a logic "high(H)" level. At a fourth point in time "T4", the MAC command generator 270 may be synchronized with a falling edge of the clock signal CLK to generate and output the MAC result latch signal MAC_L_RST (RST) having a logic "high" level. The MAC result data DA_MAC generated by the first MAC operator (MAC0) 220 may be transmitted to the GIO line 290 by the MAC result latch signal MAC_L_RST (RST) having a logic "high" level.

Figure 16:
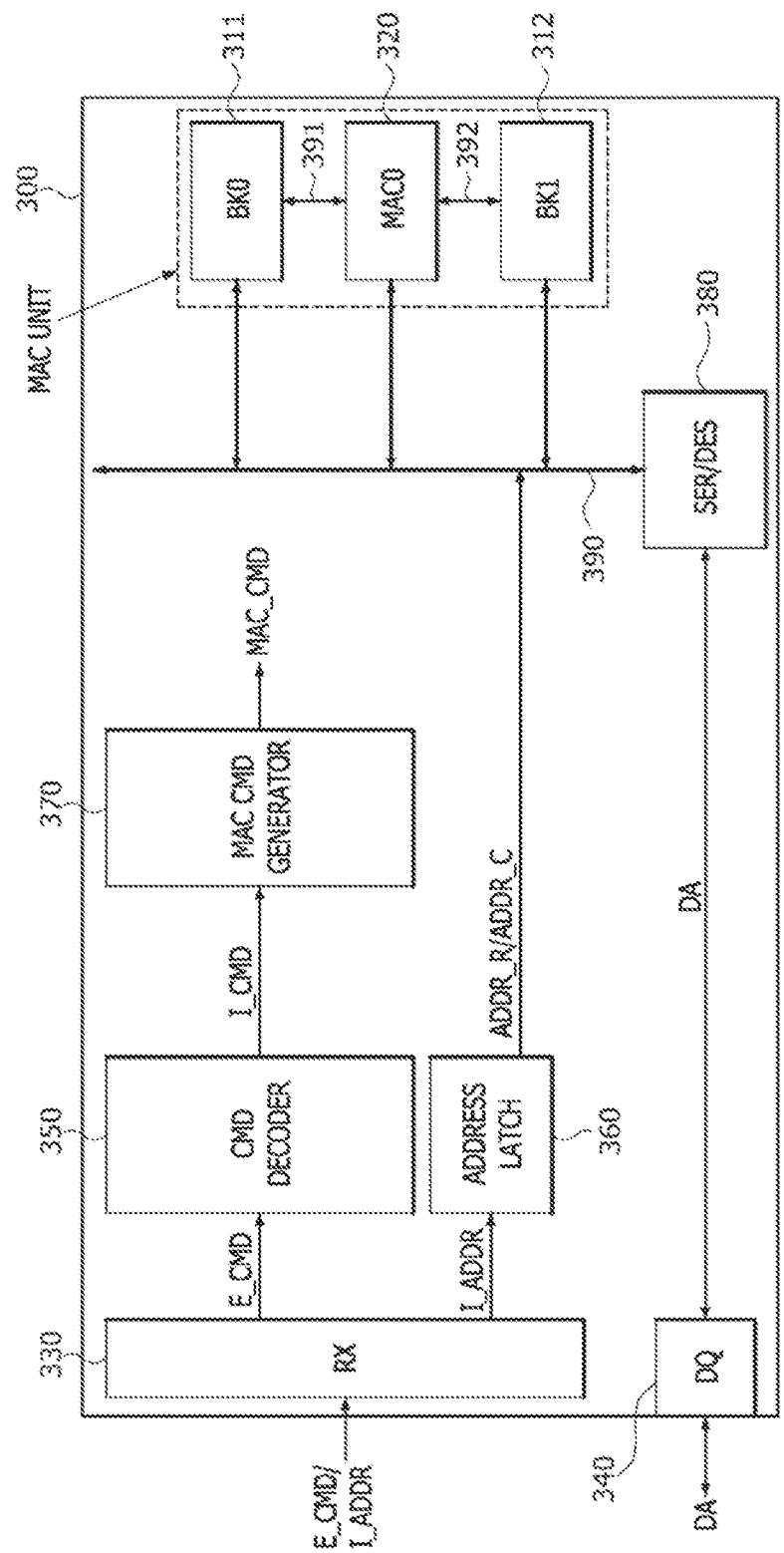
FIG. 16 is a block diagram illustrating another configuration of a PIM device according to the first embodiment of the present disclosure.
Figure 17:
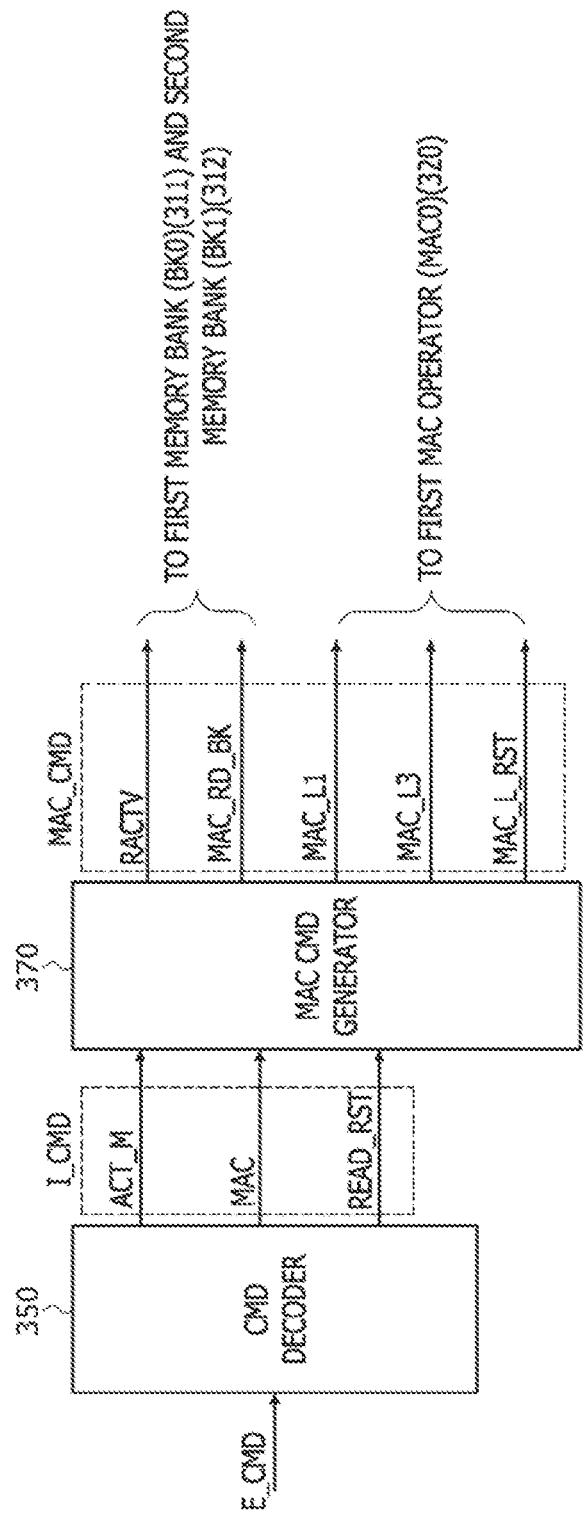
FIG. 17 illustrates internal command signals outputted from a command decoder and MAC command signals outputted from a MAC command generator in the PIM device of FIG. 16.

FIG. 16 is a block diagram illustrating another configuration of a PIM device 300 according to an embodiment of the present disclosure, and FIG. 17 illustrates an internal command signal I_CMD outputted from a command decoder 350 of the PIM device 300 and a MAC command signal MAC_CMD outputted from a MAC command generator 370 of the PIM device 300. FIG. 16 illustrates only a first memory bank (BK0) 311, a second memory bank (BK1) 312, and a first MAC operator (MAC0) 320 constituting a first MAC unit among the plurality of MAC units. However, FIG. 16 illustrates merely an example for simplification of the drawing. Accordingly, the following description for the first MAC unit may be equally applicable to the remaining MAC units.

Referring to FIG. 16, the PIM device 300 may be configured to include the first memory bank (BK0) 311, the second memory bank (BK1) 312, and the first MAC operator (MAC0) 320. The PIM device 300 according to the present embodiment may include a GIO line 390, a first bank input/output (BIO) line 391, and a second BIO line 392 acting as data transmission lines. Data communication of the first memory bank (BK0) 311, the second memory bank (BK1) 312, and the first MAC operator (MAC0) 320 may be achieved through the GIO line 390. Only the data transmission between the first memory bank (BK0) 311 and the first MAC operator (MAC0) 320 may be achieved through the first BIO line 391, and only the data transmission between the second memory bank (BK1) 312 and the first MAC operator (MAC0) 320 may be achieved through the second BIO line 392. Thus, the first MAC operator (MAC0) 320 may directly receive first data and second data from the first and second memory banks (BK0 and BK1) 311 and 312 through the first BIO line 391 and the second BIO line 392 without using the GIO line 390.

The PIM device 300 may further include a receiving driver (RX) 330, a data I/O circuit (DQ) 340, the command decoder 350, an address latch 360, the MAC command generator 370, and a serializer/deserializer (SER/DES) 380. The command decoder 350, the address latch 360, the MAC command generator 370, and the serializer/deserializer 380 may be disposed in the peripheral circuit PERI of the PIM device 100 illustrated in FIG. 2. The receiving driver 330 may receive an external command E_CMD and an input address I_ADDR from an external device. The external device may denote a host or a controller coupled to the PIM device 300. Hereinafter, it may be assumed that the external command E_CMD transmitted to the PIM device 300 is a command requesting the MAC arithmetic operation. That is, the PIM device 300 may perform the deterministic MAC arithmetic operation in response to the external command E_CMD. The data I/O circuit 340 may include a data I/O pad. The data I/O pad may be coupled with an data I/O line. The PIM device 300 communicates with the external device through the data I/O circuit 340.

The receiving driver 330 may separately output the external command E_CMD and the input address I_ADDR received from the external device. Data DA inputted to the PIM device 300 through the data I/O circuit 340 may be processed by the serializer/deserializer 380 and may be transmitted to the first memory bank (BK0) 311 and the second memory bank (BK1) 312 through the GIO line 390 of the PIM device 300. The data DA outputted from the first memory bank (BK0) 311, the second memory bank (BK1) 312, and the first MAC operator (MAC0) 320 through the GIO line 390 may be processed by the serializer/deserializer 380 and may be outputted to the external device through the data I/O circuit 340. The serializer/deserializer 380 may convert the data DA into parallel data if the data DA are serial data or may convert the data DA into serial data if the data DA are parallel data. For the data conversion, the serializer/deserializer 380 may include a serializer for converting parallel data into serial data and a deserializer for converting serial data into parallel data.

The command decoder 350 may decode the external command E_CMD outputted from the receiving driver 330 to generate and output the internal command signal I_CMD. As illustrated in FIG. 17, the internal command signal I_CMD outputted from the command decoder 350 may include first to third internal command signals. In an embodiment, the first internal command signal may be a memory active signal ACT_M, the second internal command signal may be a MAC arithmetic signal MAC, and the third internal command signal may be a result read signal READ_RST. The first to third internal command signals outputted from the command decoder 350 may be sequentially inputted to the MAC command generator 370.

In order to perform the deterministic MAC arithmetic operation of the PIM device 300, the memory active signal ACT_M, the MAC arithmetic signal MAC, and the result read signal READ_RST outputted from the command decoder 350 may be sequentially generated at predetermined points in time (or clocks). In an embodiment, the memory active signal ACT_M, the MAC arithmetic signal MAC, and the result read signal READ_RST may have predetermined latencies, respectively. For example, the MAC arithmetic signal MAC may be generated after a first latency elapses from a point in time when the memory active signal ACT_M is generated, and the result read signal READ_RST may be generated after a third latency elapses from a point in time when the MAC arithmetic signal MAC is generated. No signal is generated by the command decoder 350 until a fourth latency elapses from a point in time when the result read signal READ_RST is generated. The first to fourth latencies may be predetermined and fixed. Thus, the host or the controller outputting the external command E_CMD may predict the points in time when the first to third internal command signals constituting the internal command signal I_CMD are generated by the command decoder 350 in advance at a point in time when the external command E_CMD is outputted from the host or the controller. That is, the host or the controller may predict a point in time (or a clock) when the MAC arithmetic operation terminates in the PIM device 300 after the external command E_CMD requesting the MAC arithmetic operation is transmitted from the host or the controller to the PIM device 300, even without receiving any signals from the PIM device 300.

The address latch 360 may convert the input address I_ADDR outputted from the receiving driver 330 into a row/column address ADDR_R/ADDR_C to output the row/column address ADDR_R/ADDR_C. The row/column address ADDR_R/ADDR_C outputted from the address latch 360 may be transmitted to the first and second memory banks 311 and 312. According to the present embodiment, the first data and the second data to be used for the MAC arithmetic operation may be simultaneously read out of the first and second memory banks (BK0 and BK1) 311 and 312, respectively. Thus, it may be unnecessary to generate a bank selection signal for selecting any one of the first and second memory banks 311 and 312. In an embodiment, a point in time when the row/column address ADDR_R/ADDR_C is inputted to the first and second memory banks 311 and 312 may be a point in time when a MAC command (i.e., the MAC arithmetic signal MAC) requesting a data read operation for the first and second memory banks 311 and 312 for the MAC arithmetic operation is generated.

The MAC command generator 370 may output the MAC command signal MAC_CMD in response to the internal command signal I_CMD outputted from the command decoder 350. As illustrated in FIG. 16, the MAC command signal MAC_CMD outputted from the MAC command generator 370 may include first to fifth MAC command signals. In an embodiment, the first MAC command signal may be a MAC active signal RACTV, the second MAC command signal may be a MAC read signal MAC_RD_BK, the third MAC command signal may be a MAC input latch signal MAC_L1, the fourth MAC command signal may be a MAC output latch signal MAC_L3, and the fifth MAC command signal may be a MAC result latch signal MAC_L_RST.

The MAC active signal RACTV may be generated based on the memory active signal ACT_M outputted from the command decoder 350. The MAC read signal MAC_RD_BK, the MAC input latch signal MAC_L1, the MAC output latch signal MAC_L3, and the MAC result latch signal MAC_L_RST may be sequentially generated based on the MAC arithmetic signal MAC outputted from the command decoder 350. That is, the MAC input latch signal MAC_L1 may be generated at a point in time when a certain time elapses from a point in time when the MAC read signal MAC_RD_BK is generated. The MAC output latch signal MAC_L3 may be generated at a point in time when a certain time elapses from a point in time when the MAC input latch signal MAC_L1 is generated. Finally, the MAC result latch signal MAC_L_RST may be generated based on the result read signal READ_RST outputted from the command decoder 350.

The MAC active signal RACTV outputted from the MAC command generator 370 may control an activation operation for the first and second memory banks 311 and 312. The MAC read signal MAC_RD_BK outputted from the MAC command generator 370 may control a data read operation for the first and second memory banks 311 and 312. The MAC input latch signal MAC_L1 outputted from the MAC command generator 370 may control an input data latch operation of the first MAC operator (MAC0) 320. The MAC output latch signal MAC_L3 outputted from the MAC command generator 370 may control an output data latch operation of the first MAC operator (MAC0) 320. The MAC result latch signal MAC_L_RST outputted from the MAC command generator 370 may control an output operation of MAC result data of the first MAC operator (MAC0) 320 and a reset operation of the first MAC operator (MAC0) 320.

As described above, in order to perform the deterministic MAC arithmetic operation of the PIM device 300, the memory active signal ACT_M, the MAC arithmetic signal MAC, and the result read signal READ_RST outputted from the command decoder 350 may be sequentially generated at predetermined points in time (or clocks), respectively. Thus, the MAC active signal RACTV, the MAC read signal MAC_RD_BK, the MAC input latch signal MAC_L1, the MAC output latch signal MAC_L3, and the MAC result latch signal MAC_L_RST may also be generated and outputted from the MAC command generator 370 at predetermined points in time after the external command E_CMD is inputted to the PIM device 300, respectively. That is, a time period from a point in time when the first and second memory banks 311 and 312 are activated by the MAC active signal RACTV until a point in time when the first MAC operator (MAC0) 320 is reset by the MAC result latch signal MAC_L_RST may be predetermined.

Figure 18:
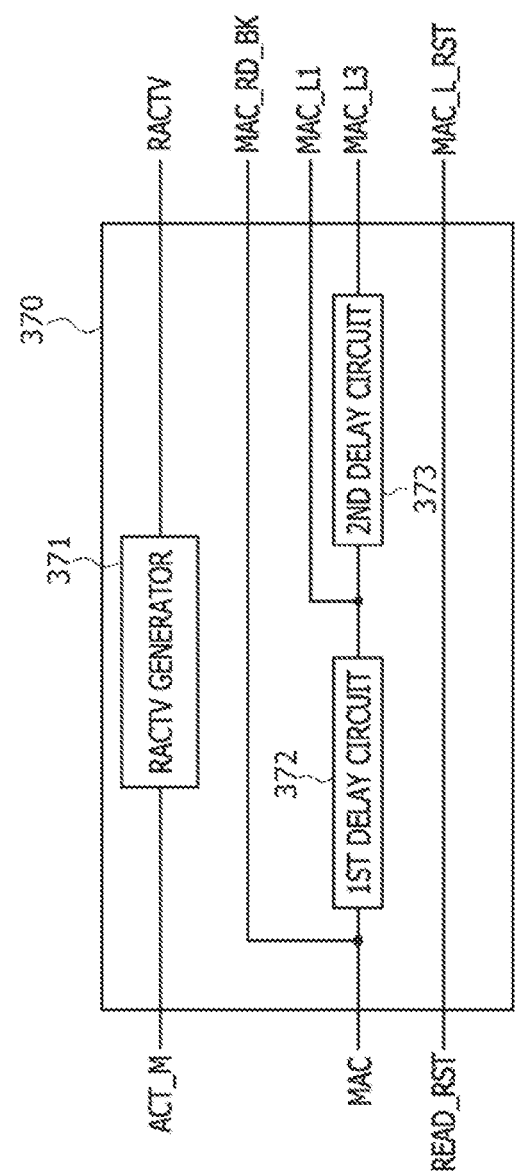
FIG. 18 illustrates an example of a configuration of a MAC command generator included in the PIM device of FIG. 16.

FIG. 18 illustrates an example of a configuration of the MAC command generator 370 included in the PIM device 300 illustrated in FIG. 16. Referring to FIG. 18, the MAC command generator 370 may sequentially receive the memory active signal ACT_M, the MAC arithmetic signal MAC, and the result read signal READ_RST from the command decoder 350. In addition, the MAC command generator 370 may sequentially generate and output the MAC active signal RACTV, the MAC read signal MAC_RD_BK, the MAC input latch signal MAC_L1, the MAC output latch signal MAC_L3, and the MAC result latch signal MAC_L_RST. The MAC active signal RACTV, the MAC read signal MAC_RD_BK, the MAC input latch signal MAC_L1, the MAC output latch signal MAC_L3, and the MAC result latch signal MAC_L_RST may be outputted in series with certain time intervals.

In an embodiment, the MAC command generator 370 may be configured to include an active signal generator 371, a first delay circuit 372, and a second delay circuit 373. The active signal generator 371 may receive the memory active signal ACT_M to generate and output the MAC active signal RACTV. The MAC active signal RACTV outputted from the active signal generator 371 may be transmitted to the first and second memory banks 311 and 312 to activate the first and second memory banks 311 and 312. The MAC command generator 370 may receive the MAC arithmetic signal MAC outputted from the command decoder 350 to output the MAC arithmetic signal MAC as the MAC read signal MAC_RD_BK. The first delay circuit 372 may receive the MAC arithmetic signal MAC and may delay the MAC arithmetic signal MAC by a first delay time DELAY_T1 to generate and output the MAC input latch signal MAC_L1. The second delay circuit 373 may receive an output signal of the first delay circuit 372 and may delay the output signal of the first delay circuit 372 by a second delay time DELAY_T2 to generate and output the MAC output latch signal MAC_L3. The MAC command generator 370 may generate the MAC result latch signal MAC_L_RST in response to the result read signal READ_RST outputted from the command decoder 350.

The MAC command generator 370 may generate and output the MAC active signal RACTV in response to the memory active signal ACT_M outputted from the command decoder 350. Subsequently, the MAC command generator 370 may generate and output the MAC read signal MAC_RD_BK in response to the MAC arithmetic signal MAC outputted from the command decoder 350. The MAC arithmetic signal MAC may be inputted to the first delay circuit 372. The MAC command generator 370 may delay the MAC arithmetic signal MAC by a certain time determined by the first delay circuit 372 to generate and output an output signal of the first delay circuit 372 as the MAC input latch signal MAC_L1. The output signal of the first delay circuit 372 may be inputted to the second delay circuit 373. The MAC command generator 370 may delay the MAC input latch signal MAC_L1 by a certain time determined by the second delay circuit 373 to generate and output an output signal of the second delay circuit 373 as the MAC output latch signal MAC_L3. Subsequently, the MAC command generator 370 may generate and output the MAC result latch signal MAC_L_RST in response to the result read signal READ_RST outputted from the command decoder 350.

Figure 19:
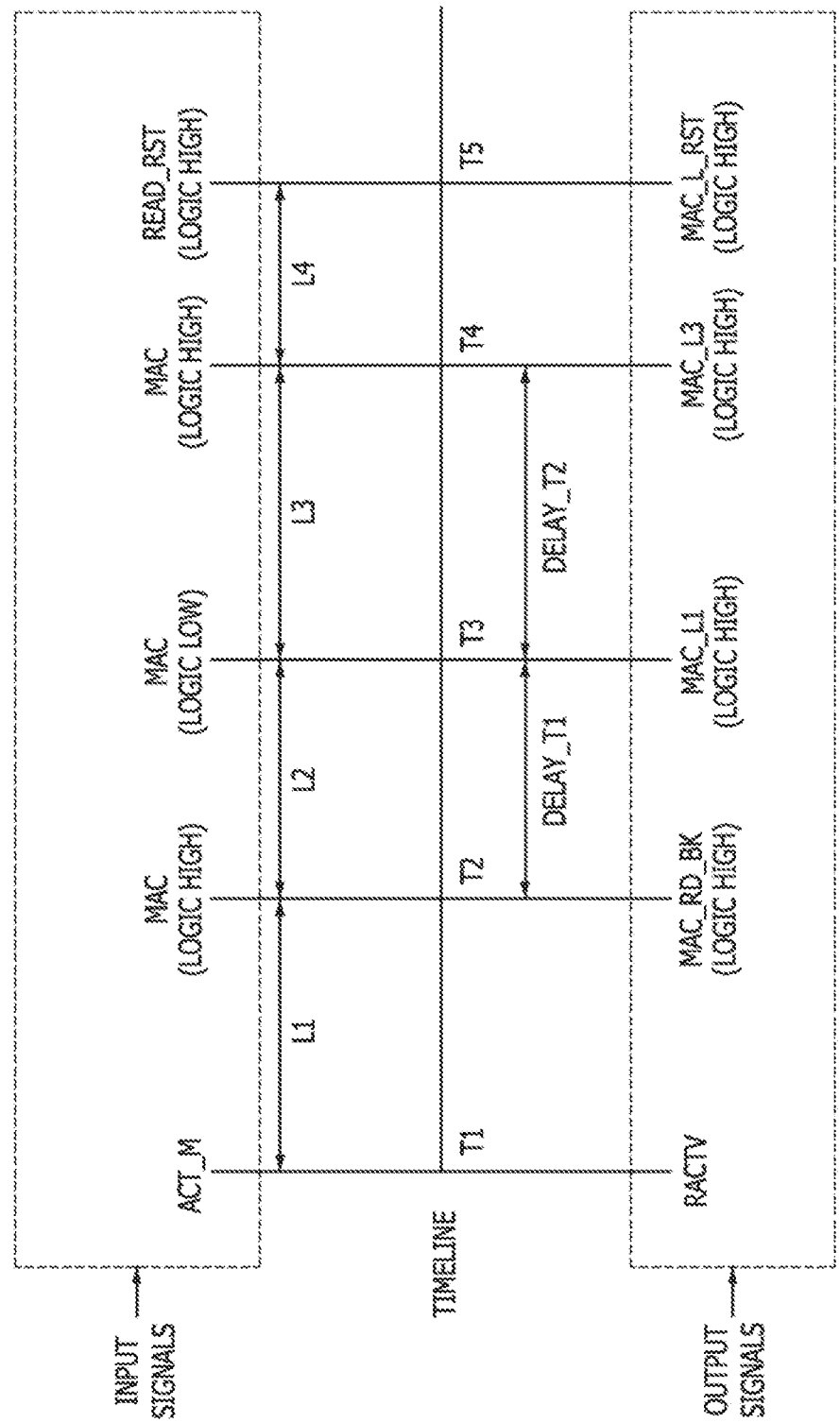
FIG. 19 illustrates input signals and output signals of the MAC command generator illustrated in FIG. 18 with a timeline.

FIG. 19 illustrates input signals and output signals of the MAC command generator 370 illustrated in FIG. 18 with a timeline. In FIG. 19, signals transmitted from the command decoder 350 to the MAC command generator 370 are illustrated in an upper dotted line box, and signals outputted from the MAC command generator 370 are illustrated in a lower dotted line box. Referring to FIGS. 18 and 19, at a first point in time "T1" of the timeline, the memory active signal ACT_M may be inputted to the MAC command generator 370 and the MAC command generator 370 may output the MAC active signal RACTV. At a second point in time "T2" when a certain time, for example, a first latency L1 elapses from the first point in time "T1", the MAC arithmetic signal MAC having a logic "high" level may be inputted to the MAC command generator 370. In response to the MAC arithmetic signal MAC having a logic "high" level, the MAC command generator 370 may output the MAC read signal MAC_RD_BK having a logic "high" level. At a third point in time "T3" when a certain time elapses from the second point in time "T2", a logic level of the MAC arithmetic signal MAC may change from a logic "high" level into a logic "low" level.

At the third point in time "T3" when the first delay time DELAY_T1 elapses from the second point in time "T2", the MAC command generator 370 may output the MAC input latch signal MAC_L1 having a logic "high" level. The first delay time DELAY_T1 may correspond to a delay time determined by the first delay circuit 372 illustrated in FIG. 18. The first delay time DELAY_T1 may be set to be different according to a logic design scheme of the first delay circuit 372. In an embodiment, the first delay time DELAY_T1 may be set to be equal to or greater than a second latency L2. At a fourth point in time "T4" when a certain time elapses from the third point in time "T3", the MAC command generator 370 may output the MAC output latch signal MAC_L3 having a logic "high" level. The fourth point in time "T4" may be a moment when the second delay time DELAY_T2 elapses from the third point in time "T3". The second delay time DELAY_T2 may correspond to a delay time determined by the second delay circuit 373 illustrated in FIG. 18. The second delay time DELAY_T2 may be set to be different according to a logic design scheme of the second delay circuit 373. In an embodiment, the second delay time DELAY_T2 may be set to be equal to or greater than a third latency L3. At a fifth point in time "T5" when a certain time, for example, a fourth L4 elapses from the fourth point in time "T4", the result read signal READ_RST having a logic "high" level may be inputted to the MAC command generator 370. In response to the result read signal READ_RST having a logic "high" level, the MAC command generator 370 may output the MAC result latch signal MAC_L_RST having a logic "high" level, as described with reference to FIG. 18.

In order to perform the deterministic MAC arithmetic operation, moments when the internal command signals ACT_M, MAC, and READ_RST generated by the command decoder 350 are inputted to the MAC command generator 370 may be fixed and moments when the MAC command signals RACTV, MAC_RD_BK, MAC_L1, MAC_L3, and MAC_L_RST are outputted from the MAC command generator 370 in response to the internal command signals ACT_M, MAC, and READ_RST may also be fixed. Thus, all of the first latency L1 between the first point in time "T1" and the second point in time "T2", the second latency L2 between the second point in time "T2" and the third point in time "T3", the third latency L3 between the third point in time "T3" and the fourth point in time "T4", and the fourth latency L4 between the fourth point in time "T4" and the fifth point in time "T5" may have fixed values.

In an embodiment, the first latency L1 may be defined as a time it takes to activate both of the first and second memory banks based on the MAC active signal RACTV. The second latency L2 may be defined as a time it takes to read the first and second data out of the first and second memory banks (BK0 and BK1) 311 and 312 based on the MAC read signals MAC_RD_BK and to input the first and second data DA1 and DA2 into the first MAC operator (MAC0) 320. The third latency L3 may be defined as a time it takes to latch the first and second data DA1 and DA2 in the first MAC operator (MAC0) 320 based on the MAC input latch signals MAC_L1 and it takes the first MAC operator (MAC0) 320 to perform the MAC arithmetic operation of the first and second data. The fourth latency L4 may be defined as a time it takes to latch the output data in the first MAC operator (MAC0) 320 based on the MAC output latch signal MAC_L3.

Figure 20:
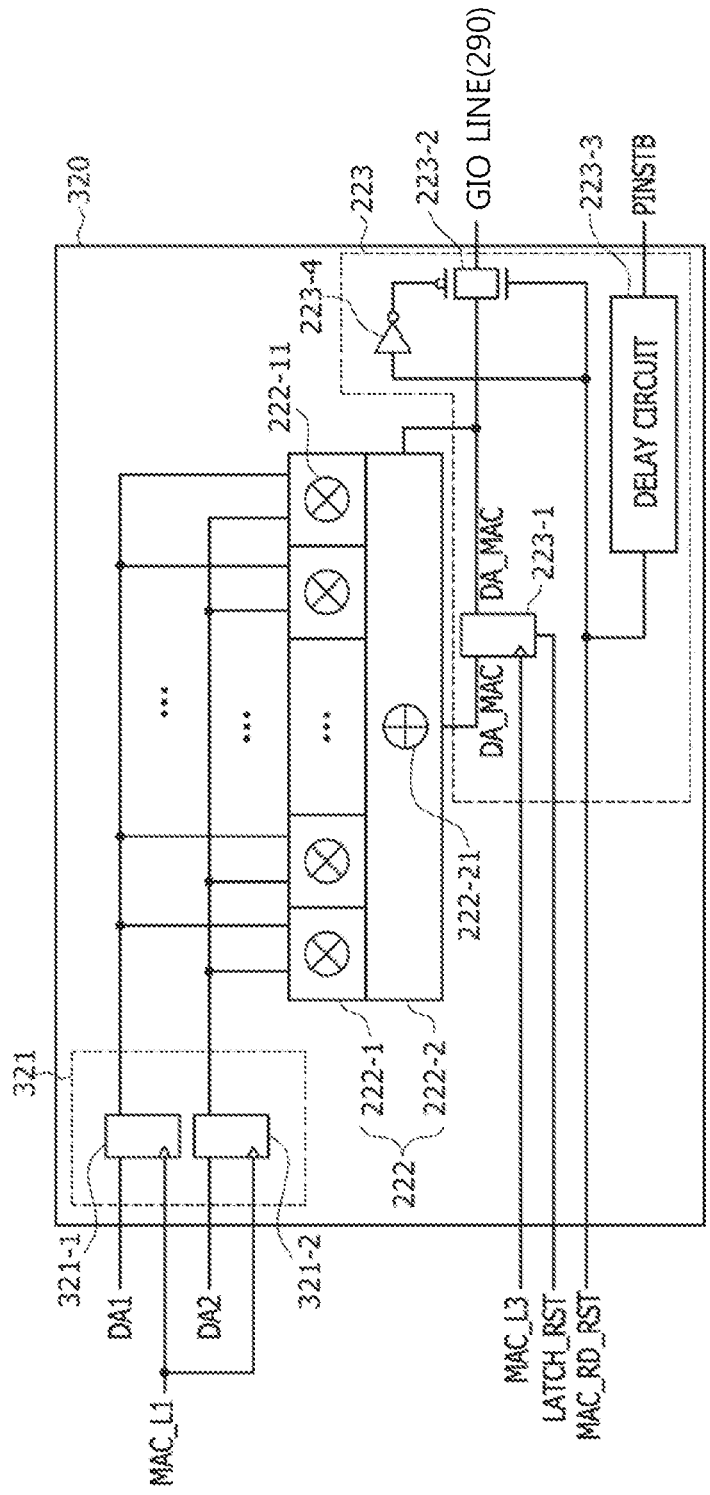
FIG. 20 illustrates an example of a configuration of a MAC operator included in the PIM device of FIG. 16.
Figure 21:
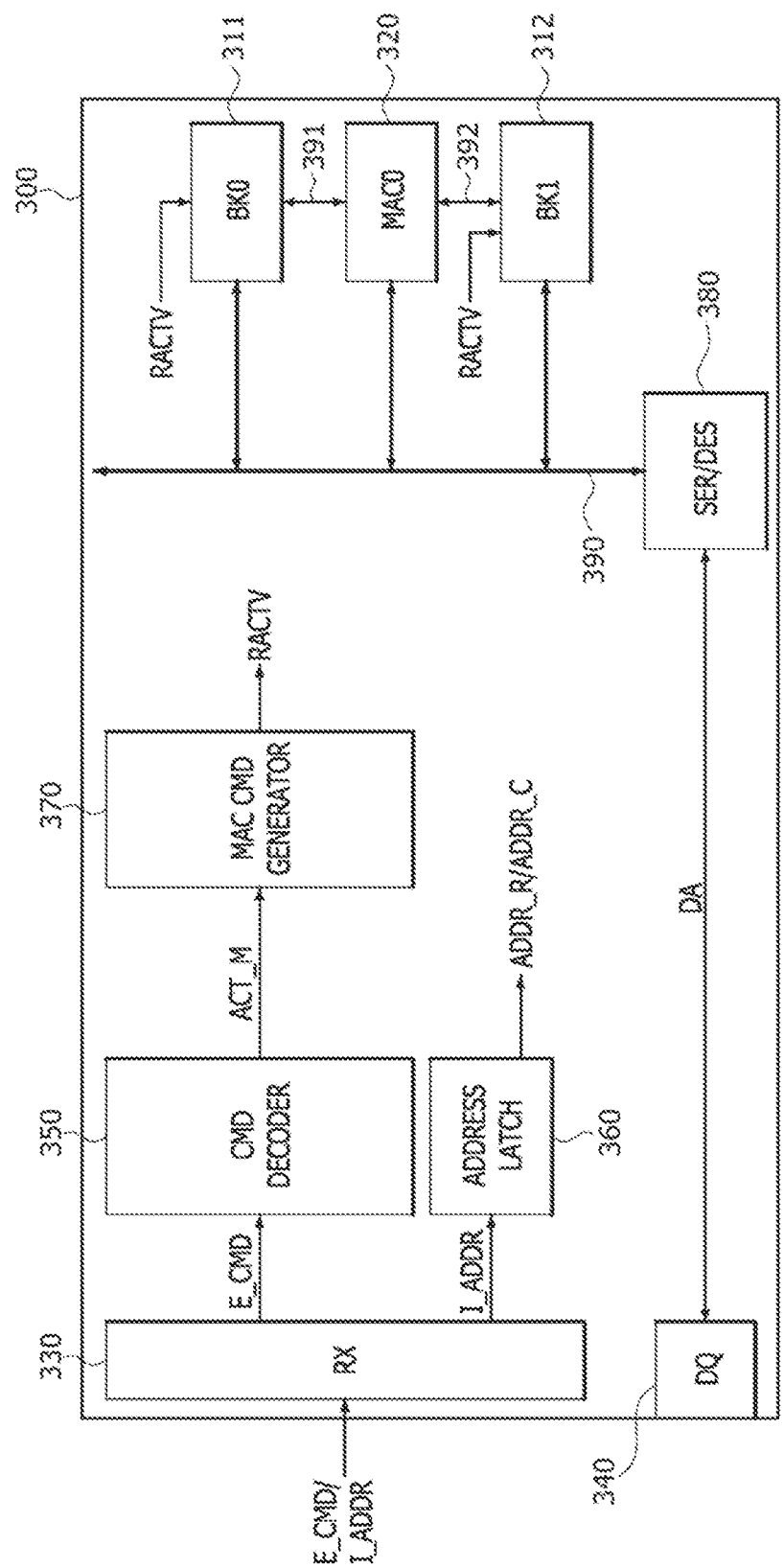
FIGS. 21 to 25 are block diagrams illustrating operations of the PIM device illustrated in FIG. 16.

FIG. 20 illustrates an example of a configuration of the first MAC operator (MAC0) 320 included in the PIM device 300 of FIG. 16. The first MAC operator (MAC0) 320 included in the PIM device 300 may have the same configuration as the first MAC operator (MAC0) 220 described with reference to FIG. 7 except for a signal applied to clock terminals of first and second input latches 321-1 and 321-2 constituting a data input circuit 321. Thus, in FIG. 20, the same reference numerals or the same reference symbols as used in FIG. 7 denote the same elements, and descriptions of the same elements as set forth with reference to FIG. 7 will be omitted hereinafter.

Describing in detail the differences between the first MAC operator (MAC0) 220 and the first MAC operator (MAC0) 320, in case of the first MAC operator (MAC0) 220 illustrated in FIG. 7, the first input latch (221-1 of FIG. 7) and the second input latch (221-2 of FIG. 7) of the data input circuit (221 of FIG. 7) may be synchronized with the first and second MAC input latch signals MAC_L1 and MAC_L2, respectively, sequentially generated with a certain time interval to output the first data DA1 and the second data DA2. In contrast, in case of the first MAC operator (MAC0) 320, the MAC input latch signal MAC_L1 may be inputted to both of the clock terminals of the first and second input latches 321-1 and 321-2 constituting a data input circuit 321. Thus, both of the first and second input latches 321-1 and 321-2 may be synchronized with the MAC input latch signal MAC_L1 to output the first data DA1 and the second data DA2, respectively. Accordingly, the first MAC operator (MAC0) 320 may transmit the first and second data DA1 and DA2 to the MAC circuit 222 in parallel without any time interval between the first and second data DA1 and DA2. As a result, the MAC arithmetic operation of the MAC circuit 222 may be quickly performed without any delay of data input time.

FIGS. 21 to 25 are block diagrams illustrating operations of the PIM device 300 illustrated in FIG. 16. In FIGS. 21 to 25, the same reference numerals or the same reference symbols as used in FIG. 16 denote the same elements. First, referring to FIG. 21, if the external command E_CMD requesting the MAC arithmetic operation and the input address I_ADDR are transmitted from an external device to the receiving driver 330, the receiving driver 330 may output the external command E_CMD and the input address I_ADDR to the command decoder 350 and the address latch 360, respectively. The command decoder 350 may decode the external command E_CMD to generate and transmit the memory active signal ACT_M to the MAC command generator 370. The MAC command generator 370 may generate and output the MAC active signal RACTV in response to the memory active signal ACT_M. The MAC active signal RACTV may be transmitted to the first memory bank (BK0) 311 and the second memory bank (BK1) 312. Both of the first memory bank (BK0) 311 and the second memory bank (BK1) 312 may be activated by the MAC active signal RACTV.

Figure 22:
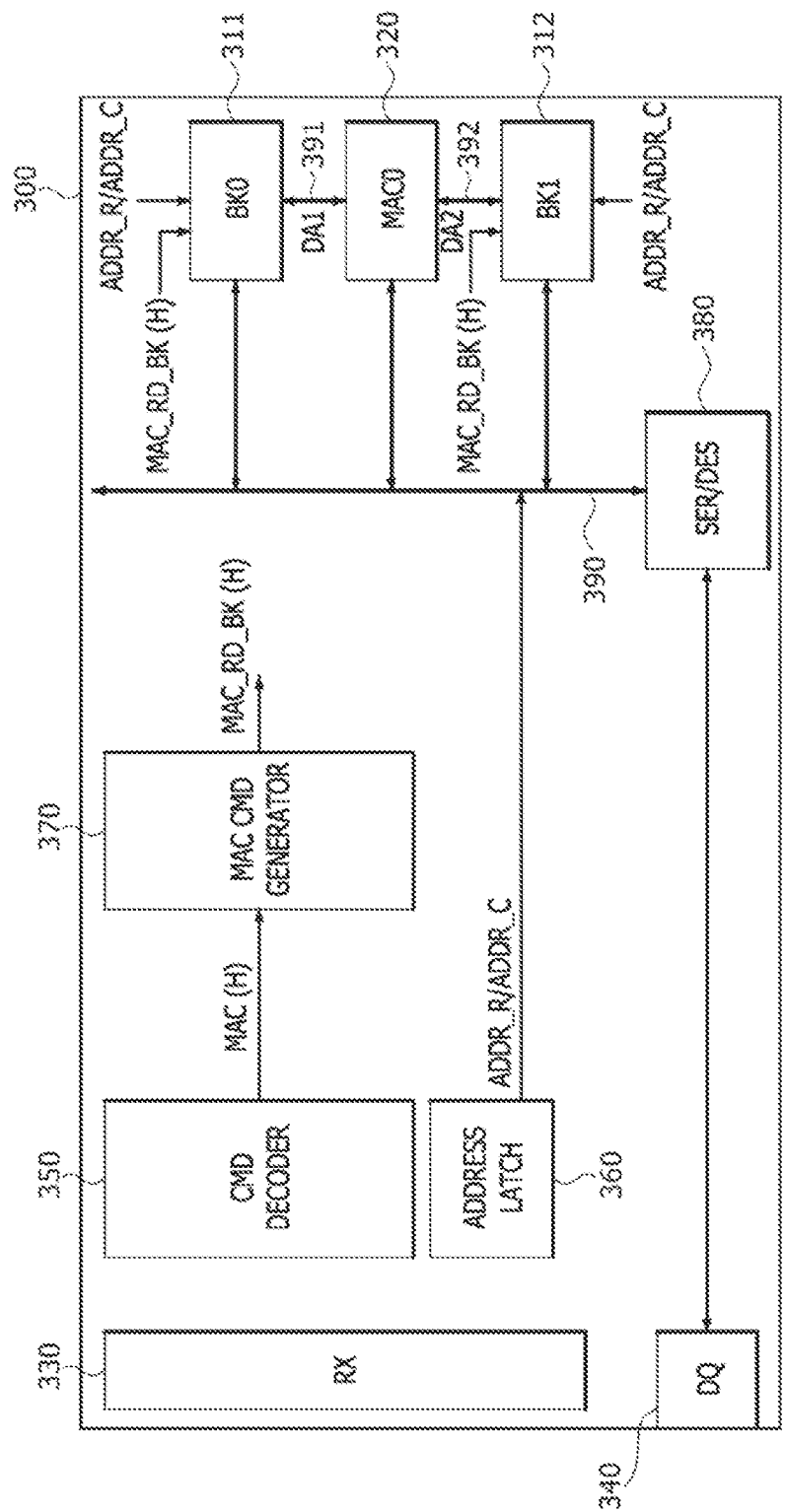

Next, referring to FIG. 22, the command decoder 350 may generate and output the MAC arithmetic signal MAC having a logic "high(H)" level to the MAC command generator 370. In response to the MAC arithmetic signal MAC having a logic "high(H)" level, the MAC command generator 370 may generate and output the MAC read signal MAC_RD_BK having a logic "high(H)" level. The MAC read signal MAC_RD_BK having a logic "high(H)" level, together with the row/column address ADDR_R/ADDR_C, may be transmitted to the first memory bank (BK0) 311 and the second memory bank (BK1) 312. The first data DA1 may be read out of the first memory bank (BK0) 311 by the MAC read signal MAC_RD_BK having a logic "high(H)" level and may be transmitted to the first MAC operator (MAC0) 320 through the first BIO line 391. In addition, the second data DA2 may be read out of the second memory bank (BK1) 312 by the MAC read signal MAC_RD_BK having a logic "high(H)" level and may be transmitted to the first MAC operator (MAC0) 320 through the second BIO line 392.

Figure 23:
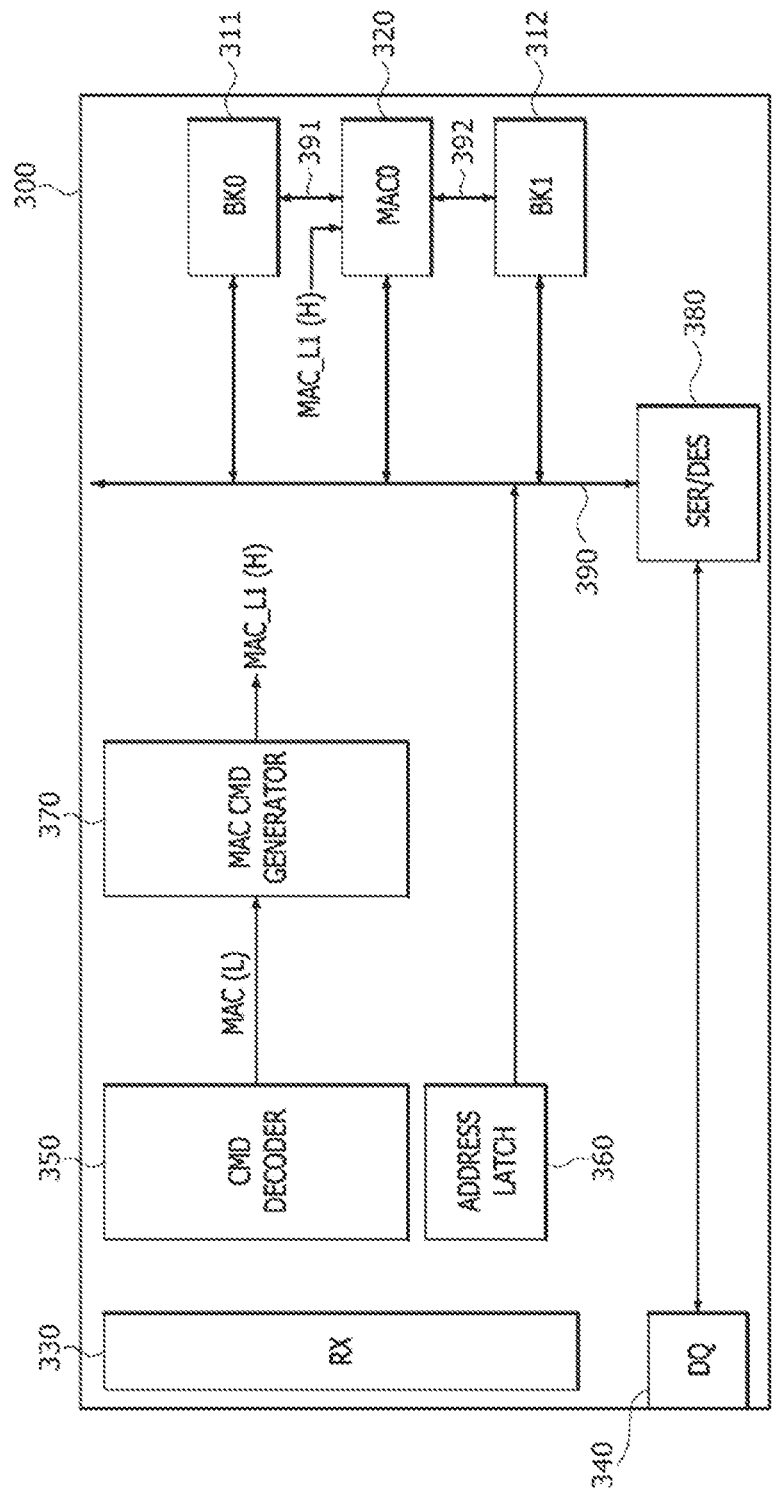

Next, referring to FIG. 23, a logic level of the MAC arithmetic signal MAC outputted from the command decoder 350 may change from a logic "high(H)" level into a logic "low(L)" level at a point in time when the first delay time DELAY_T1 determined by the first delay circuit (372 of FIG. 18) elapses from a point in time when the MAC read signal MAC_RD_BK is outputted from the MAC command generator 370. The MAC command generator 370 may generate and output the MAC input latch signal MAC_L1 having a logic "high(H)" level in response to the MAC arithmetic signal MAC having a logic "low(L)" level. The MAC input latch signal MAC_L1 having a logic "high(H)" level may be transmitted to the first MAC operator (MAC0) 320. The first MAC operator (MAC0) 320 may be synchronized with the MAC input latch signal MAC_L1 having a logic "high(H)" level to perform a latch operation of the first and second data DA1 and DA2 outputted from the first and second memory banks (BK0 and BK1) 311 and 312. If the latch operation of the first and second data DA1 and DA2 terminates, the first MAC operator (MAC0) 320 may perform the MAC arithmetic operation and may generate the MAC result data DA_MAC. The MAC result data DA_MAC generated by the first MAC operator (MAC0) 320 may be inputted to the output latch (223-1 of FIG. 20) included in the first MAC operator (MAC0) 320.

Figure 24:
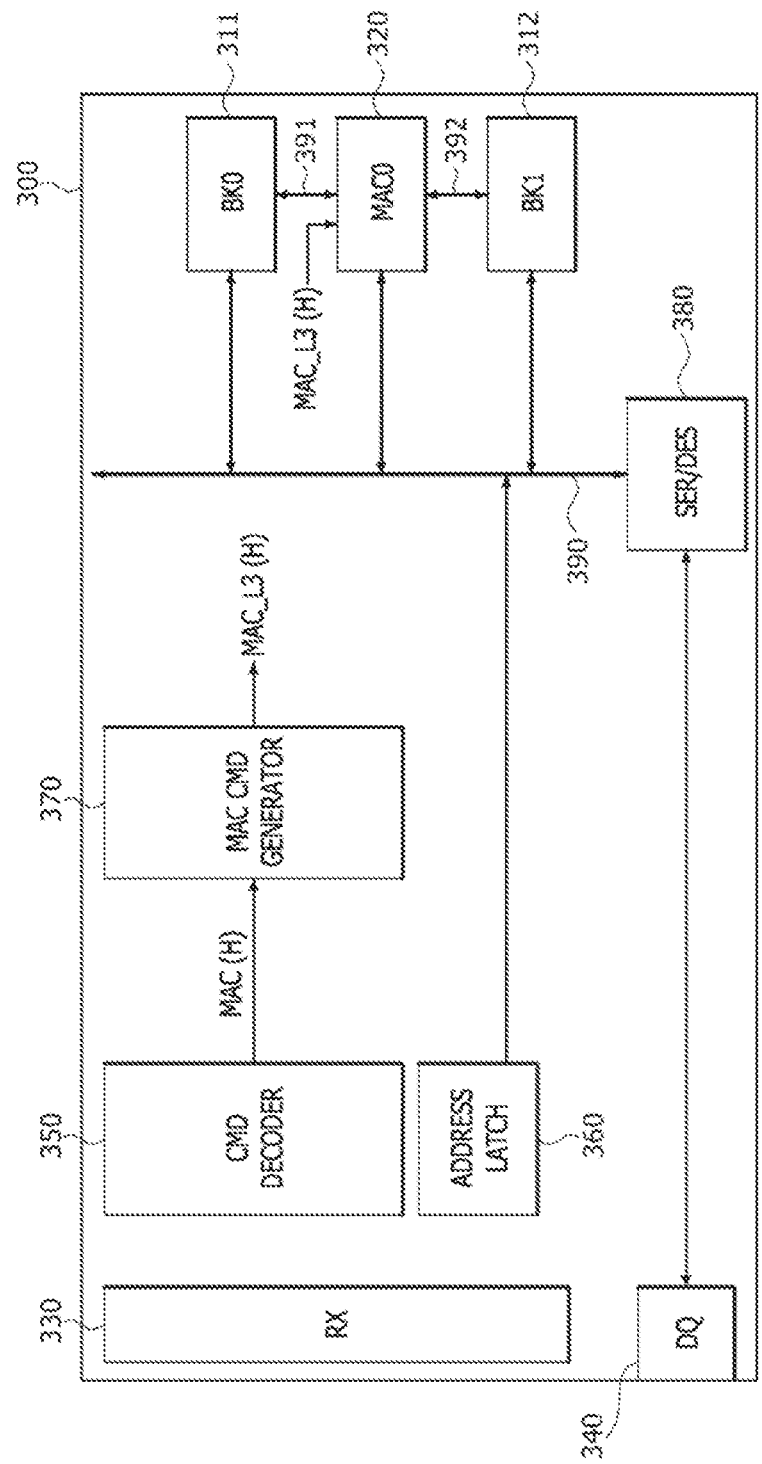

Next, referring to FIG. 24, a logic level of the MAC arithmetic signal MAC outputted from the command decoder 350 may change from a logic "low(L)" level into a logic "high(H)" level at a point in time when the second delay time DELAY_T2 determined by the second delay circuit (373 of FIG. 18) elapses from a point in time when the MAC input latch signal MAC_L1 having a logic "high (H)" level is outputted from the MAC command generator 370. The MAC command generator 370 may generate and output the MAC output latch signal MAC_L3 having a logic "high(H)" level in response to the MAC arithmetic signal MAC having a logic "high(H)" level. The MAC output latch signal MAC_L3 having a logic "high(H)" level may be transmitted to the first MAC operator (MAC0) 320. The output latch (223-1 of FIG. 20) included in the first MAC operator (MAC0) 320 may be synchronized with the MAC output latch signal MAC_L3 having a logic "high(H)" level to transfer the MAC result data DA_MAC generated by the MAC circuit (222 of FIG. 20) to the transfer gate (223-2 of FIG. 20) included in the first MAC operator (MAC0) 320. The MAC result data DA_MAC outputted from the output latch (223-1 of FIG. 20) may be fed back to the addition logic circuit (222-2 of FIG. 20) for the accumulative adding calculation executed by the MAC circuit (222 of FIG. 20).

Figure 25:
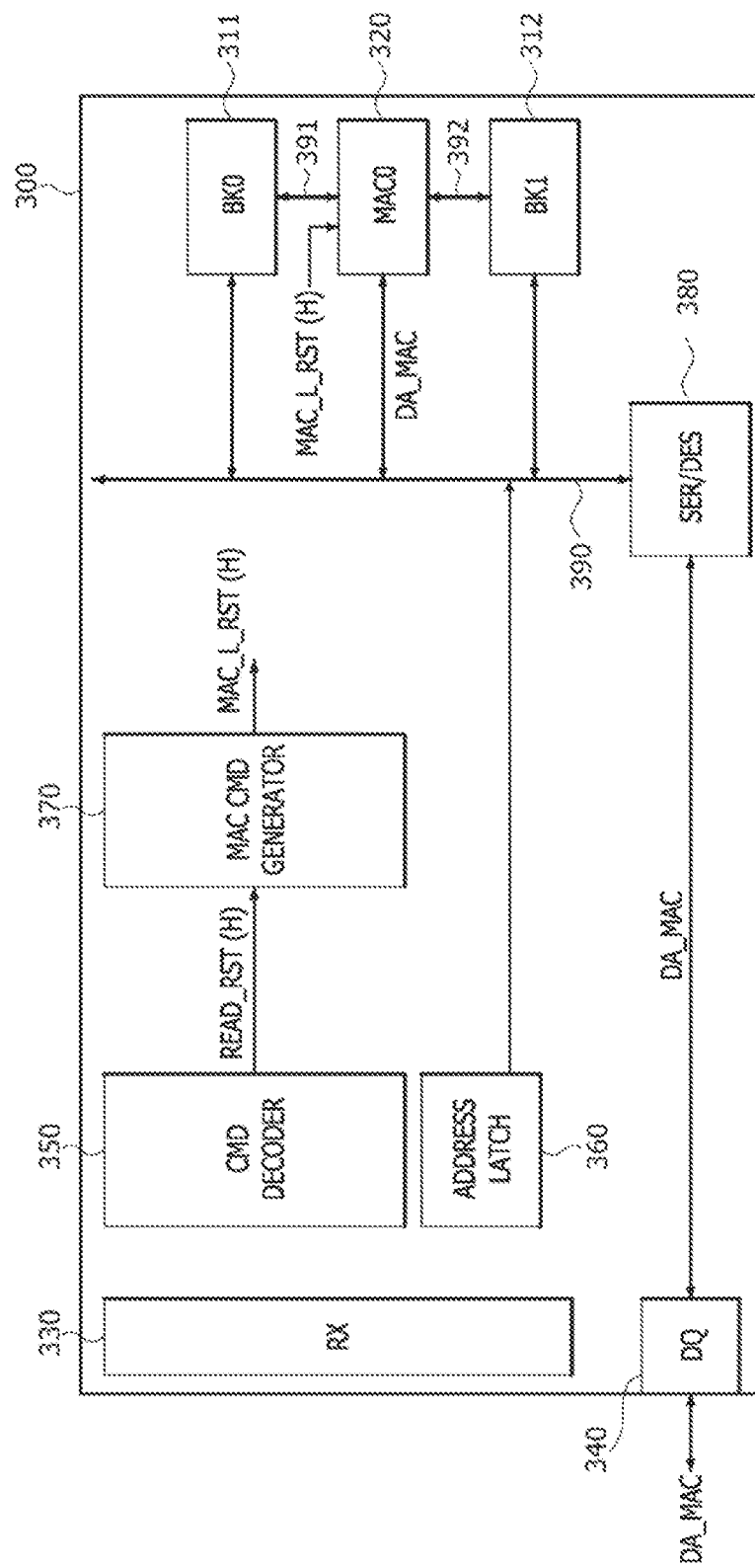

Next, referring to FIG. 25, the command decoder 350 may output and transmit the result read signal READ_RST having a logic "high(H)" level to the MAC command generator 370. The MAC command generator 370 may generate and output the MAC result latch signal MAC_L_RST having a logic "high" level in response to the result read signal READ_RST having a logic "high(H)" level. The MAC result latch signal MAC_L_RST having a logic "high" level may be transmitted to the first MAC operator (MAC0) 320. As described with reference to FIG. 20, the first MAC operator (MAC0) 320 may output the MAC result data DA_MAC to the GIO line 390 in response to the MAC result latch signal MAC_L_RST having a logic "high" level and may also reset the output latch (223-1 of FIG. 20) included in the first MAC operator (MAC0) 320 in response to the MAC result latch signal MAC_L_RST having a logic "high" level. The MAC result data DA_MAC transmitted to the GIO line 390 may be outputted to an external device through the serializer/deserializer 380 and the data I/O line 340. Although not shown in the drawings, the MAC result data DA_MAC outputted from the first MAC operator (MAC0) 320 may be written into the first memory bank (BK0) 311 through the first BIO line 391 without using the GIO line 390 or may be written into the second memory bank (BK1) 312 through the second BIO line 392 without using the GIO line 390.

Figure 26:
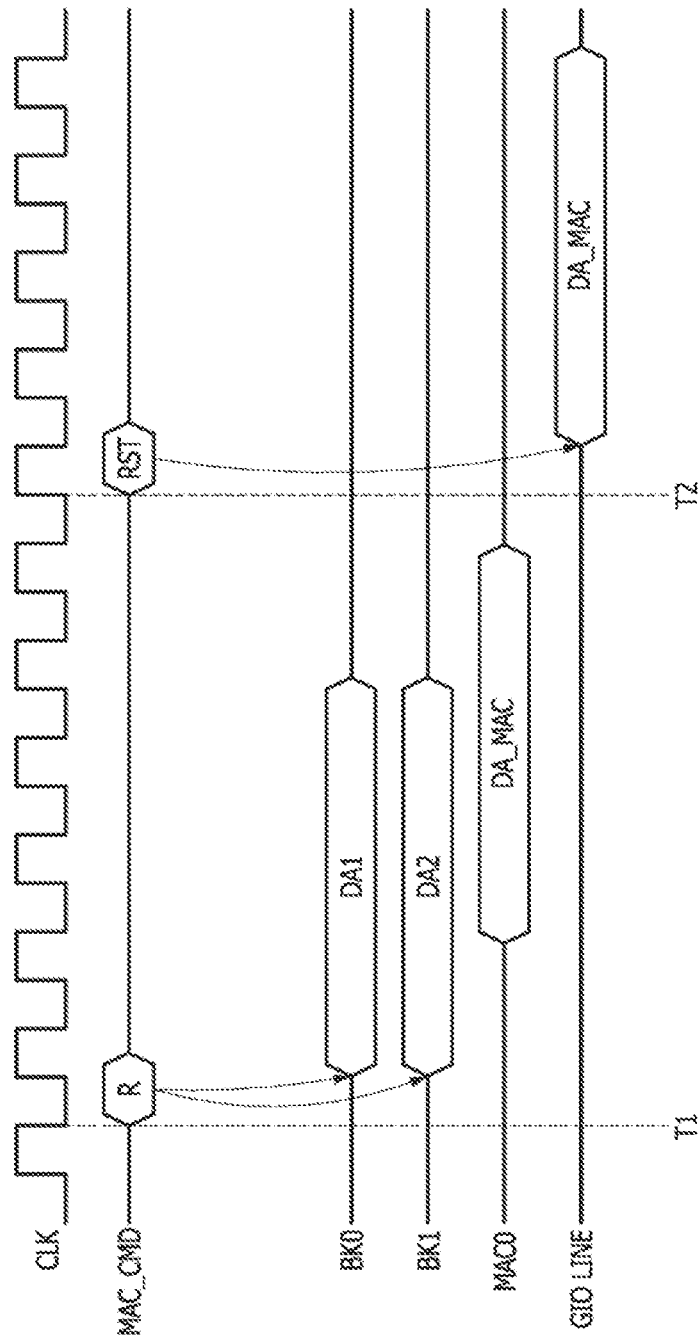
FIG. 26 is a timing diagram an operation of the PIM device illustrated in FIG. 16.

FIG. 26 is a timing diagram illustrating an operation of the PIM device 300 illustrated in FIG. 16. Referring to FIG. 26, at a first point in time "T1", the MAC command generator 370 may be synchronized with a falling edge of a clock signal CLK to generate and output the MAC read signal MAC_RD_BK (R) having a logic "high(H)" level. The first and second memory banks (BK0 and BK1) 311 and 312 may be selected by the MAC read signal MAC_RD_BK (R) having a logic "high(H)" level so that the first data DA1 and the second data DA2 are read out of the first and second memory banks (BK0 and BK1) 311 and 312. If a certain time elapses from a point in time when first data DA1 and the second data DA2 are read out, the first MAC operator (MAC0) 320 may perform the MAC arithmetic operation of the first and second data DA1 and DA2 to generate the MAC result data DA_MAC. At a second point in time "T2", the MAC command generator 370 may be synchronized with a falling edge of the clock signal CLK to generate and output the MAC result latch signal MAC_L_RST (RST) having a logic "high" level. The MAC result data DA_MAC may be transmitted to the GIO line 390 by the MAC result latch signal MAC_L_RST (RST) having a logic "high" level.

Figure 27:
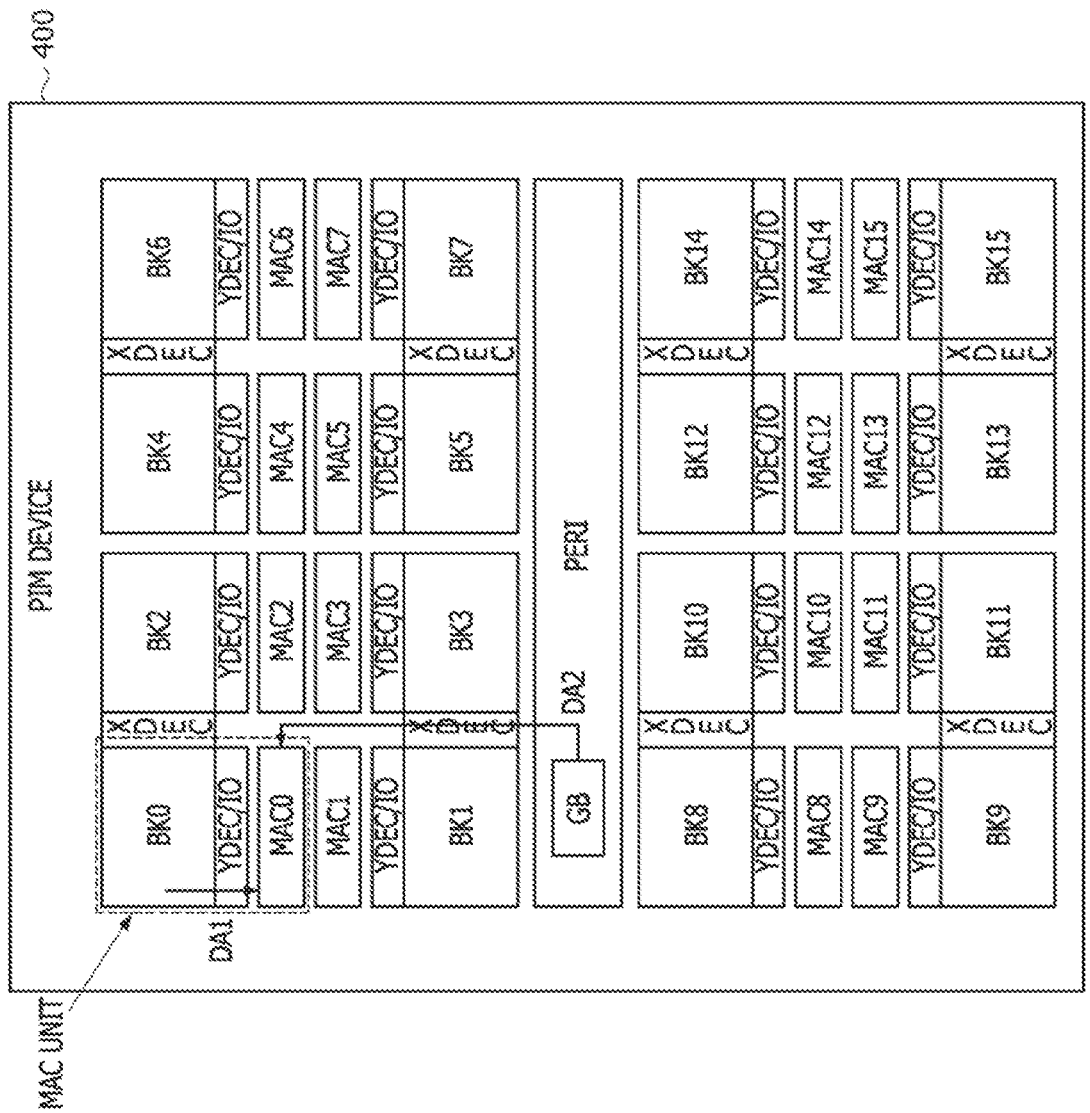
FIG. 27 is a schematic diagram illustrating an arrangement of memory banks and multiplication/accumulation (MAC) operators included in a PIM device according to a second embodiment of the present disclosure.

FIG. 27 illustrates a disposal structure indicating placement of memory banks and MAC operators included in a PIM device 400 according to another embodiment of the present disclosure. Referring to FIG. 27, the PIM device 400 may include memory devices such as a plurality of memory banks (e.g., first to sixteenth memory banks BK0, . . . , and BK15), processing devices such as a plurality of MAC operators (e.g., first to sixteenth MAC operators MAC0, . . . , and MAC15), and a global buffer GB. A core circuit may be disposed to be adjacent to the memory banks BK0, . . . , and BK15. The core circuit may include X-decoders XDECs and Y-decoders/IO circuits YDEC/IOs. The memory banks BK0, . . . , and BK15 and the core circuit may have the same configuration as described with reference to FIG. 2. Thus, descriptions of the memory banks BK0, . . . , and BK15 and the core circuit will be omitted hereinafter. The MAC operators MAC0, . . . , and MAC15 may be disposed to be allocated to the memory banks BK0, . . . , and BK15, respectively. That is, in the PIM device 400, two or more memory banks do not share one MAC operator with each other. Thus, the number of the MAC operators MAC0, . . . , and MAC15 included in the PIM device 400 may be equal to the number of the memory banks BK0, . . . , and BK15 included in the PIM device 400. One of the memory banks BK0, . . . , and BK15 together with one of the MAC operators MAC0, . . . , and MAC15 may constitute one MAC unit. For example, the first memory bank BK0 and the first MAC operator MAC0 may constitute a first MAC unit, and the second memory bank BK1 and the second MAC operator MAC1 may constitute a second MAC unit. Similarly, the sixteenth memory bank BK15 and the sixteenth MAC operator MAC15 may constitute a sixteenth MAC unit. In each of the first to sixteenth MAC units, the MAC operator may receive first data DA1 to be used for the MAC arithmetic operation from the respective memory bank.

The PIM device 400 may further include a peripheral circuit PERI. The peripheral circuit PERI may be disposed in a region other than an area in which the memory banks BK0, BK1, . . . , and BK15; the MAC operators MAC0, . . . , and MAC15; and the core circuit are disposed. The peripheral circuit PERI may be configured to include a control circuit relating to a command/address signal, a control circuit relating to input/output of data, and a power supply circuit. The peripheral circuit PERI of the PIM device 400 may have substantially the same configuration as the peripheral circuit PERI of the PIM device 100 illustrated in FIG. 2. A difference between the peripheral circuit PERI of the PIM device 400 and the peripheral circuit PERI of the PIM device 100 is that the global buffer GB is disposed in the peripheral circuit PERI of the PIM device 400. The global buffer GB may receive second data DA2 to be used for the MAC operation from an external device and may store the second data DA2. The global buffer GB may output the second data DA2 to each of the MAC operators MAC0, . . . , and MAC15 through a GIO line. In the event that the PIM device 400 performs neural network calculation, for example, an arithmetic operation in a deep learning process, the first data DA1 may be weight data and the second data DA2 may be vector data.

The PIM device 400 according to the present embodiment may operate in a memory mode or a MAC arithmetic mode. In the memory mode, the PIM device 400 may operate to perform the same operations as general memory devices. The memory mode may include a memory read operation mode and a memory write operation mode. In the memory read operation mode, the PIM device 400 may perform a read operation for reading out data from the memory banks BK0, BK1, . . . , and BK15 to output the read data, in response to an external request. In the memory write operation mode, the PIM device 400 may perform a write operation for storing data provided by an external device into the memory banks BK0, BK1, . . . , and BK15, in response to an external request. In the MAC arithmetic mode, the PIM device 400 may perform the MAC arithmetic operation using the MAC operators MAC0, . . . , and MAC15. In the PIM device 400, the MAC arithmetic operation may be performed in a deterministic way, and the deterministic MAC arithmetic operation of the PIM device 400 will be described more fully hereinafter. Specifically, the PIM device 400 may perform the read operation of the first data DA1 for each of the memory banks BK0, . . . , and BK15 and the read operation of the second data DA2 for the global buffer GB, for the MAC arithmetic operation in the MAC arithmetic mode. In addition, each of the MAC operators MAC0, . . . , and MAC15 may perform the MAC arithmetic operation of the first data DA1 and the second data DA2 to store a result of the MAC arithmetic operation into the memory bank or to output the result of the MAC arithmetic operation to an external device. In some cases, the PIM device 400 may perform a data write operation for storing data to be used for the MAC arithmetic operation into the memory banks before the data read operation for the MAC arithmetic operation is performed in the MAC arithmetic mode.

The operation mode of the PIM device 400 according to the present embodiment may be determined by a command which is transmitted from a host or a controller to the PIM device 400. In an embodiment, if a first external command requesting a read operation or a write operation for the memory banks BK0, BK1, . . . , and BK15 is transmitted from the host or the controller to the PIM device 400, the PIM device 400 may perform the data read operation or the data write operation in the memory mode. Alternatively, if a second external command requesting the MAC arithmetic operation is transmitted from the host or the controller to the PIM device 400, the PIM device 400 may perform the data read operation and the MAC arithmetic operation.

The PIM device 400 may perform the deterministic MAC arithmetic operation. Thus, the host or the controller may always predict a point in time (or a clock) when the MAC arithmetic operation terminates in the PIM device 400 from a point in time when an external command requesting the MAC arithmetic operation is transmitted from the host or the controller to the PIM device 400. Because the timing is predictable, no operation for informing the host or the controller of a status of the MAC arithmetic operation is required while the PIM device 400 performs the deterministic MAC arithmetic operation. In an embodiment, a latency during which the MAC arithmetic operation is performed in the PIM device 400 may be set to a fixed value for the deterministic MAC arithmetic operation.

Figure 28:
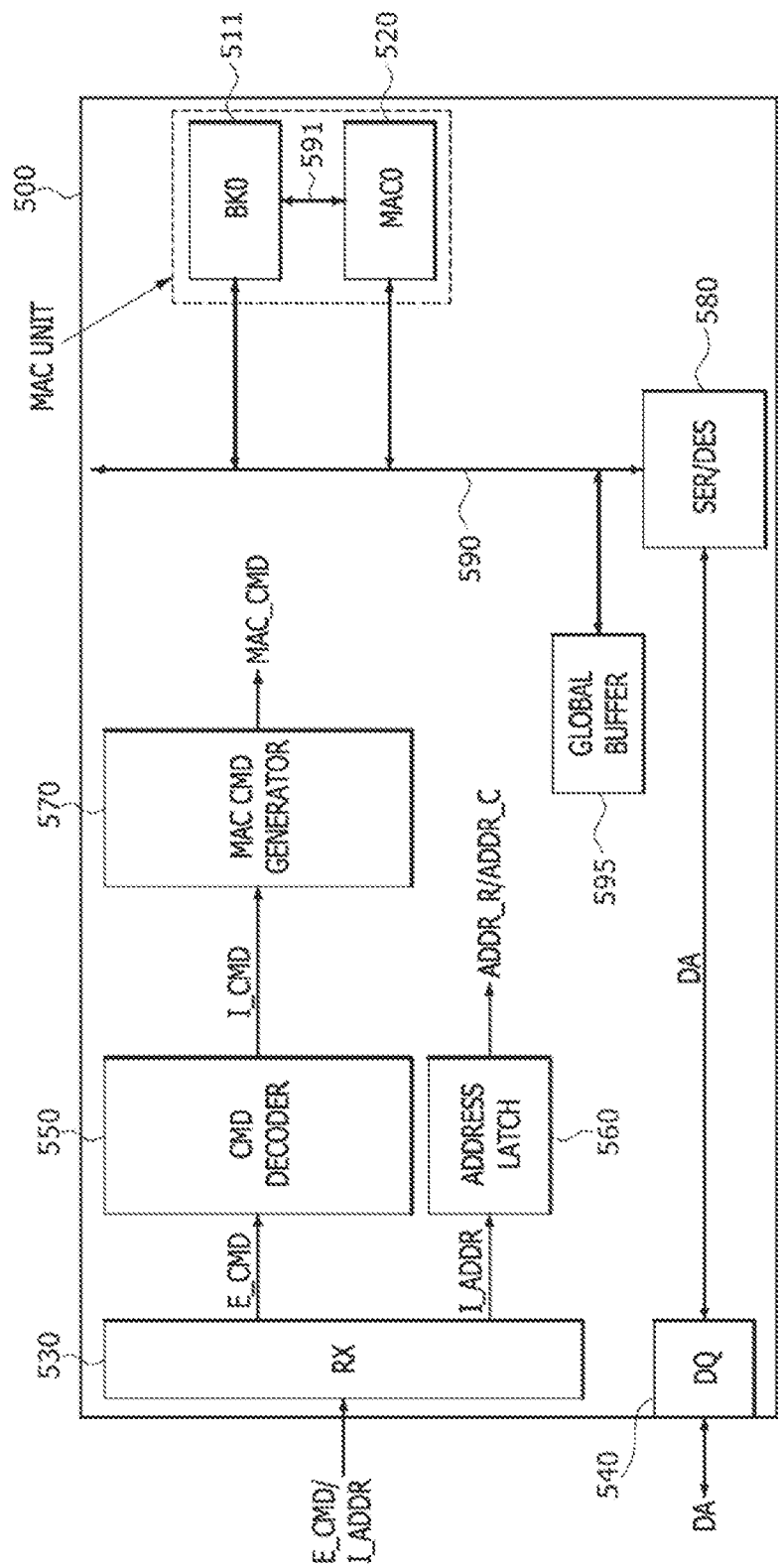
FIG. 28 is a block diagram illustrating a configuration of a PIM device according to the second embodiment of the present disclosure.

FIG. 28 is a block diagram illustrating an example of a detailed configuration of a PIM device 500 corresponding to the PIM device 400 illustrated in FIG. 27. FIG. 28 illustrates only a first memory bank (BK0) 511 and a first MAC operator (MAC0) 520 constituting a first MAC unit among a plurality of MAC units. However, FIG. 28 illustrates merely an example for simplification of the drawing. Accordingly, the following description for the first MAC unit may be equally applicable to the remaining MAC units. Referring to FIG. 28, the PIM device 500 may be configured to include the first memory bank (BK0) 511 and the first MAC operator (MAC0) 520 constituting the first MAC unit as well as a global buffer 595. The PIM device 500 may further include a GIO line 590 and a BIO line 591 used as data transmission lines. The first memory bank (BK0) 511 and the first MAC operator (MAC0) 520 may communicate with the global buffer 595 through the GIO line 590. Only the data transmission between the first memory bank (BK0) 511 and the first MAC operator (MAC0) 520 may be achieved through the BIO line 591. The BIO line 591 is dedicated specifically for data transmission between the first memory bank (BK0) 511 and the first MAC operator (MAC0) 520. Thus, the first MAC operator (MAC0) 520 may receive the first data DA1 to be used for the MAC arithmetic operation from the first memory bank (BK0) 511 through the BIO line 591 and may receive the second data DA2 to be used for the MAC arithmetic operation from the global buffer 595 through the GIO line 590.

The PIM device 500 may include a receiving driver (RX) 530, a data I/O circuit (DQ) 540, a command decoder 550, an address latch 560, a MAC command generator 570, and a serializer/deserializer (SER/DES) 580. The command decoder 550, the address latch 560, the MAC command generator 570, and the serializer/deserializer 580 may be disposed in the peripheral circuit PERI of the PIM device 400 illustrated in FIG. 27. The receiving driver 530 may receive an external command E_CMD and an input address I_ADDR from an external device. The external device may denote a host or a controller coupled to the PIM device 500. Hereinafter, it may be assumed that the external command E_CMD transmitted to the PIM device 500 is a command requesting the MAC arithmetic operation. That is, the PIM device 500 may perform the deterministic MAC arithmetic operation in response to the external command E_CMD. The data I/O circuit 540 may provide a means through which the PIM device 500 communicates with the external device.

The receiving driver 530 may separately output the external command E_CMD and the input address I_ADDR received from the external device. Data DA inputted to the PIM device 500 through the data I/O circuit 540 may be processed by the serializer/deserializer 580 and may be transmitted to the first memory bank (BK0) 511 and the global buffer 595 through the GIO line 590 of the PIM device 500. The data DA outputted from the first memory bank (BK0) 511 and the first MAC operator (MAC0) 520 through the GIO line 590 may be processed by the serializer/deserializer 580 and may be outputted to the external device through the data I/O circuit 540. The serializer/deserializer 580 may convert the data DA into parallel data if the data DA are serial data or may convert the data DA into serial data if the data DA are parallel data. For the data conversion, the serializer/deserializer 580 may include a serializer converting parallel data into serial data and a deserializer converting serial data into parallel data.

The command decoder 550 may decode the external command E_CMD outputted from the receiving driver 530 to generate and output the internal command signal I_CMD. The internal command signal I_CMD outputted from the command decoder 550 may be the same as the internal command signal I_CMD described with reference to FIG. 17. That is, the internal command signal I_CMD may include a first internal command signal corresponding to the memory active signal ACT_M, a second internal command signal corresponding to the MAC arithmetic signal MAC, and a third internal command signal corresponding to the result read signal READ_RST. The first to third internal command signals outputted from the command decoder 550 may be sequentially inputted to the MAC command generator 570. As described with reference to FIG. 17, the memory active signal ACT_M, the MAC arithmetic signal MAC, and the result read signal READ_RST outputted from the command decoder 550 may be sequentially generated at predetermined points in time (or clocks) in order to perform the deterministic MAC arithmetic operation of the PIM device 500. Thus, the host or the controller outputting the external command E_CMD may predict the points in time when the first to third internal command signals constituting the internal command signal I_CMD are generated by the command decoder 550 in advance at a point in time when the external command E_CMD is outputted from the host or the controller. That is, the host or the controller may predict a point in time (or a clock) when the MAC arithmetic operation terminates in the PIM device 500 after the external command E_CMD requesting the MAC arithmetic operation is transmitted from the host or the controller to the PIM device 500, even without receiving any signals from the PIM device 500.

The address latch 560 may convert the input address I_ADDR outputted from the receiving driver 530 into a row/column address ADDR_R/ADDR_C to output the row/column address ADDR_R/ADDR_C. The row/column address ADDR_R/ADDR_C outputted from the address latch 560 may be transmitted to the first memory bank (BK0) 511. According to the present embodiment, the first data and the second data to be used for the MAC arithmetic operation may be simultaneously read out of the first memory bank (BK0) 511 and the global buffer 595, respectively. Thus, it may be unnecessary to generate a bank selection signal for selecting the first memory bank 511. A point in time when the row/column address ADDR_R/ADDR_C is inputted to the first memory bank 511 may be a point in time when a MAC command (i.e., the MAC arithmetic signal MAC) requesting a data read operation for the first memory bank 511 for the MAC arithmetic operation is generated.

The MAC command generator 570 may output the MAC command signal MAC_CMD in response to the internal command signal I_CMD outputted from the command decoder 550. The MAC command signal MAC_CMD outputted from the MAC command generator 570 may be the same as the MAC command signal MAC_CMD described with reference to FIG. 17. That is, the MAC command signal MAC_CMD outputted from the MAC command generator 570 may include the MAC active signal RACTV corresponding to the first MAC command signal, the MAC read signal MAC_RD_BK corresponding to the second MAC command signal, the MAC input latch signal MAC_L1 corresponding to the third MAC command signal, the MAC output latch signal MAC_L3 corresponding to the fourth MAC command signal, and the MAC result latch signal MAC_L_RST corresponding to the fifth MAC command signal.

The MAC active signal RACTV may be generated based on the memory active signal ACT_M outputted from the command decoder 550. The MAC read signal MAC_RD_BK, the MAC input latch signal MAC_L1, the MAC output latch signal MAC_L3, and the MAC result latch signal MAC_L_RST may be sequentially generated based on the MAC arithmetic signal MAC outputted from the command decoder 550. That is, the MAC input latch signal MAC_L1 may be generated at a point in time when a certain time elapses from a point in time when the MAC read signal MAC_RD_BK is generated. The MAC output latch signal MAC_L3 may be generated at a point in time when a certain time elapses from a point in time when the MAC input latch signal MAC_L1 is generated. Finally, the MAC result latch signal MAC_L_RST may be generated based on the result read signal READ_RST outputted from the command decoder 550.

The MAC active signal RACTV outputted from the MAC command generator 570 may control an activation operation for the first memory bank 511. The MAC read signal MAC_RD_BK outputted from the MAC command generator 570 may control a data read operation for the first memory bank 511 and the global buffer 595. The MAC input latch signal MAC_L1 outputted from the MAC command generator 570 may control an input data latch operation of the first MAC operator (MAC0) 520. The MAC output latch signal MAC_L3 outputted from the MAC command generator 570 may control an output data latch operation of the first MAC operator (MAC0) 520. The MAC result latch signal MAC_L_RST outputted from the MAC command generator 570 may control an output operation of MAC result data of the first MAC operator (MAC0) 520 and a reset operation of the first MAC operator (MAC0) 520.

As described above, in order to perform the deterministic MAC arithmetic operation of the PIM device 500, the memory active signal ACT_M, the MAC arithmetic signal MAC, and the result read signal READ_RST outputted from the command decoder 550 may be sequentially generated at predetermined points in time (or clocks), respectively. Thus, the MAC active signal RACTV, the MAC read signal MAC_RD_BK, the MAC input latch signal MAC_L1, the MAC output latch signal MAC_L3, and the MAC result latch signal MAC_L_RST may also be generated and outputted from the MAC command generator 570 at predetermined points in time after the external command E_CMD is inputted to the PIM device 500, respectively. That is, a time period from a point in time when the first and second memory banks 511 is activated by the MAC active signal RACTV until a point in time when the first MAC operator (MAC0) 520 is reset by the MAC result latch signal MAC_L_RST may be predetermined.

The MAC command generator 570 of the PIM device 500 according to the present embodiment may have the same configuration as described with reference to FIG. 18. In addition, the input signals and the output signals of the MAC command generator 570 may be inputted to and outputted from the MAC command generator 570 at the same points in time as described with reference to FIG. 19. As described with reference to FIGS. 18 and 19, the MAC command generator 570 may sequentially receive the memory active signal ACT_M, the MAC arithmetic signal MAC, and the result read signal READ_RST from the command decoder 550. In addition, the MAC command generator 570 may sequentially generate and output the MAC active signal RACTV, the MAC read signal MAC_RD_BK, the MAC input latch signal MAC_L1, the MAC output latch signal MAC_L3, and the MAC result latch signal MAC_L_RST. The MAC active signal RACTV, the MAC read signal MAC_RD_BK, the MAC input latch signal MAC_L1, the MAC output latch signal MAC_L3, and the MAC result latch signal MAC_L_RST may be outputted from the MAC command generator 570 in series with certain time intervals.

The MAC command generator 570 may generate and output the MAC active signal RACTV in response to the memory active signal ACT_M outputted from the command decoder 550. Subsequently, the MAC command generator 570 may generate and output the MAC read signal MAC_RD_BK in response to the MAC arithmetic signal MAC outputted from the command decoder 550. The MAC command generator 570 may delay the MAC arithmetic signal MAC by a certain time determined by the first delay circuit (372 of FIG. 18) to generate and output the MAC input latch signal MAC_L1. The MAC command generator 570 may delay the MAC input latch signal MAC_L1 by a certain time determined by the second delay circuit (373 of FIG. 18) to generate and output the MAC output latch signal MAC_L3. Subsequently, the MAC command generator 570 may generate and output the MAC result latch signal MAC_L_RST in response to the result read signal READ_RST outputted from the command decoder 550.

Figure 29:
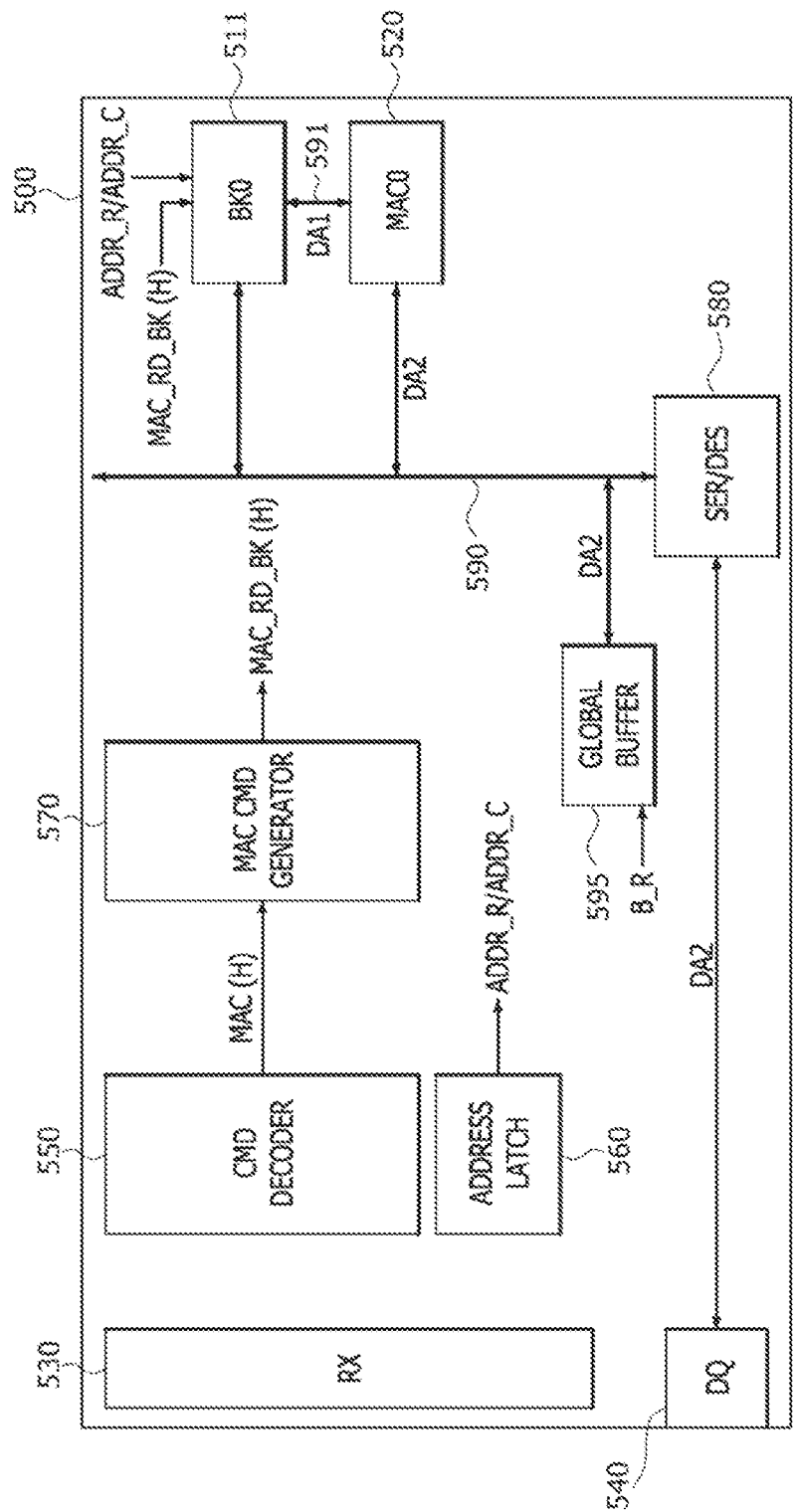
FIG. 29 is a block diagram illustrating an operation of the PIM device illustrated in FIG. 28.

FIG. 29 is a block diagram illustrating an operation of the PIM device 500 illustrated in FIG. 28. In FIG. 29, the same reference numerals or the same reference symbols as used in FIG. 16 denote the same elements. The operation of the PIM device 500 according to the present embodiment may be similar to the operation of the PIM device 300 described with reference to FIG. 16 except a transmission process of the first and second data DA1 and DA2 inputted to the first MAC operator (MAC0) 520. Thus, the operation of the PIM device 500 executed before the first and second data DA1 and DA2 are transmitted to the first MAC operator (MAC0) 520 may be the same as the operation of the PIM device 300 described with reference to FIG. 21. As illustrated in FIG. 29, when the MAC arithmetic signal MAC having a logic "high(H)" level is transmitted from the command decoder 550 to the MAC command generator 570, the MAC command generator 570 may generate and output the MAC read signal MAC_RD_BK having a logic "high(H)" level. The MAC read signal MAC_RD_BK having a logic "high(H)" level, together with the row/column address ADDR_R/ADDR_C, may be transmitted to the first memory bank (BK0) 511. In such a case, a global buffer read signal B_R may also be transmitted to the global buffer 595. The first data DA1 may be read out of the first memory bank (BK0) 511 by the MAC read signal MAC_RD_BK having a logic "high(H)" level and may be transmitted to the first MAC operator (MAC0) 520 through the BIO line 591. In addition, the second data DA2 may be read out of the global buffer 595 by the global buffer read signal B_R and may be transmitted to the first MAC operator (MAC0) 520 through the GIO line 590. The operation of the PIM device 500 executed after the first and second data DA1 and DA2 are transmitted to the first MAC operator (MAC0) 520 may be the same as the operation of the PIM device 300 described with reference to FIGS. 23 to 25.

Figure 30:
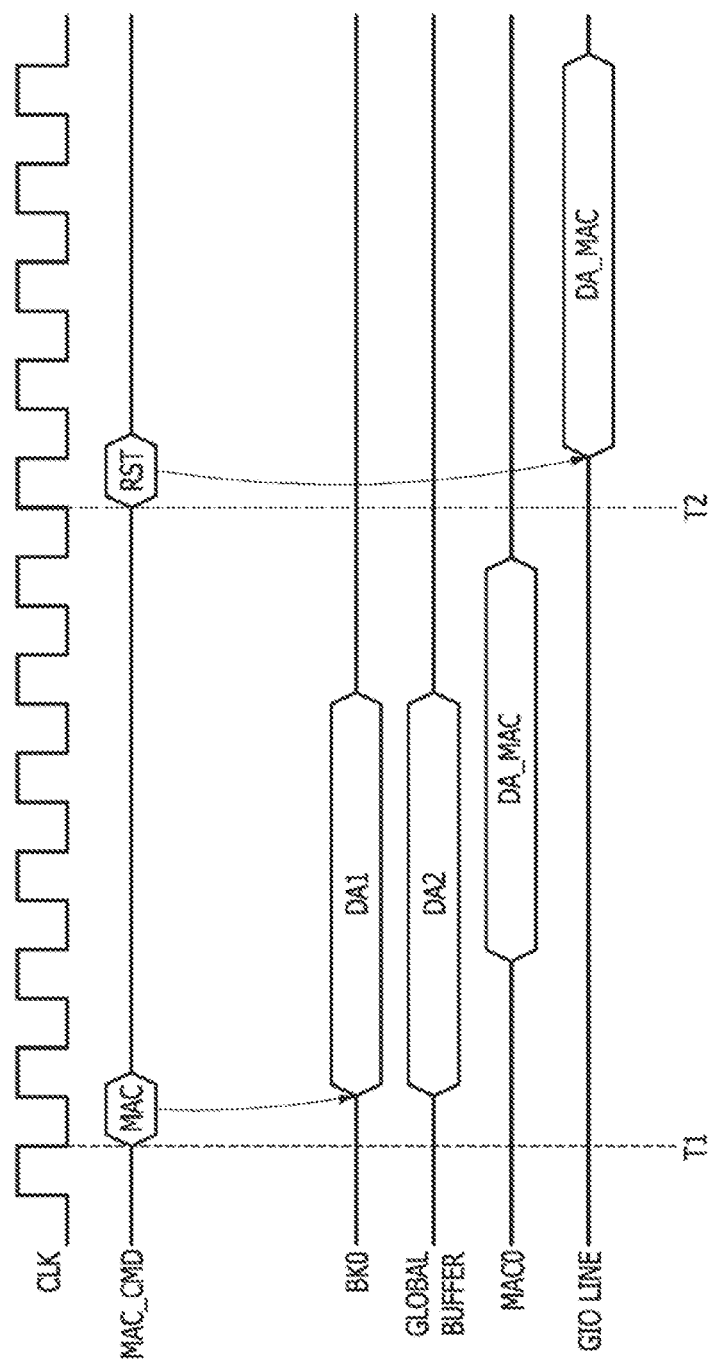
FIG. 30 is a timing diagram illustrating an operation of the PIM device illustrated in FIG. 28.

FIG. 30 is a timing diagram illustrating an operation of the PIM device 500 illustrate in FIG. 28. Referring to FIG. 30, at a first point in time "T1", the MAC command generator 570 may be synchronized with a falling edge of a clock signal CLK to generate and output the MAC read signal MAC_RD_BK (R) having a logic "high(H)" level. The first memory bank (BK0) 511 may be selected by the MAC read signal MAC_RD_BK (R) having a logic "high(H)" level so that the first data DA1 are read out of the first memory bank (BK0) 511. In addition, the second data DA2 may be read out of the global buffer 595. If a certain time elapses from a point in time when the first and second data DA1 and DA2 are read out of the first memory bank (BK0) 511 and the global buffer 595, the first MAC operator (MAC0) 520 may perform the MAC arithmetic operation of the first and second data DA1 and DA2 to generate the MAC result data DA_MAC. At a second point in time "T2", the MAC command generator 570 may be synchronized with a falling edge of the clock signal CLK to generate and output the MAC result latch signal MAC_L_RST (RST). The MAC result data DA_MAC may be transmitted to an external device through the GIO line 590 or to the first memory bank (BK0) 511 through the BIO line 591, by the MAC result latch signal MAC_L_RST (RST).

Figure 31:
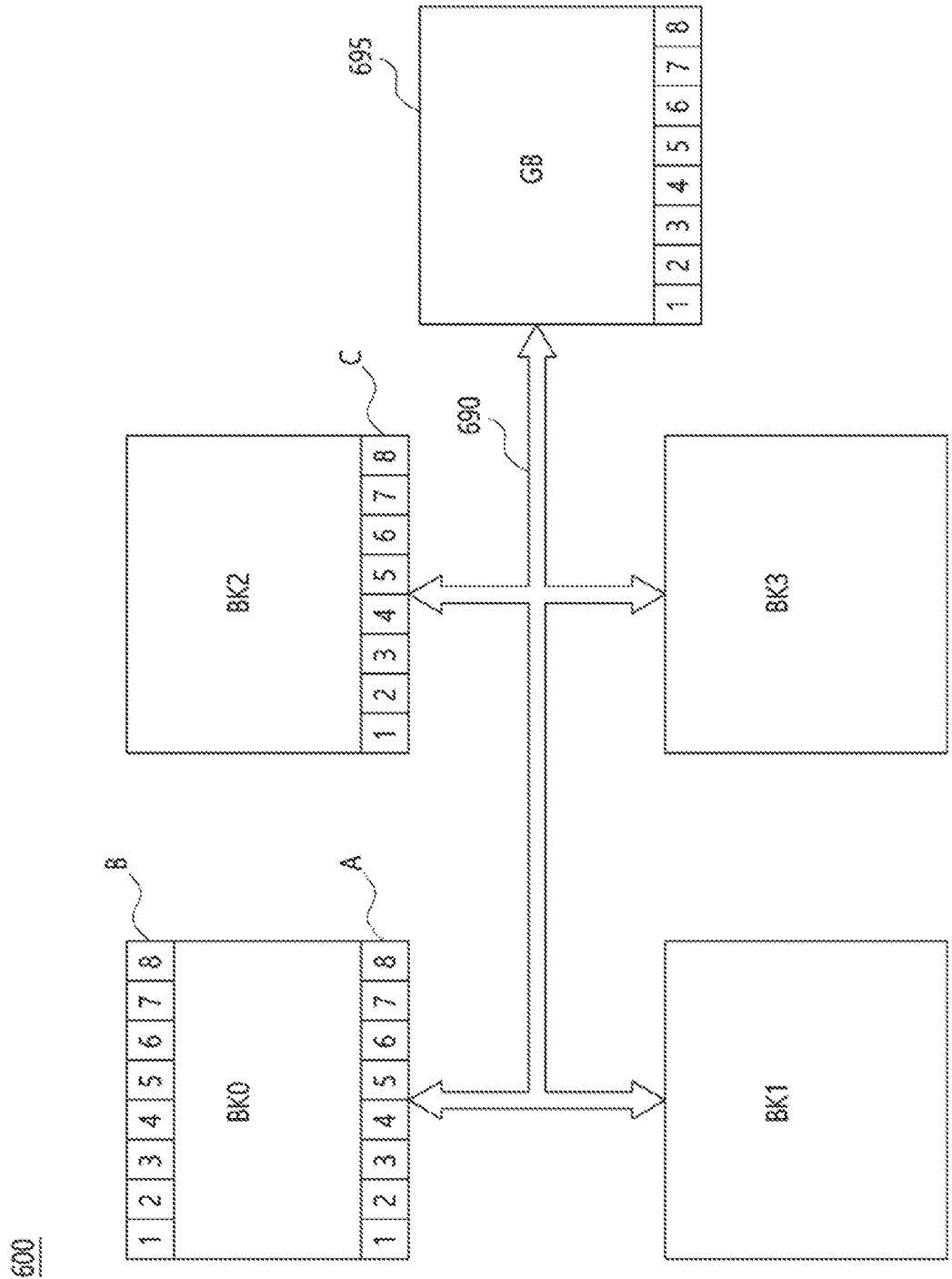
FIG. 31 is a diagram illustrating an operation of a PIM device according to an embodiment of the present disclosure.

FIG. 31 is a diagram illustrating an operation of a PIM device 600 according to an embodiment of the present disclosure. Referring to FIG. 31, the PIM device 600 may perform a data copy operation. The PIM device 600 may include a plurality of storage regions. The data copy operation may mean an operation of transferring and storing data, stored in a memory cell coupled to one row of one storage region, to and in a memory cell coupled to another row of the one storage region or a memory cell coupled to a row of another storage region. The PIM device may include a data storage region, and may include at least a first storage region and a second storage region. The first storage region may include a plurality of memory banks. FIG. 31 illustrates that the PIM device 600 includes four memory banks as the first storage region, but the number of memory banks is not limited to four. The PIM device 600 may include a first memory bank BK0, a second memory bank BK1, a third memory bank BK2, and a fourth memory bank BK3. The second storage region may be a buffer memory. The PIM device 600 may include a global buffer 695 as the second storage region. The first to fourth memory banks BK0, BK1, BK2, and BK3 and the global buffer 695 may be coupled through a data transmission line 690. The data transmission line 690 may be a global input/output (I/O) line through which data read from the first to fourth memory banks BK0, BK1, BK2, and BK3 and the global buffer 695 is transmitted or data to be written to the first to fourth memory banks BK0, BK1, BK2, and BK3 and the global buffer 695 is transmitted. The PIM device 600 may read data stored in one memory bank among the first to fourth memory banks BK0, BK1, BK2, and BK3, and may transfer and store the read data to and in the global buffer 695. The global buffer 695 may be implemented by a static RAM (SRAM), a latch, or a register. The PIM device 600 may perform a data copy operation by transferring and storing the data, transferred to and stored in the global buffer 695, to and in the one memory bank or another memory bank. For example, data stored in a memory cell or memory cells A coupled to a first row of the first memory bank BK0 may be transferred to and stored in a memory cell or memory cells B coupled to a second row of the first memory bank BK0. Alternatively, data stored in a memory cell or memory cells A coupled to a first row of the first memory bank BK0 may be transferred to and stored in a memory cell or memory cells C coupled to a third row of the third memory bank BK2.

The PIM device 600 may perform a copy read operation and a copy write operation to perform the data copy operation. The copy read operation may mean an operation of reading data stored in one memory bank among the first to fourth memory banks BK0, BK1, BK2, and BK3 and writing the read data to the global buffer 695. The copy write operation may mean an operation of reading the data stored in the global buffer 695 and writing the data, read from the global buffer 695, to the one memory bank or another memory bank. By performing the copy read operation, the PIM device 600 may read data stored in the memory cells A coupled to the first row of the first memory bank BK0, and may output the read data to the data transmission line 690. The PIM device 600 may write the data, transmitted through the data transmission line 690, to the global buffer 695. By performing the copy write operation, the PIM device 600 may read the data stored in the global buffer 695, and may output the data, read from the global buffer 695, to the data transmission line 690. The PIM device 600 may write the data, transmitted through the data transmission line 690, to the memory cells B coupled to the second row of the first memory bank BK0 or the memory cells C coupled to the third row of the third memory bank BK2. Although not illustrated, the PIM device 600 may further include at least one MAC operator. The MAC operator may be coupled to the data transmission line 690 as illustrated in FIG. 3. The MAC operator may perform a MAC arithmetic operation on data stored in the first to fourth memory banks BK0, BK1, BK2, and BK3 and the global buffer 695.

Figure 32:
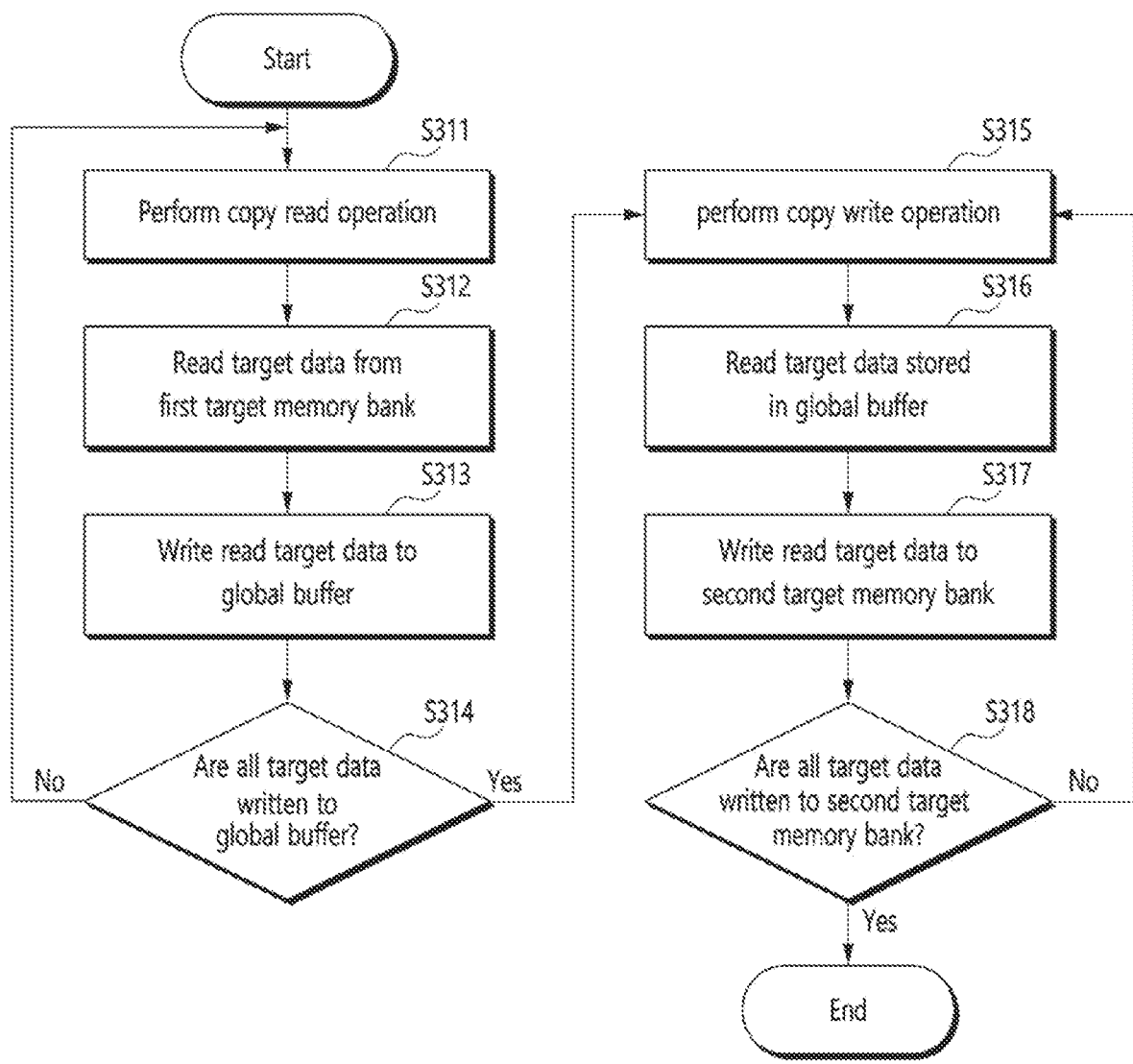
FIG. 32 is a flow chart illustrating the operation of the PIM device according to the embodiment of the present disclosure.

FIG. 32 is a flow chart illustrating an operation method of the PIM device according to the embodiment of the present disclosure. The operation method of the PIM device 600 will be described below with reference to FIGS. 31 and 32. When the data copy operation is started, at step S311, the PIM device 600 may first perform the copy read operation. At step S312, the PIM device 600 may read target data from a first target memory bank. Before the step S311, the PIM device 600 may enable the first row of the first memory bank BK0. The target data of the first target memory bank may be data as a target of the data copy operation. For example, the target data may be data 1 to 8 which are stored in the plurality of memory cells A coupled to a plurality of columns coupled to the first row of the first memory bank BK0. Although the target data is illustrated as including the first to eighth data 1 to 8, the number of target data may be an integer of one or more. The PIM device 600 may access a first column which is coupled to the first row. The PIM device 600 may read the first data 1 stored in the memory cell coupled to the first column. At step S313, the PIM device 600 may write the read target data to the global buffer 695. The PIM device 600 may write the first data 1, read from the first memory bank BK0, to the global buffer 695. At step S314, it may be determined whether all target data are read from the first target memory bank and are written to the global buffer 695. When all the target data are not read (No at step S314), the steps S311, S312, and S313 may be repeatedly performed. Until all the target data are read, the PIM device 600 may read data stored in the plurality of memory cells coupled to the plurality of columns coupled to the first row by sequentially accessing the plurality of columns, and may sequentially write the read data to the global buffer 695. For example, when the target data include the first to eighth data 1 to 8, the PIM device 600 may access a second column coupled to the first row, and may read the second data 2 stored in the memory cell coupled to the second column. The read second data 2 may be written to the global buffer 695. The PIM device 600 may access a third column coupled to the first row, and may read the third data 3 stored in the memory cell coupled to the third column and write the read third data 3 to the global buffer 695. The PIM device 600 may repeatedly perform the steps S311, S312, and S313 until an eighth column coupled to the first row is accessed and the eighth data 8 is written to the global buffer 695. When all the target data are read and are written to the global buffer 695 (Yes at step S314), step S315 may be performed.

At the step S315, the PIM device 600 may perform the copy write operation. The PIM device 600 may enable a row of a second target memory bank before the step S315. The second target memory bank may be the same as the first target memory bank, or may be a memory bank different from the first target memory bank. For example, the PIM device 600 may enable the second row of the first memory bank BK0 or the third row of the third memory bank BK2. At step S316, the PIM device 600 may read the target data stored in the global buffer 695. At step S317, the data read from the global buffer 695 may be written to the second target memory bank. For example, the PIM device 600 may read the first data 1 from the global buffer 695. The PIM device 600 may access a first column coupled to the second row of the first memory bank BK0 or the third row of the third memory bank BK2. The PIM device 600 may write the first data 1, read from the global buffer 695, to the memory cell coupled to the first column coupled to the second row or the third row. At step S318, it may be determined whether all the target data are read from the global buffer 695 and are written to the second target memory bank. When all the target data are not read (No at step S318), the steps S315, S316, and S317 may be repeatedly performed. Until all the target data are written, the PIM device 600 may sequentially access the plurality of columns coupled to the second row or the third row, and may sequentially write the target data, read from the global buffer 695, to the plurality of memory cells coupled to the plurality of columns. For example, the PIM device 600 may read the second data 2 from the global buffer 695, and may access a second column coupled to the second row or the third row. The second data 2 read from the global buffer 695 may be written to the memory cell coupled to the second column. The PIM device 600 may read the third data 3 from the global buffer 695, and may access a third column coupled to the second row or the third row. The third data 3 read from the global buffer 695 may be written to the memory cell coupled to the third column. The PIM device 600 may repeatedly perform the steps S315, S316, and S317 until the eighth data 8 read from the global buffer 695 is written to the memory cell coupled to an eighth column coupled to the second row or the third row. When all the target data are read and are written to the second target memory bank (Yes at step S318), the data copy operation may be ended.

Figure 33:
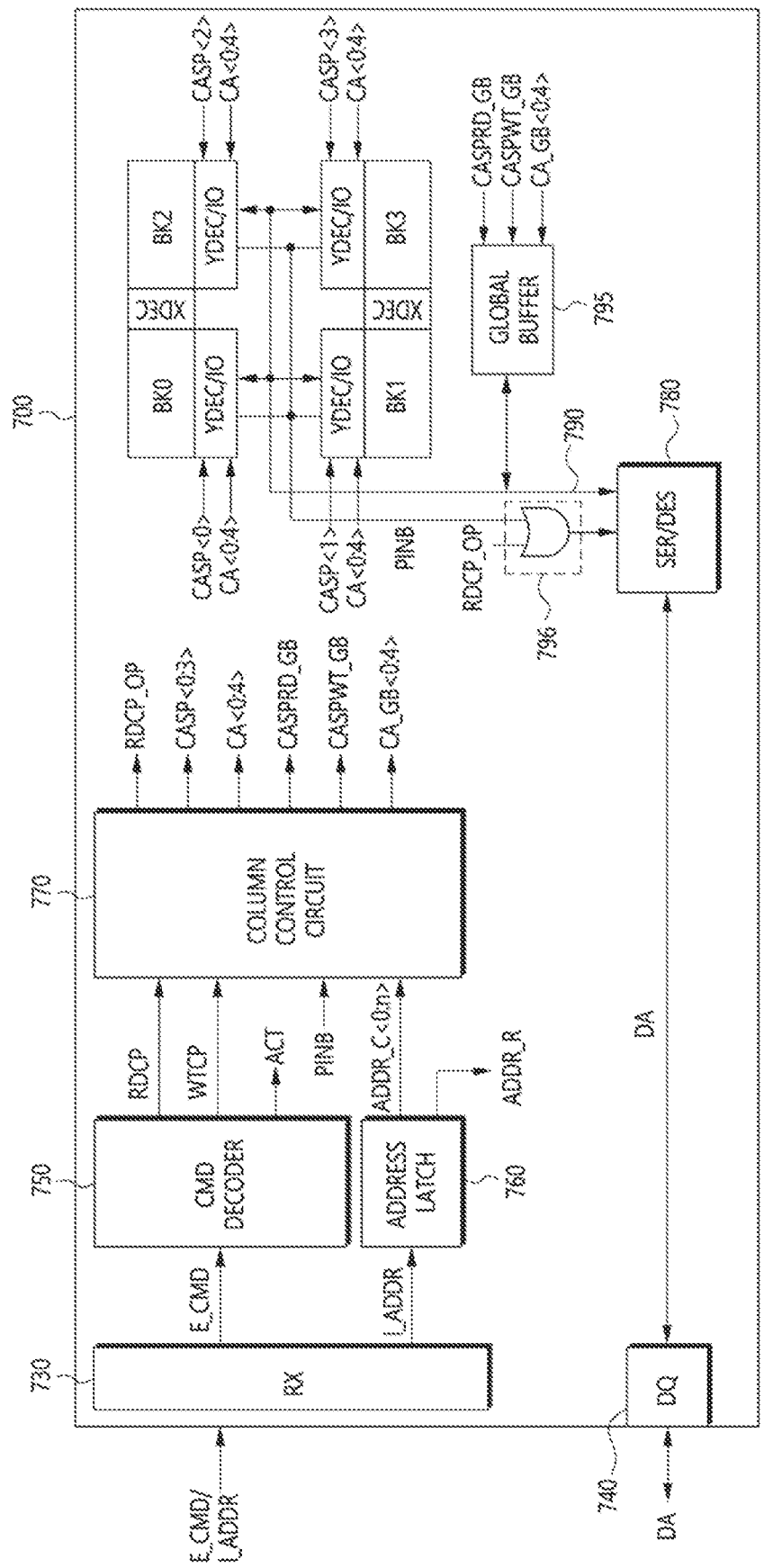
FIG. 33 is a diagram illustrating a configuration of a PIM device according to an embodiment of the present disclosure.

FIG. 33 is a diagram illustrating a configuration of a PIM device 700 according to an embodiment of the present disclosure. Referring to FIG. 33, the PIM device 700 may include a first storage region. The first storage region may include a first memory bank BK0, a second memory bank BK1, a third memory bank BK2, and a fourth memory bank BK3. However, it is not intended to limit the number of memory banks included in the PIM device 700, and the number of memory banks may be four or less or more than four. Each of the first to fourth memory banks BK0, BK1, BK2, and BK3 may include a Y-decoder/I/O circuit YDEC/IO. The first and third memory banks BK0 and BK2 may share one X-decoder XDEC, and the second and fourth memory banks BK1 and BK3 may share one X-decoder XDEC. The PIM device 700 may include a second storage region. The second storage region may include a global buffer 795. The global buffer 795 may be coupled in common to the first to fourth memory banks BK0, BK1, BK2, and BK3 through a data transmission line 790. The data transmission line 790 may be a global input/output (I/O) line through which data read from the first to fourth memory banks BK0, BK1, BK2, and BK3 and the global buffer 795 is transmitted or data to be written to the first to fourth memory banks BK0, BK1, BK2, and BK3 and the global buffer 795 is transmitted.

The PIM device 700 may include a column control circuit 770 to perform a data copy operation. The column control circuit 770 may generate control signals for a copy read operation based on a copy read signal RDCP and an address signal. The number of bits of the address signal may be changed depending on the number of memory banks and the number of columns to be accessed. The column control circuit 770 may generate a memory read control signal and a buffer write control signal based on the copy read signal RDCP and the address signal. The memory read control signal may be a control signal for reading data stored in a memory bank selected among the first to fourth memory banks BK0, BK1, BK2, and BK3. The memory read control signal may be provided to the first to fourth memory banks BK0, BK1, BK2, and BK3. The memory bank selected among the first to fourth memory banks BK0, BK1, BK2, and BK3 may output stored data to the data transmission line 790 based on the memory read control signal. The buffer write control signal may be a control signal for writing the data, read from the selected memory bank, to the global buffer 795. The buffer write control signal may be provided to the global buffer 795. The column control circuit 770 may generate the buffer write control signal at a point in time when the data read from the selected memory bank based on the memory read control signal is outputted to the data transmission line 790. The global buffer 795 may store the data, transmitted through the data transmission line 790, based on the buffer write control signal. The address signal may be a column address signal ADDR_C<0:n> (where n is an arbitrary integer). The number of bits of the column address signal ADDR_C<0:n> may be changed depending on the number of memory banks and the number of columns to be accessed. The column control circuit 770 may further receive a read timing signal PINB, and may generate the buffer write control signal further based on the read timing signal PINB. The read timing signal PINB will be described later.

The column control circuit 770 may generate control signals for a copy write operation based on a copy write signal WTCP and an address signal. The column control circuit 770 may generate a buffer read control signal and a memory write control signal based on the copy write signal WTCP and the address signal. The buffer read control signal may be a control signal for reading the data stored in the global buffer 795. The buffer read control signal may be is provided to the global buffer 795. The global buffer 795 may output the stored data to the data transmission line 790 based on the buffer read control signal. The memory write control signal may be a control signal for writing the data, read from the global buffer 795, to a memory bank selected among the first to fourth memory banks BK0, BK1, BK2, and BK3. The memory write control signal may be provided to the first to fourth memory banks BK0, BK1, BK2, and BK3. The column control circuit 770 may generate the memory write control signal at a point in time when the data read from the global buffer 795 based on the buffer read control signal is outputted to the data transmission line 790. The selected memory bank may store the data, transmitted through the data transmission line 790, based on the memory write control signal. The address signal may be the column address signal ADDR_C<0:n>.

The PIM device 700 may further include a receiving driver (RX) 730, a data I/O circuit (DQ) 740, a command decoder (CMD DECODER) 750, an address latch 760, and a serializer/deserializer (SER/DES) 780. The PIM device 700 may include the same or similar components as or to those of the PIM device 200 illustrated in FIG. 3, and repeated descriptions for the same or similar components will be omitted herein. The receiving driver 730 may receive an external command signal E_CMD and an input address signal I_ADDR from an external device. The receiving driver 730 may provide the external command signal E_CMD to the command decoder 750, and may provide the input address signal I_ADDR to the address latch 760. The data I/O circuit 740 may be coupled to a data I/O line. The PIM device 700 may communicate with the external device through the data I/O circuit 740. When the external command signal E_CMD has information for performing the copy read operation, the command decoder 750 may generate the copy read signal RDCP by decoding the external command signal E_CMD. When the external command signal E_CMD has information for performing the copy write operation, the command decoder 750 may generate the copy write signal WTCP by decoding the external command signal E_CMD. When the external command signal E_CMD has information for performing an active operation, the command decoder 750 may generate an active signal ACT by decoding the external command signal E_CMD. The active signal ACT may be a signal for enabling a specific row of a memory bank selected among the first to fourth memory banks BK0, BK1, BK2, and BK3. The address latch 760 may generate a row address signal ADDR_R and the column address signal ADDR_C<0:n> based on the input address signal I_ADDR. The row address signal ADDR_R may be an address signal for selecting a specific row of a selected memory bank during the active operation. The column address signal ADDR_C<0:n> may be an address signal for selecting a specific column coupled to an enabled row.

The serializer/deserializer 780 may be coupled to the data transmission line 790. The serializer/deserializer 780 may receive data read from the first to fourth memory banks BK0, BK1, BK2, and BK3 and transmitted through the data transmission line 790, may generate data DA by serializing the received data, and may output the data DA to the external device through the data I/O circuit 740. The serializer/deserializer 780 may deserialize data DA received from the external device through the data I/O circuit 740, and may output the deserialized data through the data transmission line 790. The serializer/deserializer 780 may serialize data, transmitted through the data transmission line 790, in synchronization with the read timing signal PINB.

The column control circuit 770 may receive the copy read signal RDCP, the copy write signal WTCP, the column address signal ADDR_C<0:n>, and the read timing signal PINB. The column control circuit 770 may generate a copy read operation signal RDCP_OP, a memory access control signal CASP<0:3>, a memory address signal CA<0:4>, a buffer read access control signal CASPRD_GB, a buffer write access control signal CASPWT_GB, and a buffer address signal CA_GB<0:4>, based on the copy read signal RDCP, the column address signal ADDR_C<0:n>, and the read timing signal PINB. FIG. 33 illustrates that the numbers of bits of the memory access control signal CASP<0:3>, the memory address signal CA<0:4>, and the buffer address signal CA_GB<0:4> are four or five, but it is not intended to be limited thereto. The numbers of bits of the memory access control signal CASP<0:3>, the memory address signal CA<0:4>, and the buffer address signal CA_GB<0:4> may be changed depending on the number of memory banks included in the PIM device 700 and the number of columns to be accessed. The memory access control signal CASP<0:3> may include a memory read access control signal and a memory write access control signal. The column control circuit 770 may generate the copy read operation signal RDCP_OP, the memory access control signal CASP<0:3>, the memory address signal CA<0:4>, the buffer write access control signal CASPWT_GB, and the buffer address signal CA_GB<0:4>, based on the copy read signal RDCP and the column address signal ADDR_C<0:n>. The copy read operation signal RDCP_OP, the memory access control signal CASP<0:3>, the memory address signal CA<0:4>, the buffer write access control signal CASPWT_GB, and the buffer address signal CA_GB<0:4> may be included in the memory read control signal and the buffer write control signal. The column control circuit 770 may generate the memory access control signal CASP<0:3>, the memory address signal CA<0:4>, the buffer read access control signal CASPRD_GB, and the buffer address signal CA_GB<0:4>, based on the copy write signal WTCP and the column address signal ADDR_C<0:n>. The memory access control signal CASP<0:3>, the memory address signal CA<0:4>, the buffer read access control signal CASPRD_GB, and the buffer address signal CA_GB<0:4> may be included in the buffer read control signal and the memory write control signal.

The X-decoders XDEC may receive the active signal ACT and the row address signal ADDR_R, and may enable a specific row of the first to fourth memory banks BK0, BK1, BK2, and BK3, based on the active signal ACT and the row address signal ADDR_R. The Y-decoders/I/O circuits YDEC/IO may receive the memory access control signal CASP<0:3> and the memory address signal CA<0:4>, may access a specific column based on the memory access control signal CASP<0:3> and the memory address signal CA<0:4>, and may read data stored in a memory cell coupled to the specific column or write data, transmitted through the data transmission line 790, to the memory cell coupled to the specific column. The Y-decoder/I/O circuit YDEC/IO of the first memory bank BK0 may receive the memory access control signal CASP<0> and the memory address signal CA<0:4>. The Y-decoder/I/O circuit YDEC/IO of the second memory bank BK1 may receive the memory access control signal CASP<1> and the memory address signal CA<0:4>. The Y-decoder/I/O circuit YDEC/IO of the third memory bank BK2 may receive the memory access control signal CASP<2> and the memory address signal CA<0:4>. The Y-decoder/I/O circuit YDEC/IO of the fourth memory bank BK3 may receive the memory access control signal CASP<3> and the memory address signal CA<0:4>. The Y-decoders/I/O circuits YDEC/IO may generate the read timing signal PINB when reading data stored in the first to fourth memory banks BK0, BK1, BK2, and BK3 and outputting the read data to the data transmission line 790. The read timing signal PINB may be a pulse signal which is enabled each time data is outputted from the first to fourth memory banks BK0, BK1, BK2, and BK3 to the data transmission line 790. The read timing signal PINB may be provided to the column control circuit 770 and the serializer/deserializer 780.

The PIM device 700 may further include an output control circuit 796. The output control circuit 796 may deactivate the serializer/deserializer 780 when the PIM device 700 performs the data copy operation. By the data copy operation, data read from one memory bank may be transferred and written to another row of the one memory bank or another memory bank. The output control circuit 796 may deactivate the serializer/deserializer 780 so that the data read from the memory bank during the data copy operation is not outputted to the external device. The output control circuit 796 may deactivate the serializer/deserializer 780 by preventing the read timing signal PINB from being provided to the serializer/deserializer 780. The output control circuit 796 prevents the read timing signal PINB from being provided to the serializer/deserializer 780 when the PIM device 700 performs the data copy operation, and allows the read timing signal PINB to be provided to the serializer/deserializer 780, when the PIM device 700 performs a normal read operation. The normal read operation may mean a read operation of outputting data stored in the memory bank to the external device. The output control circuit 796 may receive the copy read operation signal RDCP_OP and the read timing signal PIN B. The output control circuit 796 may block the read timing signal PINB from being outputted to the serializer/deserializer 780, based on the copy read operation signal RDCP_OP. The output control circuit 796 might not output the read timing signal PINB to the serializer/deserializer 780 when the copy read operation signal RDCP_OP is enabled, and may output the read timing signal PINB to the serializer/deserializer 780 when the copy read operation signal RDCP_OP is disabled. The output control circuit 796 may include an OR gate. The copy read operation signal RDCP_OP may be a signal which is enabled to a logic high level, and the read timing signal PINB may be a signal which is enabled to a logic low level.

Figure 34:
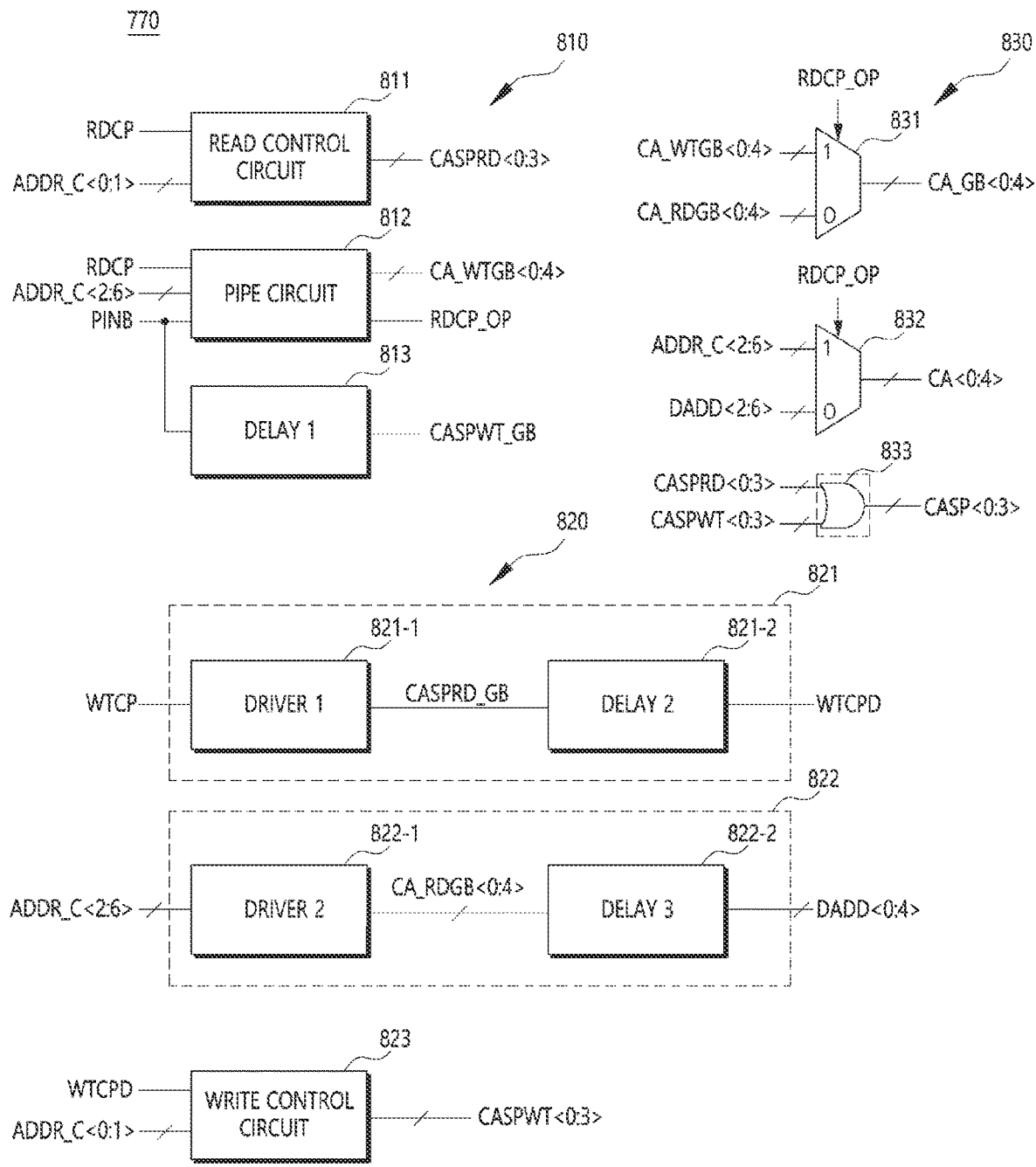
FIG. 34 is a diagram illustrating a configuration of a column control circuit illustrated in FIG. 33.

FIG. 34 is a diagram illustrating a configuration of the column control circuit 770 illustrated in FIG. 33. Referring to FIG. 34, the column control circuit 770 may include a copy read circuit 810, a copy write circuit 820, and a column access circuit 830. The copy read circuit 810 may receive the copy read signal RDCP, the column address signal ADDR_C<0:n>, and the read timing signal PINB, and may generate a memory read access control signal CASPRD<0:3>, a buffer write address signal CA_WTGB<0:4>, the copy read operation signal RDCP_OP, and the buffer write access control signal CASPWT_GB. The copy read circuit 810 may generate the memory read access control signal CASPRD<0:3> based on the copy read signal RDCP and the column address signal ADDR_C<0:n>. The copy read circuit 810 may generate the buffer write address signal CA_WTGB<0:4> and the copy read operation signal RDCP_OP, based on the copy read signal RDCP, the column address signal ADDR_C<0:n>, and the read timing signal PINB. The copy read circuit 810 may generate the buffer write access control signal CASPWT_GB based on the read timing signal PIN B.

The copy read circuit 810 may include a read control circuit 811, a pipe circuit 812, and a first delay circuit 813. The read control circuit 811 may receive the copy read signal RDCP and the column address signal ADDR_C<0:n>, and may generate the memory read access control signal CASPRD<0:3> based on the copy read signal RDCP and the column address signal ADDR_C<0:n>. The read control circuit 811 may receive a partial column address signal ADDR_C<0:1> of the column address signal ADDR_C<0:n>. The partial column address signal ADDR_C<0:1> may include information specifying a memory bank for which a read operation is performed. The partial column address signal ADDR_C<0:1> may be a bank address signal. The read control circuit 811 may generate the memory read access control signal CASPRD<0:3> by decoding the partial column address signal ADDR_C<0:1> when the copy read signal RDCP is enabled.

The pipe circuit 812 may receive the copy read signal RDCP, the column address signal ADDR_C<0:n>, and the read timing signal PINB, and may generate the buffer write address signal CA_WTGB<0:4> and the copy read operation signal RDCP_OP based on the copy read signal RDCP, the column address signal ADDR_C<0:n>, and the read timing signal PINB. The pipe circuit 812 may receive a partial column address signal ADDR_C<2:6> different from the column address signal ADDR_C<0:1> received by the read control circuit 811, in the column address signal ADDR_C<0:n>. The partial column address signal ADDR_C<2:6> received by the pipe circuit 812 may include information specifying a column. The pipe circuit 812 may latch and/or store the partial column address signal ADDR_C<2:6> when the copy read signal RDCP is enabled. The pipe circuit 812 may enable the copy read operation signal RDCP_OP when the copy read signal RDCP is enabled. The pipe circuit 812 may count the numbers of generations of the copy read signal RDCP and the read timing signal PINB. The pipe circuit 812 may maintain an enable state of the copy read operation signal RDCP_OP when the number of generations of the copy read signal RDCP is greater than the number of generations of the read timing signal PINB. The pipe circuit 812 may disable the copy read operation signal RDCP_OP when the number of generations of the read timing signal PINB is the same as the number of generations of the copy read signal RDCP. The pipe circuit 812 may output a latched and/or stored column address signal as the buffer write address signal CA_WTGB<0:4> when the read timing signal PINB is enabled.

The first delay circuit 813 may receive the read timing signal PINB, and may generate the buffer write access control signal CASPWT_GB by delaying the read timing signal PINB. A delay time of the first delay circuit 813 may correspond to a time from a point in time when the copy read signal RDCP is generated to a point in time when data stored in any one of the first to fourth memory banks BK0, BK1, BK2, and BK3 is outputted to the data transmission line 790. Accordingly, the copy read circuit 810 allows the buffer write control signal to be generated when the data is outputted from the memory bank after the memory read control signal is generated by the copy read signal RDCP, so that the memory read control signal and the buffer write control signal for the copy read operation may be sequentially generated from the single copy read signal RDCP generated from the single external command signal E_CMD.

The copy write circuit 820 may receive the copy write signal WTCP and the column address signal ADDR_C<0:n>, and may generate the buffer read access control signal CASPRD_GB, a buffer read address signal CA_RDGB<0:4>, a delayed address signal DADD<0:4>, and a memory write access control signal CASPWT<0:3>. The copy write circuit 820 may generate the buffer read access control signal CASPRD_GB based on the copy write signal WTCP, and may generate a delayed copy write signal WTCPD based on the buffer read access control signal CASPRD_GB. The copy write circuit 820 may generate the buffer read address signal CA_RDGB<0:4> based on the column address signal ADDR_C<0:n>, and may generate the delayed address signal DADD<0:4> based on the buffer read address signal CA_RDGB<0:4>. The copy write circuit 820 may generate the memory write access control signal CASPWT<0:3> based on the delayed copy write signal WTCPD and the column address signal ADDR_C<0:n>.

The copy write circuit 820 may include a first timing control circuit 821, a second timing control circuit 822, and a write control circuit 823. The first timing control circuit 821 may receive the copy write signal WTCP, and may generate the buffer read access control signal CASPRD_GB and the delayed copy write signal WTCPD based on the copy write signal WTCP. The first timing control circuit 821 may enable the buffer read access control signal CASPRD_GB when the copy write signal WTCP is enabled. The first timing control circuit 821 may generate the delayed copy write signal WTCPD by delaying the buffer read access control signal CASPRD_GB. A time by which the buffer read access control signal CASPRD_GB is delayed may correspond to a time from a point in time when the copy write signal WTCP is generated to a point in time when the data stored in the global buffer 795 is outputted to the data transmission line 790. The first timing control circuit 821 may include a first driver 821-1 and a second delay circuit 821-2. The first driver 821-1 may generate the buffer read access control signal CASPRD_GB by driving the copy write signal WTCP. The first driver 821-1 may enable the buffer read access control signal CASPRD_GB immediately when the copy write signal WTCP is enabled. The second delay circuit 821-2 may generate the delayed copy write signal WTCPD by delaying the buffer read access control signal CASPRD_GB. A delay time of the second delay circuit 821-2 may correspond to a time from a point in time when the copy write signal WTCP is generated to a point in time when the data stored in the global buffer 795 is outputted to the data transmission line 790.

The second timing control circuit 822 may receive the column address signal ADDR_C<0:n>, and may generate the buffer read address signal CA_RDGB<0:4> and the delayed address signal DADD<0:4> based on the column address signal ADDR_C<0:n>. The second timing control circuit 822 may generate the buffer read address signal CA_RDGB<0:4> based on the partial column address signal ADDR_C<2:6> of the column address signal ADDR_C<0:n>. The partial column address signal ADDR_C<2:6> may include information specifying a column. The second timing control circuit 822 may generate the delayed address signal DADD<0:4> by delaying the buffer read address signal CA_RDGB<0:4>. A time by which the buffer read address signal CA_RDGB<0:4> is delayed may correspond to a time from a point in time when the copy write signal WTCP is generated to a point in time when the data stored in the global buffer 795 is outputted to the data transmission line 790. The second timing control circuit 822 may include a second driver 822-1 and a third delay circuit 822-2. The second driver 822-1 may generate the buffer read address signal CA_RDGB<0:4> by driving the partial column address signal ADDR_C<2:6>. When receiving the partial column address signal ADDR_C<2:6>, the second driver 822-1 may immediately output the partial column address signal ADDR_C<2:6> as the buffer read address signal CA_RDGB <0:4>. The third delay circuit 822-2 may generate the delayed address signal DADD<0:4> by delaying the buffer read address signal CA_RDGB<0:4>. A delay time of the third delay circuit 822-2 may correspond to a time from a point in time when the copy write signal WTCP is generated to a point in time when the data stored in the global buffer 795 is outputted to the data transmission line 790.

The write control circuit 823 may generate the memory write access control signal CASPWT<0:3> based on the delayed copy write signal WTCPD and the partial column address signal ADDR_C<0:1> of the column address signal ADDR_C<0:n>. The partial column address signal ADDR_C<0:1> received by the write control circuit 823 may include information specifying a memory bank. The write control circuit 823 may generate the memory write access control signal CASPWT<0:3> by decoding the partial column address signal ADDR_C<0:1> when the delayed copy write signal WTCPD is enabled. Accordingly, the copy write circuit 820 allows the memory write control signal to be generated when the data is outputted from the global buffer 795 after the buffer read control signal is generated by the copy write signal RDCP, so that the buffer read control signal and the memory write control signal for the copy write operation may be sequentially generated from the single copy write signal WTCP generated from the single external command signal E_CMD.

The column access circuit 830 may receive the copy read operation signal RDCP_OP, the buffer write address signal CA_WTGB<0:4>, the buffer read address signal CA_RDGB<0:4>, the column address signal ADDR_C<0:n>, the delayed address signal DADD<0:4>, the memory read access control signal CASPRD<0:3>, and the memory write access control signal CASPWT<0:3>, and may generate the buffer address signal CA_GB<0:4>, the memory address signal CA<0:4>, and the memory access control signal CASP<0:3>. The column access circuit 830 may generate the buffer address signal CA_GB<0:4> based on the copy read operation signal RDCP_OP, the buffer write address signal CA_WRGB<0:4>, and the buffer read address signal CA_RDGB<0:4>. The column access circuit 830 may generate the memory address signal CA<0:4> based on the copy read operation signal RDCP_OP, the column address signal ADDR_C<0:n>, and the delayed address signal DADD<0:4>. The column access circuit 830 may generate the memory access control signal CASP<0:3> based on the memory read access control signal CASPRD<0:3> and the memory write access control signal CASPWT<0:3>. The column access circuit 830 may include a first selection circuit 831, a second selection circuit 832 and a gating circuit 833. The first selection circuit 831 may output one of the buffer write address signal CA_WTGB<0:4> and the buffer read address signal CA_RDGB<0:4> as the buffer address signal CA_GB<0:4> based on the copy read operation signal RDCP_OP. The first selection circuit 831 may output the buffer write address signal CA_WTGB<0:4> as the buffer address signal CA_GB<0:4> when the copy read operation signal RDCP_OP is enabled to a logic high level. The first selection circuit 831 may output the buffer read address signal CA_RDGB<0:4> as the buffer address signal CA_GB<0:4> when the copy read operation signal RDCP_OP is disabled to a logic low level.

The second selection circuit 832 may output one of the partial column address signal ADDR_C<2:6> and the delayed address signal DADD<0:4> as the memory address signal CA<0:4> based on the copy read operation signal RDCP_OP. The second selection circuit 832 may output the partial column address signal ADDR_C<2:6> as the memory address signal CA<0:4> when the copy read operation signal RDCP_OP is enabled to a logic high level. The second selection circuit 832 may output the delayed address signal DADD<0:4> as the memory address signal CA<0:4> when the copy read operation signal RDCP_OP is disabled to a logic low level.

The gating circuit 833 may output the memory read access control signal CASPRD<0:3> and the memory write access control signal CASPWT<0:3> as the memory access control signal CASP<0:3>. The gating circuit 833 may output the memory read access control signal CASPRD<0:3> as the memory access control signal CASP<0:3> or may output the memory write access control signal CASPWT<0:3> as the memory access control signal CASP<0:3>. The gating circuit 833 may include an OR gate. The OR gate may receive the memory read access control signal CASPRD<0:3> and the memory write access control signal CASPWT<0:3>, and may output the memory access control signal CASP<0:3>.

Figure 35:
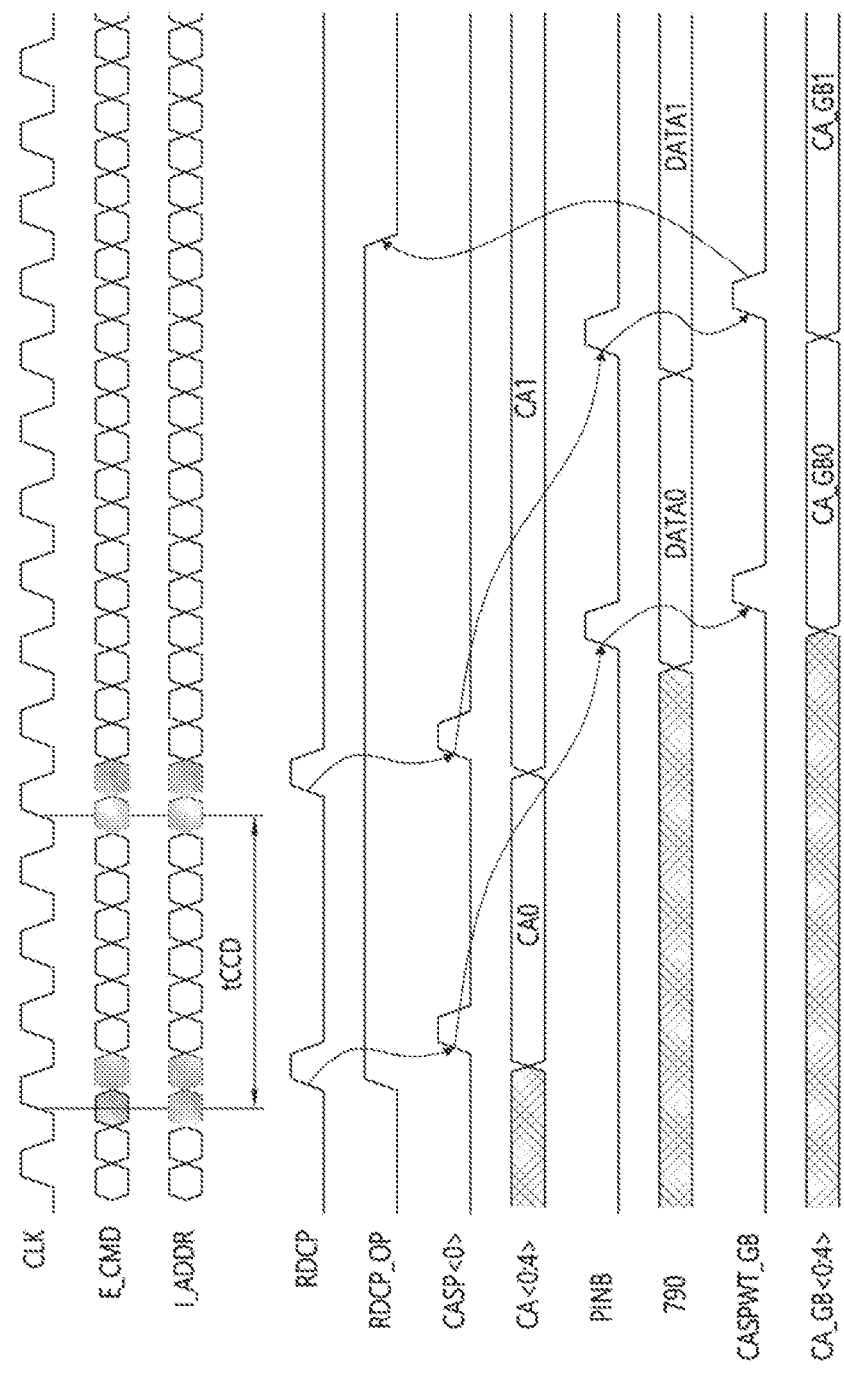
FIG. 35 is a timing diagram illustrating a copy read operation of the PIM device according to the embodiment of the present disclosure.
Figure 36:
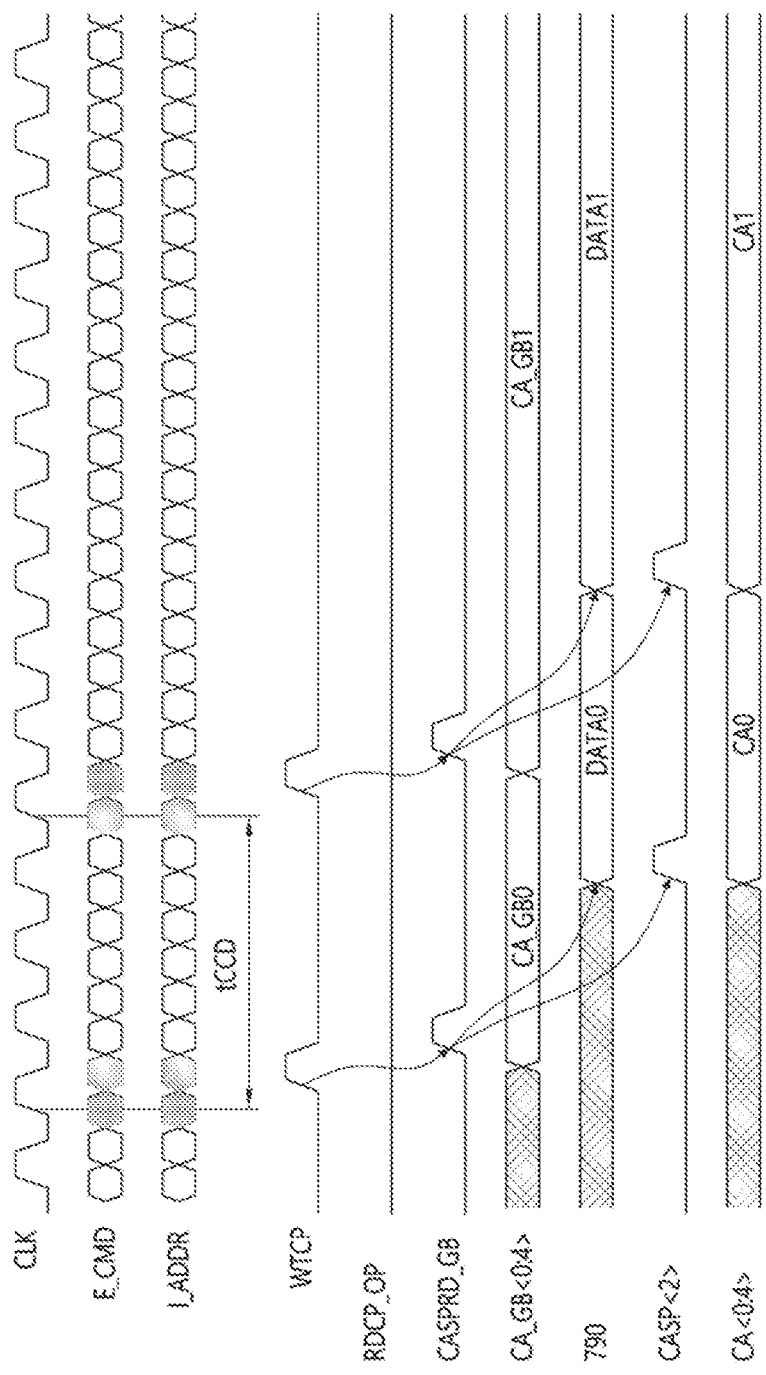
FIG. 36 is a timing diagram illustrating a copy write operation of the PIM device according to the embodiment of the present disclosure.

FIG. 35 is a timing diagram illustrating the copy read operation of the PIM device 700 according to the embodiment of the present disclosure. FIG. 36 is a timing diagram illustrating the copy write operation of the PIM device 700 according to the embodiment of the present disclosure. A data copy operation method of the PIM device 700 according to the embodiment of the present disclosure will be described below with reference to FIGS. 33 to 36. For the sake of clarity in explanation, FIGS. 35 and 36 illustrate a case where two target data stored in the first memory bank BK0 are copied to the third memory bank BK2. Before performing the copy read operation illustrated in FIG. 35, in order for the data copy operation of the PIM device 700, the PIM device 700 may enable a specific row of the first memory bank BK0 based on the external command signal E_CMD and the input address signal I_ADDR. The external command signal E_CMD and the input address signal I_ADDR may be inputted to the PIM device 700 in synchronization with a clock signal CLK. The command decoder 750 may generate the active signal ACT based on the external command signal E_CMD, and the address latch 760 may output the input address signal I_ADDR as the row address signal ADDR_R. The X-decoder XDEC may enable the specific row of the first memory bank BK0 based on the active signal ACT and the row address signal ADDR_R. Thereafter, the copy read operation of the PIM device 700 may be performed. In order for the copy read operation, a first external command signal E_CMD and a first input address signal I_ADDR may be inputted to the PIM device 700. The command decoder 750 may enable a first copy read signal RDCP by decoding the external command signal E_CMD, and the address latch 760 may output a first column address signal ADDR_C<0:n> by latching the input address signal I_ADDR. When the copy read signal RDCP is enabled, the read control circuit 811 may output the is memory read access control signal CASPRD<0:3> by decoding the partial column address signal ADDR_C<0:1>. For example, in order to access the column of the first memory bank BK0, the first bit CASPRD<0> of the memory read access control signal CASPRD<0:3> may be a logic high level. The pipe circuit 812 may enable the copy read operation signal RDCP_OP, and may latch the partial column address signal ADDR_C<2:6>. The gating circuit 833 may output the memory read access control signal CASPRD<0:3> as the memory access control signal CASP<0:3>. When the copy read operation signal RDCP_OP is enabled, the second selection circuit 832 may output the partial column address signal ADDR_C<2:6> as the memory address signal CA<0:4> (CA0). The Y-decoder/I/O circuit YDEC/IO of the first memory bank BK0 may select a specific column which is coupled to the specific row of the first memory bank BK0, and first data DATA0 stored in a memory cell coupled to the selected column may be read.

When a time corresponding to tCCD elapses, a second external command signal E_CMD and a second input address signal I_ADDR may be inputted to the PIM device

700. The second input address signal I_ADDR may have a different value from the first input address signal I_ADDR in order to select a column different from the column selected by the first input address signal I_ADDR. The tCCD may define a time interval during which a next column command signal may be inputted after a column command signal is inputted. The copy read operation and the copy write operation may be included in a column command signal, and the column command signal may be generated at the interval of tCCD based on the external command signal E_CMD which is inputted at the interval of tCCD. The command decoder 750 may generate a second copy read signal RDCP by decoding the second external command signal E_CMD, and the address latch 760 may output the second input address signal I_ADDR as a second column address signal ADDR_C<0:n>. The read control circuit 811 may output the memory read access control signal CASPRD<0:3> by decoding the partial column address signal ADDR_C<0:1> of the second column address signal ADDT_C<0:n> based on the second copy read signal RDCP. The pipe circuit 812 may maintain the read copy operation signal RDCP_OP in an enable state, and may latch the partial column address signal ADDR_C<2:6>. The second selection circuit 832 may output the partial column address signal ADDR_C<2:6> as the memory address signal CA<0:4> (CA1), and the gating circuit 833 may output the memory read access control signal CASPRD<0:3> as the memory access control signal CASP<0:3>. Similarly, the first bit CASP<0> of the memory access control signal CASP<0:3> may be a logic high level.

When a predetermined time elapses after the first copy read signal RDCP is generated, the Y-decoder/I/O circuit YDEC/IO may output the first data DATA0 read from a memory cell selected based on the memory address signal CA<0:4> (CA0), to the data transmission line 790. The Y-decoder/I/O circuit YDEC/IO may output together the read timing signal PINB when outputting the first data DATA0 to the data transmission line 790. The predetermined time, as a time corresponding to a memory read latency, may define a time from after the copy read signal RDCP is generated to a point in time when the Y-decoder/I/O circuit YDEC/IO outputs data, read from a memory bank, to the data transmission line 790. The time corresponding to the memory read latency may be longer than the tCCD. When the read timing signal PINB is enabled, the pipe circuit 812 may output the partial column address signal ADDR_C<2:6> of the latched first column address signal ADDR_C<0:n> as the buffer write address signal CA_WTGB<0:4>. The first delay circuit 813 may generate the buffer write access control signal CASPWT_GB by delaying the read timing signal PINB. The first selection circuit 831 may output the buffer write address signal CA_WTGB<0:4> as the buffer address signal CA_GB<0:4> (CA_GB0) based on the copy read operation signal RDCP_OP. Because the number (i.e., two) of generations of the copy read signal RDCP is greater than the number (i.e., one) of generations of the read timing signal PINB, the pipe circuit 812 may maintain the copy read operation signal RDCP_OP in an enable state. The global buffer 795 may store the first data DATA0 transmitted through the data transmission line 790, based on the buffer write access control signal CASPWT_GB and the buffer address signal CA_GB<0:4> (CA_GB0). Accordingly, the first data DATA0 may be read from the first memory bank BK0, and may be transferred to and stored in the global buffer 795.

When the time corresponding to the memory read latency elapses after the second copy read signal RDCP is generated, the Y-decoder/I/O circuit YDEC/IO may output second data DATA1, stored in a memory cell selected based on the memory address signal CA<0:4> (CA1), to the data transmission line 790. The Y-decoder/I/O circuit YDEC/IO may output together the read timing signal PINB when outputting the second data DATA1 to the data transmission line 790. When the read timing signal PINB is enabled, the pipe circuit 812 may output the partial column address signal ADDR_C<2:6> of the latched second column address signal ADDR_C<0:n> as the buffer write address signal CA_WTGB<0:4>. The first selection circuit 831 may output the buffer write address signal CA_WTGB<0:4> as the buffer address signal CA_GB<0:4> (CA_GB1) based on the copy read operation signal RDCP_OP. If the second read timing signal PINB is outputted, because the number (i.e., two) of generations of the copy read signal RDCP is the same as the number (i.e., two) of generations of the read timing signal PINB, the pipe circuit 812 may disable the copy read operation signal RDCP_OP. The first delay circuit 813 may generate the buffer write access control signal CASPWT_GB by delaying the read timing signal PINB. The global buffer 795 may store the second data DATA1 transmitted through the data transmission line 790, based on the buffer write access control signal CASPWT_GB and the buffer address signal CA_GB<0:4> (CA_GB1). Accordingly, the second data DATA1 may be read from the first memory bank BK0, and may be transferred to and stored in the global buffer 795. When all of target data (that is, the first and second data DATA0 and DATA1) are written to the global buffer 795 and thus the copy read operation is completed, a precharge operation may be performed, and the specific row of the first memory bank BK0 may be disabled.

Then, the copy write operation may be performed. Before performing the copy write operation illustrated in FIG. 36, the PIM device 700 may enable a specific row of the third memory bank BK2 based on the external command signal E_CMD and the input address signal I_ADDR. The command decoder 750 may generate the active signal ACT based on the external command signal E_CMD, and the address latch 760 may output the input address signal I_ADDR as the row address signal ADDR_R. The X-decoder XDEC may enable a specific word line of the third memory bank BK2 based on the active signal ACT and the row address signal ADDR_R. In order to perform the copy write operation, the PIM device 700 may receive a first external command signal E_CMD and a first input address signal I_ADDR. The command decoder 750 may generate a first copy write signal WTCP by decoding the first external command signal E_CMD. The address latch 760 may output the first input address signal I_ADDR as a first column address signal ADDR_C<0:n>. The first timing control circuit 821 may generate the buffer read access control signal CASPRD_GB by driving the first copy write signal WTCP. The second timing control circuit 822 may output the buffer read address signal CA_RDGB<0:4> by driving the partial column address signal ADDR_C<2:6>. Because the copy read operation signal RDCP_OP is in a disabled state, the first selection circuit 831 may output the buffer read address signal CA_RDGB<0:4> as the buffer address signal CA_GB<0:4> (CA_GB0). The global buffer 795 may output the first data DATA0 to the data transmission line 790 based on the buffer read access control signal CASPRD_GB and the buffer address signals CA_GB<0:4> (CA_GB0). The first timing control circuit 821 may generate the delayed copy write signal WTCPD by delaying the buffer read access control signal CASPRD_GB by a predetermined time. The predetermined time may be a time corresponding to a buffer read latency. The buffer read latency may define a time from a point in time when the copy write signal WTCP is generated to a point in time when the first data DATA0 read from the global buffer 795 is outputted to the data transmission line 790. The time corresponding to the buffer read latency may be shorter than the tCCD. The second timing control circuit 822 may generate the delayed address signal DADD<0:4> by delaying the buffer read address signal CA_RDGB<0:4> by the time corresponding to the buffer read latency. The write control circuit 823 may output the memory write access control signal CASPWT<0:3> by decoding the partial column address signal ADDR_C<0:1> when the delayed copy write signal WTCPD is enabled. For example, in order to access the column of the third memory bank BK2, the third bit CASPWT<2> of the memory write access control signal CASPWT<0:3> may be a logic high level. The second selection circuit 832 may output the delayed address signal DADD<0:4> as the memory address signal CA<0:4> (CA0). The gating circuit 833 may output the memory write access control signal CASPWT<0:3> as the memory access control signal CASP<0:3>. Accordingly, after the time corresponding to the buffer read latency elapses, the Y-decoder/I/O circuit YDEC/IO of the third memory bank BK2 may write the first data DATA0, read from the global buffer 795 based on the memory access control signal CASP<2> and the memory address signal CA<0:4> (CA0) and transmitted through the data transmission line 790, to the memory cell coupled a column selected based on the memory address signal CA<0:4> (CA0).

When the time corresponding to the tCCD elapses, a second external command signal E_CMD and a second input address signal I_ADDR may be inputted to the PIM device 700. The second input address signal I_ADDR may have a different value from the first input address signal I_ADDR in order to select a column different from the column selected by the first input address signal I_ADDR. The command decoder 750 may generate a second copy write signal WTCP by decoding the second external command signal E_CMD. The address latch 760 may output the second input address signal I_ADDR as a second column address signal ADDR_C<0:n>. The first timing control circuit 821 may generate the buffer read access control signal CASPRD_GB by driving the second copy write signal WTCP. The second timing control circuit 822 may output the buffer read address signal CA_RDGB<0:4> by driving the partial column address signal ADDR_C<2:6> of the second column address signal ADDR_C<0:n>. Because the copy read operation signal RDCP_OP is in a disabled state, the first selection circuit 831 may output the buffer read address signal CA_RDGB<0:4> as the buffer address signal CA_GB<0:4> (CA_GB1). The global buffer 795 may output the second data DATA1 to the data transmission line 790 based on the buffer read access control signal CASPRD_GB and the buffer address signals CA_GB<0:4> (CA_GB1). The first timing control circuit 821 may generate the delayed copy write signal WTCPD by delaying the buffer read access control signal CASPRD_GB by the time corresponding to the buffer read latency. The second timing control circuit 822 may generate the delayed address signal DADD<0:4> by delaying the buffer read address signal CA_RDGB<0:4> by the time corresponding to the buffer read latency. The write control circuit 823 may output the memory write access control signal CASPWT<0:3> by decoding the partial column address signal ADDR_C<0:1> of the second column address signal ADDR_C<0:n> when the delayed copy write signal WTCPD is enabled. In order to access the column of the third memory bank BK2, the third bit CASPWT<2> of the memory write access control signal CASPWT<0:3> may be a logic high level. The second selection circuit 832 may output the delayed address signal DADD<0:4> as the memory address signal CA<0:4> (CA1). The gating circuit 833 may output the memory write access control signal CASPWT<0:3> as the memory access control signal CASP<0:3>. Accordingly, after the time corresponding to the buffer read latency elapses, the Y-decoder/I/O circuit YDEC/IO of the third memory bank BK2 may write the second data DATA1, read from the global buffer 795 based on the memory access control signal CASP<2> and the memory address signal CA<0:4> (CA1) and transmitted through the data transmission line 790, to the memory cell coupled a column selected based on the memory address signal CA<0:4> (CA1). When target data (that is, the first and second data DATA0 and DATA1) are written to the third memory bank BK2 and thus the copy write operation is completed, a precharge operation may be performed, and the specific row of the third memory bank BK2 may be disabled.

A limited number of possible embodiments for the present teachings have been presented above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A method for operating a processing-in-memory (PIM) device including at least a first storage region and a second storage region, the method comprising:
   accessing a column coupled to a first row of a first memory bank of the first storage region, reading data stored in a memory cell coupled to the column, and writing the data read from the memory cell coupled to the column coupled to the first row of the first memory bank to a global buffer of the second storage region; and
   reading the data written to the global buffer, accessing a column coupled to a second row of the first memory bank of the first storage region or a third row of a second memory bank of the first memory region, and writing the data read from the global buffer to a memory cell coupled to the second row or the third row.

2. The method according to claim 1, further comprising: enabling, before the writing to the global buffer, the first row of the first memory bank of the first storage region.

3. The method according to claim 1, further comprising: enabling, after the writing to the global buffer, the second row or the third row.

4. The method according to claim 1, wherein the writing to the global buffer comprises:
   sequentially accessing a plurality of columns coupled to the first row; and sequentially storing data, read from memory cells coupled to the plurality of columns, to the global buffer.

5. The method according to claim 4, wherein the storing of the data read from the global buffer comprises:
sequentially reading the data stored in the global buffer;
sequentially accessing a plurality of columns coupled to the second row or the third row; and
sequentially storing the data, read from the global buffer, to memory cells coupled to the plurality of columns coupled to the second row or the third row.

6. The method according to claim 1, wherein the reading of the data stored in the memory cell coupled to the column coupled to the first row of the first memory bank and the writing of the data read from the memory cell coupled to the column coupled to the first row of the first memory bank to the global buffer are performed based on a single command signal.

7. The method according to claim 1, wherein the reading of the data stored in the global buffer and the writing of the data read from the global buffer to the memory cell coupled to the second row or the third row are performed based on a single command signal.

8. A processing-in-memory (PIM) device comprising:
a plurality of first storage regions;
a second storage region coupled to each of the plurality of first storage regions through a data transmission line; and
a column control circuit configured to:
generate, based on a copy read signal and an address signal, a memory read control signal for reading data stored in an initially selected storage region selected from among the plurality of first storage regions and a buffer write control signal for writing the data read from the initially selected storage region to the second storage region; and
generate, based on a copy write signal and the address signal, a global buffer read control signal for reading the data written to the second storage region and a memory write control signal for writing the data read from the second storage region to a subsequently selected storage region selected from among the plurality of first storage regions.

9. The PIM device according to claim 8, wherein:
the initially selected storage region outputs the stored data to the data transmission line based on the memory read control signal; and
the second storage region stores the data transmitted through the data transmission line based on the buffer write control signal.

10. The PIM device according to claim 8, wherein the column control circuit is configured to generate the buffer write control signal at a point in time when the data stored in the initially selected storage region is outputted to the data transmission line.

11. The PIM device according to claim 8, wherein:
the second storage region is configured to output the data, stored in the second storage region, to the data transmission line based on the global buffer read control signal; and
the subsequently selected storage region is configured to store the data, transmitted through the data transmission line, based on the memory write control signal.

12. The PIM device according to claim 8, wherein the column control circuit is configured to generate the memory write control signal at a point in time when the data stored in the second storage region is outputted to the data transmission line.

13. The PIM device according to claim 8, further comprising:
a serializer/deserializer coupled to the data transmission line and configured to output data, transmitted through the data transmission line, to an external device or output data, transmitted from the external device, to the data transmission line; and
an output control circuit configured to deactivate the serializer/deserializer based on the copy read signal.

14. A processing-in-memory (PIM) device comprising:
a copy read circuit configured to generate a memory read access control signal, a buffer write address signal, a copy read operation signal and a buffer write access control signal, based on a copy read signal, an address signal, and a read timing signal;
a copy write circuit configured to generate a buffer read access control signal, a buffer read address signal, a memory write access control signal, and a delayed address signal, based on a copy write signal and the address signal;
a column access circuit configured to generate a buffer address signal based on the copy read operation signal, the buffer write address signal, and the buffer read address signal, generate a memory address signal based on the copy read operation signal, the address signal, and the delayed address signal, and generate a memory access control signal based on the memory read access control signal and the memory write access control signal;
a plurality of memory banks configured to output stored data to a data transmission line or store data received from the data transmission line, based on the memory access control signal and the memory address signal; and
a global buffer configured to store data transmitted through the data transmission line, based on the buffer write access control signal and the buffer address signal, and output stored data to the data transmission line based on the buffer read access control signal and the buffer address signal.

15. The PIM device according to claim 14, wherein the copy read circuit comprises:
a read control circuit configured to generate the memory read access control signal based on the copy read signal and the address signal;
a pipe circuit configured to generate the buffer write address signal based on the copy read signal, the address signal, and the read timing signal, and generate the copy read operation signal based on the copy read signal and the read timing signal; and
a delay circuit configured to generate the buffer write access control signal by delaying the read timing signal.

16. The PIM device according to claim 15, wherein the pipe circuit is configured to enable the copy read operation signal by counting a number of generations of the copy read signal and a number of generations of the read timing signal.

17. The PIM device according to claim 15, wherein a delay time of the delay circuit corresponds to a time from a point in time when the copy read signal is generated to a point in time when data stored in any of the plurality of memory banks is outputted to the data transmission line.

18. The PIM device according to claim 15, wherein the copy write circuit comprises:
a first timing control circuit configured to generate the buffer read access control signal and a delayed copy write signal based on the copy write signal;

a second timing control circuit configured to generate the buffer read address signal and the delayed address signal based on the address signal; and a write control circuit configured to generate the memory write access control signal based on the delayed copy write signal and the address signal.

19. The PIM device according to claim 18, wherein:

the first timing control circuit is configured to generate the buffer read access control signal by driving the copy write signal, and generate the delayed copy write signal by delaying the buffer read access control signal; and a time by which the buffer read access control signal is delayed corresponds to a time from a point in time when the copy write signal is generated to a point in time when data stored in the global buffer is outputted to the data transmission line.

20. The PIM device according to claim 18, wherein:

the second timing control circuit is configured to generate the buffer read address signal by driving the address signal, and generate the delayed address signal by delaying the buffer read address signal; and a time by which the buffer read address signal is delayed corresponds to a time from a point in time when the copy write signal is generated to a point in time when data stored in the global buffer is outputted to the data transmission line.

21. The PIM device according to claim 18, wherein the column access circuit comprises:

a first selection circuit configured to output one of the buffer write address signal and the buffer read address signal as the buffer address signal based on the copy read operation signal;

a second selection circuit configured to output one of the address signal and the delayed address signal as the memory address signal based on the copy read operation signal; and a gating circuit configured to output the memory read access control signal and the memory write access control signal as the memory access control signal.

22. The PIM device according to claim 14, further comprising:

a serializer/deserializer coupled to the data transmission line, and configured to output data, transmitted through the data transmission line, to an external device or output data, transmitted from the external device, to the data transmission line; and an output control circuit configured to deactivate the serializer/deserializer based on the copy read signal.

* * * * *